US011985888B2

(12) United States Patent
Forrest et al.

(10) Patent No.: US 11,985,888 B2
(45) Date of Patent: May 14, 2024

(54) ORGANIC ELECTROLUMINESCENT DEVICE

(71) Applicant: The Regents of the University of Michigan, Ann Arbor, MI (US)

(72) Inventors: Stephen R. Forrest, Ann Arbor, MI (US); Jongchan Kim, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 180 days.

(21) Appl. No.: 16/943,906

(22) Filed: Jul. 30, 2020

(65) Prior Publication Data

US 2021/0050531 A1 Feb. 18, 2021

Related U.S. Application Data

(60) Provisional application No. 63/002,988, filed on Mar. 31, 2020, provisional application No. 62/885,550, (Continued)

(51) Int. Cl.
*H01L 51/00* (2006.01)
*H10K 30/30* (2023.01)
(Continued)

(52) U.S. Cl.
CPC ......... *H10K 85/346* (2023.02); *H10K 30/353* (2023.02); *H10K 71/164* (2023.02)

(58) Field of Classification Search
CPC ............... H01L 51/0087; H01L 51/001; H01L 51/4273; H01L 51/0012; H01L 51/5064;
(Continued)

(56) References Cited

U.S. PATENT DOCUMENTS 4,769,292 A 9/1988 Tang
5,061,569 A 10/1991 Vanslyke
(Continued)

FOREIGN PATENT DOCUMENTS

EP 0650955 5/1995
EP 1238981 9/2002
(Continued)

OTHER PUBLICATIONS

Stacey et al., (2013), "Highly Luminescent Dinuclear Platinum(II) Complexes Incorporating Bis-Cyclometallating Pyrazine-Based Ligands:A Versatile Approach to Efficient Red Phosphors." Inorganic Chemistry,52(19), 10992-11003, (Year: 2013).*

(Continued)

*Primary Examiner* — Ermias T Woldegeorgis
(74) *Attorney, Agent, or Firm* — Riverside Law LLP

(57) ABSTRACT

An organic light emitting device (OLED) comprises an anode; a cathode; and a light emitting layer, disposed between the anode and the cathode; wherein the light emitting layer comprises at least one luminescent compound; and wherein the transition dipole moment of the at least one luminescent compound is oriented parallel to the surface of the light emitting layer. A method of fabricating a light emitting layer, comprises the steps of providing a substrate; depositing less than 2 nm of a template material on the substrate; and depositing a composition comprising at least one light emitting compound on the template material.

4 Claims, 35 Drawing Sheets

Related U.S. Application Data filed on Aug. 12, 2019, provisional application No. 62/885,525, filed on Aug. 12, 2019.

(51) Int. Cl.
  *H10K 71/16* (2023.01)
  *H10K 85/30* (2023.01)

(58) Field of Classification Search
  CPC . H01L 51/52; H01L 51/5016; H01L 2251/55; H01L 51/5012; H01L 27/32; H01L 51/0035; H01L 51/5008; H01L 51/56; H01L 51/5096; H01L 2251/558; Y02E 10/549; C09K 11/06; C09K 2211/1033; H10K 85/346; H10K 30/353; H10K 71/164; H10K 2101/00; H10K 2101/10; H10K 50/11; H10K 50/156; H10K 50/80; H10K 71/191; H10K 30/865; H10K 59/00; H10K 71/00; H10K 85/111; H10K 50/18; H10K 2102/351
  See application file for complete search history.

(56) References Cited

U.S. PATENT DOCUMENTS

| | | | |
|---|---|---|---|
| 5,247,190 A | 9/1993 | Friend | |
| 5,703,436 A | 12/1997 | Forrest | |
| 5,707,745 A | 1/1998 | Forrest | |
| 5,834,893 A | 11/1998 | Bulovic | |
| 5,844,363 A | 12/1998 | Gu | |
| 6,013,982 A | 1/2000 | Thompson | |
| 6,087,196 A | 7/2000 | Sturm | |
| 6,091,195 A | 7/2000 | Forrest | |
| 6,097,147 A | 8/2000 | Baldo | |
| 6,294,398 B1 | 9/2001 | Kim | |
| 6,303,238 B1 | 10/2001 | Thompson | |
| 6,337,102 B1 | 1/2002 | Forrest | |
| 6,468,819 B1 | 10/2002 | Kim | |
| 6,528,187 B1 | 3/2003 | Okada | |
| 6,687,266 B1 | 2/2004 | Ma | |
| 6,835,469 B2 | 12/2004 | Kwong | |
| 6,921,915 B2 | 7/2005 | Takiguchi | |
| 7,087,321 B2 | 8/2006 | Kwong | |
| 7,090,928 B2 | 8/2006 | Thompson | |
| 7,154,114 B2 | 12/2006 | Brooks | |
| 7,250,226 B2 | 7/2007 | Tokito | |
| 7,279,704 B2 | 10/2007 | Walters | |
| 7,332,232 B2 | 2/2008 | Ma | |
| 7,338,722 B2 | 3/2008 | Thompson | |
| 7,393,599 B2 | 7/2008 | Thompson | |
| 7,396,598 B2 | 7/2008 | Takeuchi | |
| 7,431,968 B1 | 10/2008 | Shtein | |
| 7,445,855 B2 | 11/2008 | MacKenzie | |
| 7,534,505 B2 | 5/2009 | Lin | |
| 7,968,146 B2 | 6/2011 | Wagner | |
| 8,409,729 B2 | 4/2013 | Zeng | |
| 2002/0034656 A1 | 3/2002 | Thompson | |
| 2002/0134984 A1 | 9/2002 | Igarashi | |
| 2002/0158242 A1 | 10/2002 | Son | |
| 2003/0138657 A1 | 7/2003 | Li | |
| 2003/0152802 A1 | 8/2003 | Tsuboyama | |
| 2003/0162053 A1 | 8/2003 | Marks | |
| 2003/0175553 A1 | 9/2003 | Thompson | |
| 2003/0230980 A1 | 12/2003 | Forrest | |
| 2004/0036077 A1 | 2/2004 | Ise | |
| 2004/0137267 A1 | 7/2004 | Igarashi | |
| 2004/0137268 A1 | 7/2004 | Igarashi | |
| 2004/0174116 A1 | 9/2004 | Lu | |
| 2005/0025993 A1 | 2/2005 | Thompson | |
| 2005/0112407 A1 | 5/2005 | Ogasawara | |
| 2005/0211974 A1* | 9/2005 | Thompson | H10K 85/361 257/40 |
| 2005/0238919 A1 | 10/2005 | Ogasawara | |
| 2005/0244673 A1 | 11/2005 | Satoh | |
| 2005/0260441 A1 | 11/2005 | Thompson | |
| 2005/0260449 A1 | 11/2005 | Walters | |
| 2006/0008670 A1 | 1/2006 | Lin | |
| 2006/0134460 A1* | 6/2006 | Kondakova | C09K 11/06 313/506 |
| 2006/0202194 A1 | 9/2006 | Jeong | |
| 2006/0240279 A1 | 10/2006 | Adamovich | |
| 2006/0251923 A1 | 11/2006 | Lin | |
| 2006/0263635 A1 | 11/2006 | Ise | |
| 2006/0280965 A1 | 12/2006 | Kwong | |
| 2007/0190359 A1 | 8/2007 | Knowles | |
| 2007/0278938 A1 | 12/2007 | Yabunouchi | |
| 2008/0015355 A1 | 1/2008 | Schafer | |
| 2008/0018221 A1 | 1/2008 | Egen | |
| 2008/0106190 A1 | 5/2008 | Yabunouchi | |
| 2008/0124572 A1 | 5/2008 | Mizuki | |
| 2008/0220265 A1 | 9/2008 | Xia | |
| 2008/0297033 A1 | 12/2008 | Knowles | |
| 2009/0008605 A1 | 1/2009 | Kawamura | |
| 2009/0009065 A1 | 1/2009 | Nishimura | |
| 2009/0017330 A1 | 1/2009 | Iwakuma | |
| 2009/0030202 A1 | 1/2009 | Iwakuma | |
| 2009/0039776 A1 | 2/2009 | Yamada | |
| 2009/0045730 A1 | 2/2009 | Nishimura | |
| 2009/0045731 A1 | 2/2009 | Nishimura | |
| 2009/0101870 A1 | 4/2009 | Prakash | |
| 2009/0108737 A1 | 4/2009 | Kwong | |
| 2009/0115316 A1 | 5/2009 | Zheng | |
| 2009/0165846 A1 | 7/2009 | Johannes | |
| 2009/0167162 A1 | 7/2009 | Lin | |
| 2009/0179554 A1 | 7/2009 | Kuma | |
| 2011/0089407 A1* | 4/2011 | Schmidhalter | G01N 31/225 257/E51.027 |
| 2012/0061658 A1* | 3/2012 | Forrest | B82Y 10/00 257/E51.026 |
| 2013/0026452 A1 | 1/2013 | Kottas | |
| 2013/0033174 A1* | 2/2013 | Takaku | H10K 85/346 252/301.16 |
| 2013/0038640 A1* | 2/2013 | Kajimoto | H10K 50/858 257/89 |
| 2013/0119354 A1 | 5/2013 | Ma | |
| 2014/0054564 A1 | 2/2014 | Kim | |
| 2015/0060830 A1* | 3/2015 | Thompson | C09K 11/06 546/4 |
| 2015/0318487 A1 | 11/2015 | Ito | |

FOREIGN PATENT DOCUMENTS

| | | | |
|---|---|---|---|
| EP | 1725079 | | 11/2006 |
| EP | 2034538 | | 3/2009 |
| EP | 2551932 | | 1/2013 |
| EP | 2977378 | | 1/2016 |
| JP | 2003109758 A | * | 4/2003 |
| JP | 200511610 | | 1/2005 |
| JP | 2007123392 | | 5/2007 |
| JP | 2007254297 | | 10/2007 |
| JP | 2008074939 | | 4/2008 |
| JP | 2010135467 | | 6/2010 |
| WO | 0857007 A1 | * | 2/1998 |
| WO | 0139234 | | 5/2001 |
| WO | 0202714 | | 1/2002 |
| WO | 0215645 | | 2/2002 |
| WO | 03040257 | | 5/2003 |
| WO | 03060956 | | 7/2003 |
| WO | 2004093207 | | 10/2004 |
| WO | 2004107822 | | 12/2004 |
| WO | 2004111066 | | 12/2004 |
| WO | 2005014551 | | 2/2005 |
| WO | 2005019373 | | 3/2005 |
| WO | 2005030900 | | 4/2005 |
| WO | 2005089025 | | 9/2005 |
| WO | 2005123873 | | 12/2005 |
| WO | 2006009024 | | 1/2006 |
| WO | 2006056418 | | 6/2006 |
| WO | 2006072002 | | 7/2006 |
| WO | 2006082742 | | 8/2006 |
| WO | 2006098120 | | 9/2006 |
| WO | 2006100298 | | 9/2006 |

(56) References Cited

FOREIGN PATENT DOCUMENTS

| WO | 2006103874 | 10/2006 | |
|---|---|---|---|
| WO | 2006114966 | 11/2006 | |
| WO | 2006132173 | 12/2006 | |
| WO | 2007002683 | 1/2007 | |
| WO | 2007004380 | 1/2007 | |
| WO | 2007063754 | 6/2007 | |
| WO | 2007063796 | 6/2007 | |
| WO | 2008044723 | 4/2008 | |
| WO | 2008056746 | 5/2008 | |
| WO | 2008057394 | 5/2008 | |
| WO | 2008101842 | 8/2008 | |
| WO | 2008132085 | 11/2008 | |
| WO | 2009000673 | 12/2008 | |
| WO | 2009003898 | 1/2009 | |
| WO | 2009008311 | 1/2009 | |
| WO | 2009018009 | 2/2009 | |
| WO | 2009021126 | 2/2009 | |
| WO | 2009050290 | 4/2009 | |
| WO | 2009062578 | 5/2009 | |
| WO | 2009063833 | 5/2009 | |
| WO | 2009066778 | 5/2009 | |
| WO | 2009066779 | 5/2009 | |
| WO | 2009086028 | 7/2009 | |
| WO | 2009100991 | 8/2009 | |
| WO | 2010011390 | 1/2010 | |
| WO | 2010111175 | 9/2010 | |
| WO | 2010126234 | 11/2010 | |
| WO | WO-2015072070 A1 * | 5/2015 | ......... H01L 51/5056 |

OTHER PUBLICATIONS

Alberto et al., (2013), "Photophysical Properties of Cyclometalated Pt(II) Complexes: Counterintuitive Blue Shift in Emission with an Expanded Ligandtr System", Inorganic Chemistry,52(21), 12403-12415. (Year: 2013).*
Wong, Wai-Yeung, "Multifunctional Iridium Complexes Based on Carbazole Modules as Highly Efficient Electrophosphors," Angew. Chem. Int. Ed., 45:7800-7803 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode: an Isoindole Derivative," Chem. Mater., 15(16):3148-3151 (2003).
Okumoto, Kenji et al., "Green Fluorescent Organic Light-Emitting Device with External Quantum Efficiency of Nearly 10%," Appl. Phys. Lett., 89:063504-1-063504-3 (2006).
Paulose, Betty Marie Jennifer S, et al., "First Examples of Alkenyl Pyridines as Organic Ligands for Phosphorescent Iridium Complexes," Adv. Mater., 16(22):2003-2007 (2004).
Tang, C.W. and VanSlyke, S.A., "Organic Electroluminescent Diodes," Appl. Phys. Lett., 51(12):913-915 (1987).
T. Ostergard et al., "Langmuir-Blodgett Light-Emitting Diodes Of Poly(3-Hexylthiophene): Electro-Optical Characteristics Related to Structure," Synthetic Metals, 87:171-177 (1997).
Tung, Yung-Liang et al., "Organic Light-Emitting Diodes Based on Charge-Neutral Ru II PHosphorescent Emitters," Adv. Mater., 17(8):1059-1064 (2005).
Van Slyke, S. A. et al., "Organic Electroluminescent Devices with Improved Stability," Appl. Phys. Lett, 69(15 ):2160-2162 (1996).
Wong, Keith Man-Chung et al., "A Novel Class of Phosphorescent Gold(III) Alkynyl-Based Organic Light-Emitting Devices with Tunable Colour," Chem. Commun., 2906-2908 (2005).
Adachi, Chihaya et al., "Organic Electroluminescent Device Having a Hole Conductor as an Emitting Layer," Appl. Phys. Lett., 55(15):1489-1491 (1989).
Baldo et al., "Highly Efficient Phosphorescent Emission from Organic Electroluminescent Devices," Nature, vol. 395,151-154, (1998).
Gao, Zhiqiang et al., "Bright-Blue Electroluminescence From a Silyl-Substituted ter-(phenylenevinylene) derivative," Appl. Phys. Lett., 74(6):865-867 (1999).
Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Wang, Y. et al., "Highly Efficient Electroluminescent Materials Based on Fluorinated Organometallic Iridium Compounds," Appl. Phys. Lett., 79(4):449-451 (2001).
Kwong, Raymond C. et al., "High Operational Stability of Electrophosphorescent Devices," Appl. Phys. Lett., 81(1):162-164 (2002).
Holmes, R.J. et al., "Blue Organic Electrophosphorescence Using Exothermic Host-Guest Energy Transfer," Appl. Phys. Lett., 82(15):2422-2424 (2003).
Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1-153505-3 (2005).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
Adachi, Chihaya et al., "High-Efficiency Red Electrophosphorescence Devices," Appl. Phys. Lett., 78(11):1622-1624 (2001).
Hamada, Yuji et al., "High Luminance in Organic Electroluminescent Devices with Bis(10-hydroxybenzo[h]quinolinato)beryllium as an Emitter," Chem. Lett., 905-906 (1993).
Nishida, Jun-ichi et al., "Preparation, Characterization, and Electroluminescence Characteristics of a-Diimine-type Platinum(II) Complexes with Perfluorinated Phenyl Groups as Ligands," Chem. Lett., 34(4):592-593 (2005).
Baldo et al., "Very high-efficiency green organic light-emitting devices based on electrophosphorescence," Appl. Phys. Lett., vol. 75, No. 3, 4-6 (1999).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Niu, Yu-Hua et al., "Highly Efficient Electrophosphorescent Devices with Saturated Red Emission from a Neutral Osmium Complex," Chem. Mater., 17(13):3532-3536 (2005).
Lo, Shih-Chun et al., "Blue Phosphorescence from Iridium(III) Complexes at Room Temperature," Chem. Mater., 18(21):5119-5129 (2006).
Takizawa, Shin-ya et al., "Phosphorescent Iridium Complexes Based on 2-Phenylimidazo[1,2-a]pyridine Ligands: Tuning of Emission Color toward the Blue Region and Application to Polymer Light-Emitting Devices," Inorg. Chem., 46(10):4308-4319 (2007).
Lamansky, Sergey et al., "Synthesis and Characterization of Phosphorescent Cyclometalated Iridium Complexes," Inorg. Chem., 40(7):1704-1711 (2001).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Noda, Tetsuya and Shirota, Yasuhiko, "5,6-Bis(dinnesitylboryl)-2,2'-bithiophene and 5,5"-Bis(dimesitylbory1)-2,2':5',2"-terthiophene as a Novel Family of Electron-Transporting Amorphous Molecular Materials," J. Am. Chem. Soc., 120 (37):9714-9715 (1998).
Sakamoto, Youichi et al., "Synthesis, Characterization, and Electron-Transport Property of Perfluorinated Phenylene Dendrimers," J. Am. Chem. Soc., 122(8):1832-1833 (2000).
Adachi, Chihaya et al., "Nearly 100% Internal Phosphorescence Efficiency in an Organic Light Emitting Device," J. Appl. Phys., 90(10):5048-5051 (2001).
Shirota, Yasuhiko et al., "Starburst Molecules Based on p-Electron Systems as Materials for Organic Electroluminescent Devices," Journal of Luminescence, 72-74:985-991 (1997).
Inada, Hiroshi and Shirota, Yasuhiko, "1,3,5-Tris[4-(diphenylamino)phenyl]benzene and its Methylsubstituted Deriva-

(56) References Cited

OTHER PUBLICATIONS tives as a Novel Class of Amorphous Molecular Materials," J. Mater. Chem., 3(3):319-320 (1993).
Kido, Junji et al.,"1,2,4-Triazole Derivative as an Electron Transport Layer in Organic Electroluminescent Devices," Jpn. J. Appl. Phys., 32:L917-L920 (1993).
Guo, Tzung-Fang et al., "Highly Efficient Electrophosphorescent Polymer Light-Emitting Devices," Organic Electronics, 1:15-20 (2000).
Palilis, Leonidas C., "High Efficiency Molecular Organic Light-Emitting Diodes Based On Silole Derivatives And Their Exciplexes," Organic Electronics, 4:113-121 (2003).
Ikeda, Hisao et al., "P-185: Low-Drive-Voltage OLEDs with a Buffer Layer Having Molybdenum Oxide," SID Symposium Digest, 37:923-926 (2006).
Hu, Nan-Xing et al., "Novel High Tg Hole-Transport Molecules Based on Indolo[3,2-b]carbazoles for Organic Light-Emitting Devices," Synthetic Metals, 111-112:421-424 (2000).
Salbeck, J. et al., "Low Molecular Organic Glasses for Blue Electroluminescence," Synthetic Metals, 91:209-215 (1997).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," Adv. Mater., 6(9):677-679 (1994).
Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).
Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.
Hung, L.S. et al., "Anode Modification in Organic Light-Emitting Diodes by Low-Frequency Plasma Polymerization of CHF3," Appl. Phys. Lett., 78(5):673-675 (2001).
Ikai, Masamichi and Tokito, Shizuo, "Highly Efficient Phosphorescence From Organic Light-Emitting Devices with an Exciton-Block Layer," Appl. Phys. Lett., 79(2):156-158 (2001).
Culham, S., et al. (2013). Highly Luminescent Dinuclear Platinum(II) Complexes Incorporating Bis-Cyclometallating Pyrazine-Based Ligands: A Versatile Approach to Efficient Red Phosphors. Inorganic Chemistry, 52(19), 10992-11003.
Tuong Ly, K., Chen-Cheng, R.-W., Lin, H.-W., Shiau, Y.-J., Liu, S.-H., Chou, P.-T., . . . Chi, Y. (2016). Near-infrared organic light-emitting diodes with very high external quantum efficiency and radiance. Nature Photonics, 11(1), 63-68.
Fleetham, T., Wang, Z., & Li, J. (2012). Efficient deep blue electrophosphorescent devices based on platinum(II) bis(n-methyl-imidazolyl)benzene chloride. Organic Electronics, 13(8), 1430-1435.
Norby, G. E., Park, C.-D., O'Brien, B., Li, G., Huang, L., & Li, J. (2016). Efficient white OLEDs employing red, green, and blue tetradentate platinum phosphorescent emitters. Organic Electronics, 37, 163-168.
Fleetham, T. B., Huang, L., Klimes, K., Brooks, J., & Li, J. (2016). Tetradentate Pt(II) Complexes with 6-Membered Chelate Rings: A New Route for Stable and Efficient Blue Organic Light Emitting Diodes. Chemistry of Materials, 28(10), 3276-3282.

Kim, K.-H., Liao, J.-L., Lee, S. W., Sim, B., Moon, C.-K., Lee, G.-H., . . . Kim, J.-J. (2016). Crystal Organic Light-Emitting Diodes with Perfectly Oriented Non-Doped Pt-Based Emitting Layer. Advanced Materials, 28(13), 2526-2532.
Bulović, V., Khalfin, V. B., Gu, G., Burrows, P. E., Garbuzov, D. Z., & Forrest, S. R. (1998). Weak microcavity effects in organic light-emitting devices. Physical Review B, 58(7), 3730-3740.
Smith, L. H., Wasey, J. A. E., Samuel, I. D. W., & Barnes, W. L. (2005). Light Out-Coupling Efficiencies of Organic Light-Emitting Diode Structures and the Effect of Photoluminescence Quantum Yield. Advanced Functional Materials, 15(11), 1839-1844.
Nowy, S., Krummacher, B. C., Frischeisen, J., Reinke, N. A., & Brütting, W. (2008). Light extraction and optical loss mechanisms in organic light-emitting diodes: Influence of the emitter quantum efficiency. Journal of Applied Physics, 104(12), 123109.
Lassiter, B. E., Lunt, R. R., Renshaw, C. K., & Forrest, S. R. (2010). Structural templating of multiple polycrystalline layers in organic photovoltaic cells. Optics Express, 18(S3), A444.
Soo Yook, K., Doo Chin, B., Yeob Lee, J., Lassiter, B. E., & Forrest, S. R. (2011). Vertical orientation of copper phthalocyanine in organic solar cells using a small molecular weight organic templating layer. Applied Physics Letters, 99(4), 043308.
Chi, Y., & Chou, P.-T. (2010). Transition-metal phosphors with cyclometalating ligands: fundamentals and applications. Chem. Soc. Rev., 39(2), 638-655.
Xiao, K., Deng, W., Keum, J. K., Yoon, M., Vlassiouk, I. V., Clark, K. W., . . . Geohegan, D. B. (2013). Surface-Induced Orientation Control of CuPc Molecules for the Epitaxial Growth of Highly Ordered Organic Crystals on Graphene. Journal of the American Chemical Society, 135(9), 3680-3687.
Forrest, S. R. (1997). Ultrathin Organic Films Grown by Organic Molecular Beam Deposition and Related Techniques. Chemical Reviews, 97(6), 1793-1896.
Loi, M. A., da Como, E., Dinelli, F., Murgia, M., Zamboni, R., Biscarini, F., & Muccini, M. (2004). Supramolecular organization in ultra-thin films of α-sexithiophene on silicon dioxide. Nature Materials, 4(1), 81-85.
Hunter, C. A., & Sanders, J. K. M. (1990). The nature of .pi.-.pi. interactions. Journal of the American Chemical Society, 112(14), 5525-5534.
Hunter, C. A., Lawson, K. R., Perkins, J., & Urch, C. J. (2001). Aromatic interactions. Journal of the Chemical Society, Perkin Transactions 2, (5), 651-669.
Bossi, A., Rausch, A. F., Leitl, M. J., Czerwieniec, R., Whited, M. T., Djurovich, P. I., . . . Thompson, M. E. (2013). Photophysical Properties of Cyclometalated Pt(II) Complexes: Counterintuitive Blue Shift in Emission with an Expanded Ligand π System. Inorganic Chemistry, 52(21), 12403-12415.
Brooks, J., Babayan, Y., Lamansky, S., Djurovich, P. I., Tsyba, I., Bau, R., & Thompson, M. E. (2002). Synthesis and Characterization of Phosphorescent Cyclometalated Platinum Complexes. Inorganic Chemistry, 41(12), 3055-3066.
Hinner, M. J., & Thiel, W. R. (2004). A synthetic approach to pyrazole functionalized polystyrene. Polymer Bulletin, 53(1), 19-24.
Myznikov, L. V., Roh, J., Artamonova, T. V., Hrabalek, A., & Koldobskii, G. I. (2007). Tetrazoles: LI. Synthesis of 5-substituted tetrazoles under microwave activation. Russian Journal of Organic Chemistry, 43(5), 765-767.

* cited by examiner

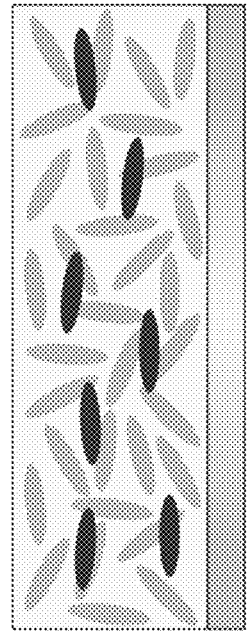
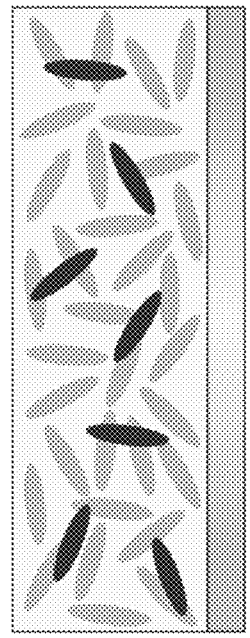
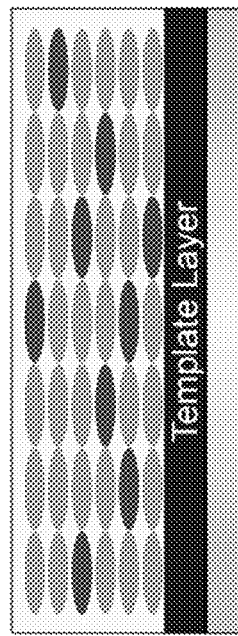
Fig. 3

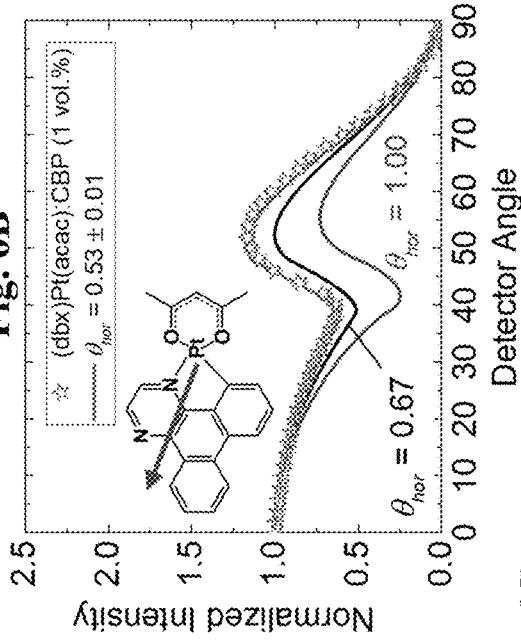
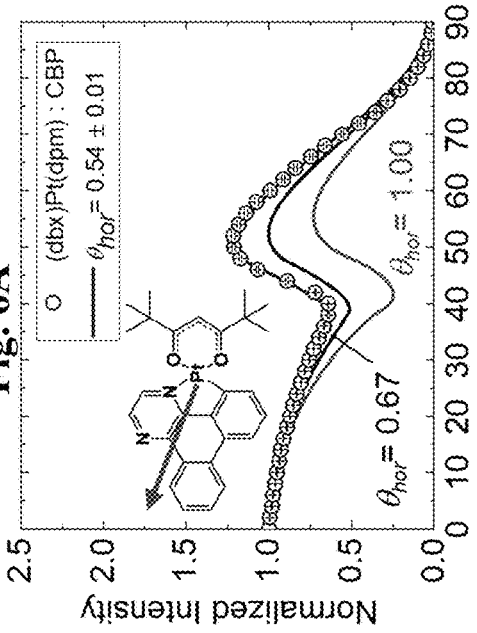
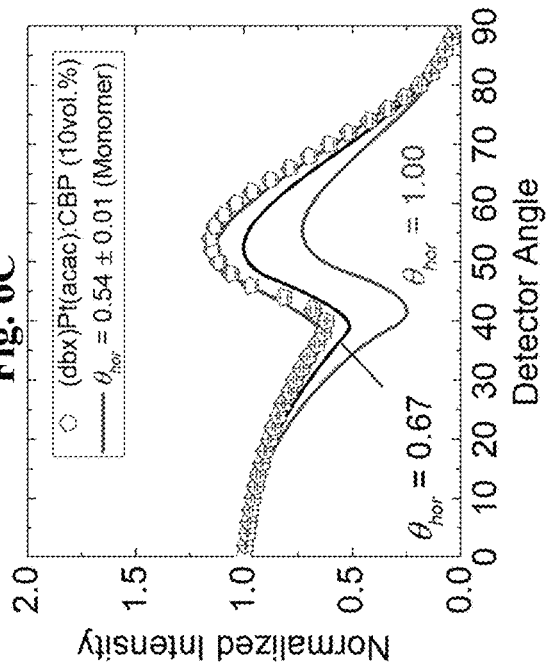
Fig. 6

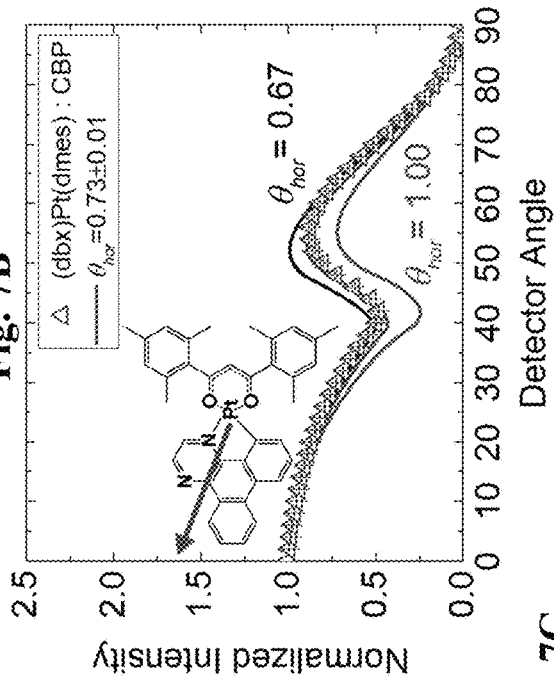
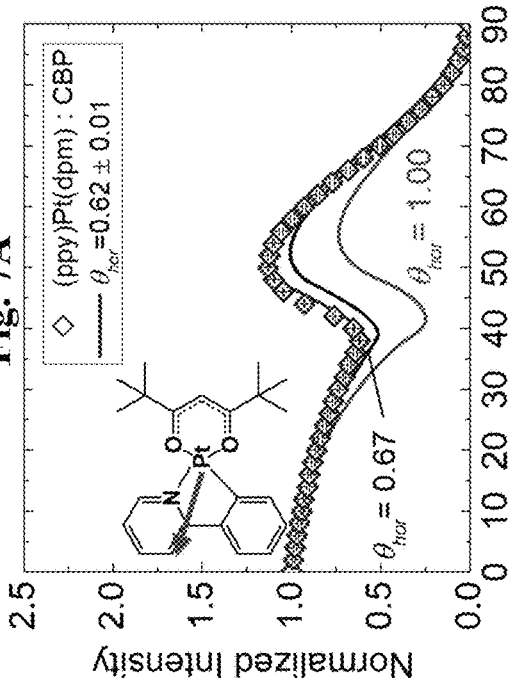
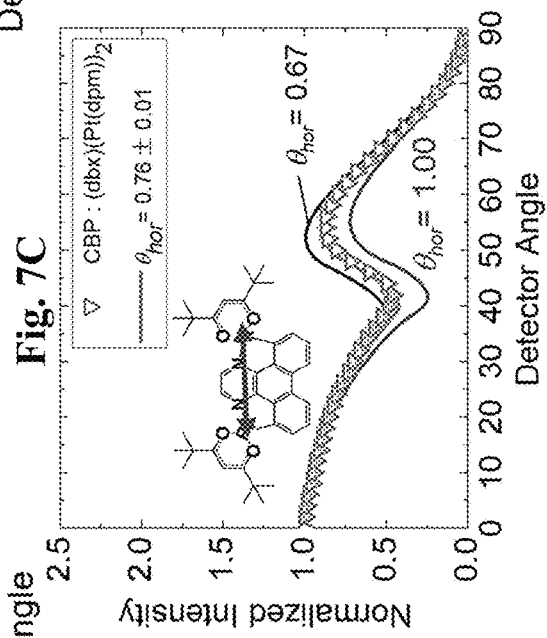
Fig. 7

| Material | Space Group | a(Å) | b(Å) | c(Å) | α(°) | β(°) | γ(°) | Cell Volume (Å³) |
|---|---|---|---|---|---|---|---|---|
| PtD | P b c a | 20.9 | 6.7 | 45.0 | 90 | 90 | 90 | 6294.1 |

| Material | Space Group | a(Å) | b(Å) | c(Å) | α(°) | β(°) | γ(°) | Cell Volume (Å³) |
|---|---|---|---|---|---|---|---|---|
| Tint | P-1 | 8.1 | 9.1 | 11.6 | 109.3 | 101.9 | 100.8 | 750.91 |

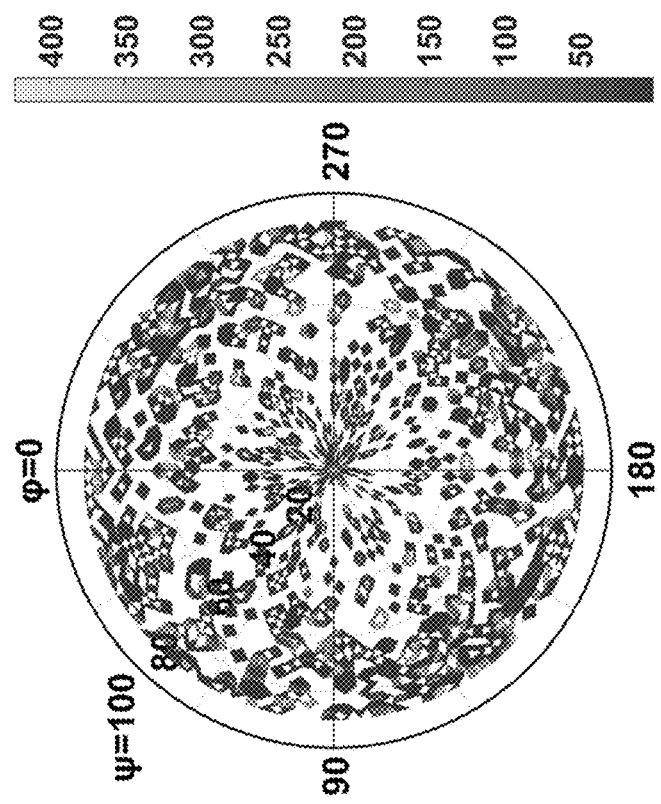
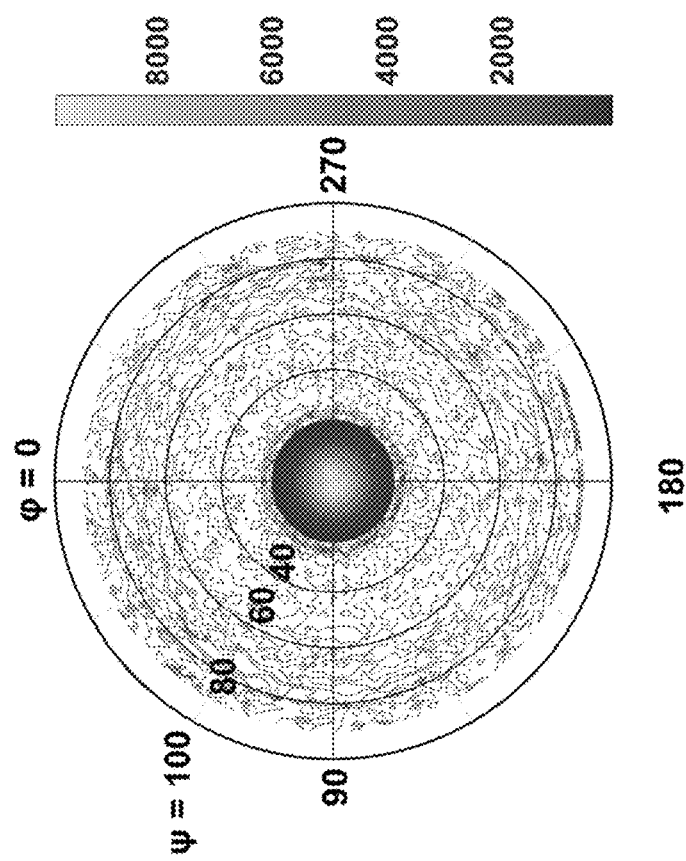
Fig. 14

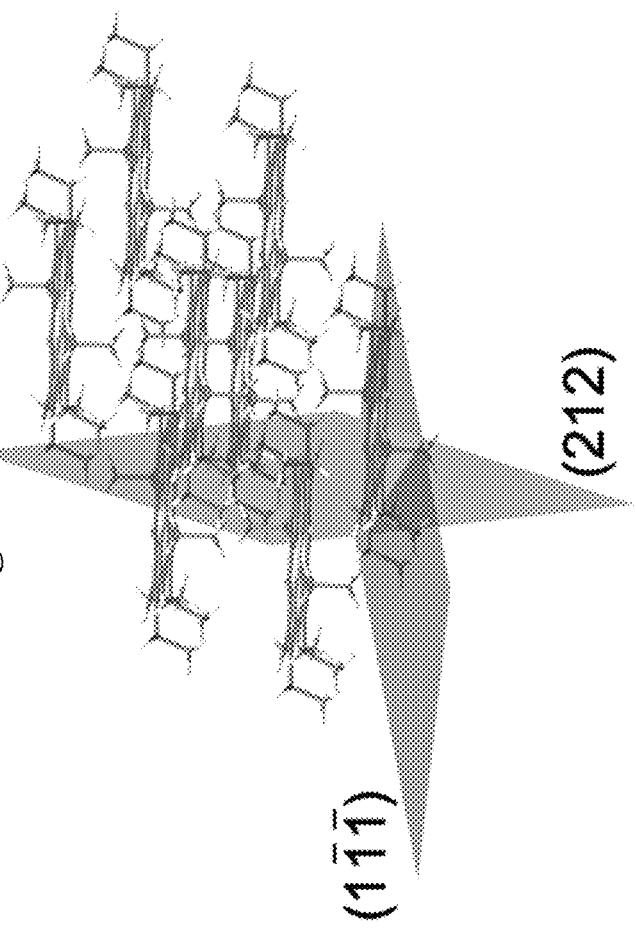
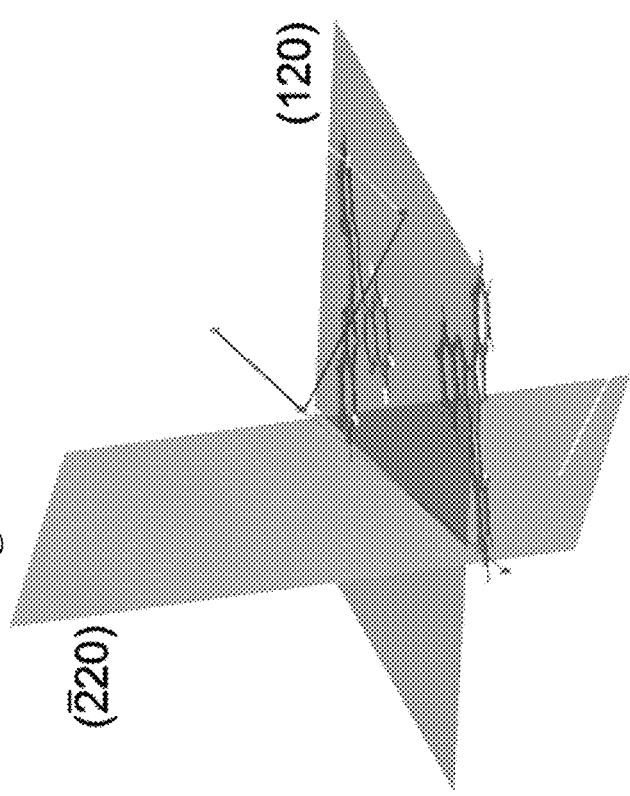
Fig. 21

| Material | Space Group | a(Å) | b(Å) | c(Å) | α(°) | β(°) | γ(°) | Cell Volume (Å³) |
|---|---|---|---|---|---|---|---|---|
| (dbx)Pt(dpm) | P m n a | 6.7 | 12.9 | 27.3 | 90 | 90 | 90 | 2366.23 |

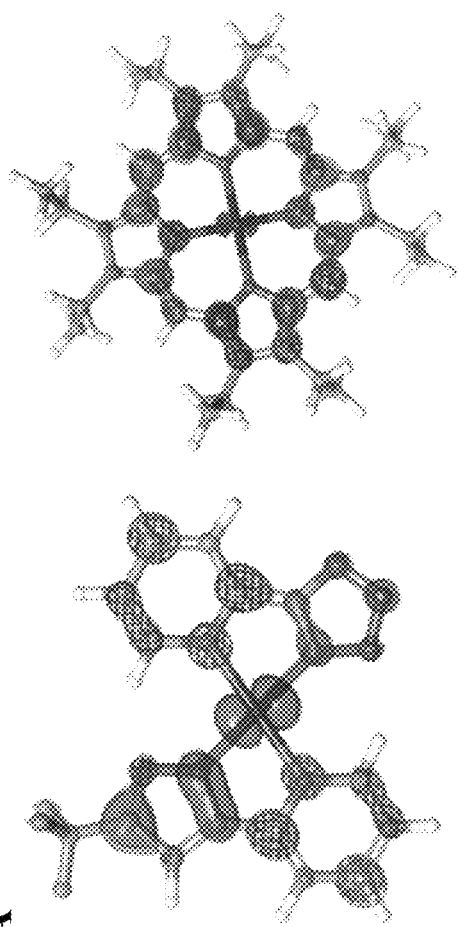
Fig. 25A
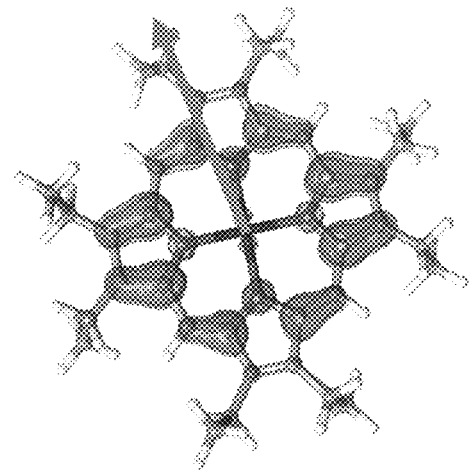
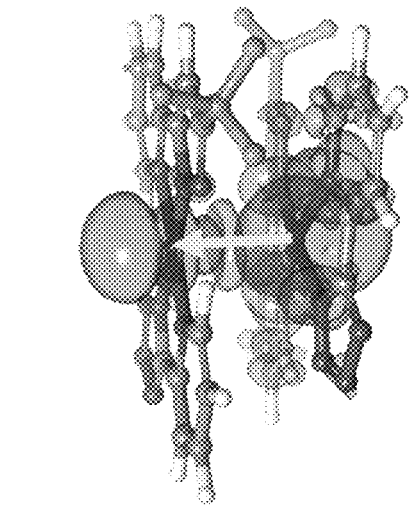
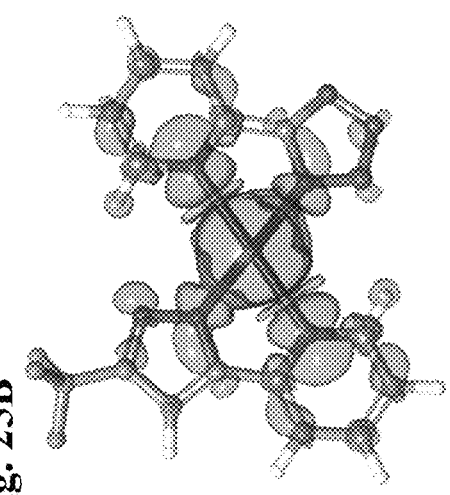
Fig. 25B
Fig. 25

ORGANIC ELECTROLUMINESCENT DEVICE

CROSS-REFERENCE TO RELATED APPLICATIONS

The present application claims priority to U.S. Provisional Application No. 62/885,550, filed Aug. 12, 2019, U.S. Provisional Application No. 62/885,525, filed Aug. 12, 2019, and U.S. Provisional Application No. 63/002,988, filed Mar. 31, 2020, all of which are incorporated by reference herein in their entireties.

STATEMENT REGARDING FEDERALLY SPONSORED RESEARCH OR DEVELOPMENT

This invention was made with government support under Award Number DE-EE0007626, awarded by the Office of Energy Efficiency and Renewable Energy (EERE), U.S. Department of Energy. The Government has certain rights in the invention.

FIELD OF THE DISCLOSURE

The present disclosure relates to a method of increasing optical outcoupling of an organic light emitting device by orienting light emitting compounds relative to the substrate, and devices made using said methods.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

To date, studies on phosphorescent emitter orientation have largely focused on Ir complexes. While the common Ir (III) complexes used in OLEDs have octahedral geometries, related Pt (II) complexes have planar geometries. In this context, there has been a rapid progress in developing high external quantum efficiency Pt complex emitters for phosphorescent organic light emitting diodes (PHOLEDs) with favorable color characteristics and long operational lifetimes. Highly efficient PHOLEDs using these complexes have been enabled by increasing the fraction of light outcoupled from the PHOLED by aligning the transition dipole moments (TDM) of the light emitting molecules parallel to the substrate. Controlling the molecular alignment, therefore, can play a role in improving the efficiency of Pt complex-based PHOLEDs. The planar structure of Pt complexes has a better chance of forming π-stacking networks than bulky, 3 dimensional molecules, potentially enabling control of the molecular orientation in films via external forces such as structural templating.

SUMMARY OF THE DISCLOSURE

In one aspect, the present disclosure relates to an organic light emitting device (OLED) comprising: an anode; a cathode; and a light emitting layer having a first surface, a second surface, and a thickness therebetween, the light emitting layer being disposed between the anode and the cathode; wherein the light emitting layer comprises at least one luminescent compound; and wherein a transition dipole moment of the at least one luminescent compound is substantially perpendicular to the thickness of the light emitting layer.

In one embodiment, the at least one luminescent compound is a compound of Formula (Ia) or Formula (Ib);

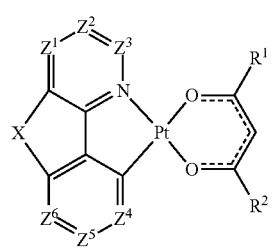

Formula (Ia)

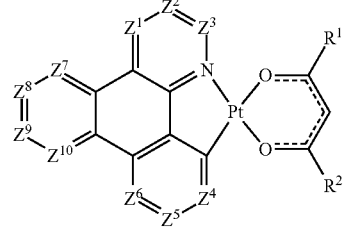

Formula (Ib)

wherein X is O, S, Se, $NR^3$, $CR^4R^5$, or $SiR^4R^5$;

wherein $Z^1$, $Z^2$, $Z^3$, $Z^4$, $Z^5$, $Z^6$, $Z^7$, $Z^8$, $Z^9$, and $Z^{10}$ are each independently N or $CR^6$; and wherein each $R^1$, $R^2$, $R^3$, $R^4$, $R^5$, and $R^6$ is independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; and wherein any two adjacent substituents are optionally joined to form a ring.

In one embodiment, $R^1$ is aryl or heteroaryl. In one embodiment, $R^1$ and $R^2$ are each aryl or heteroaryl. In one embodiment, $R^1$ and $R^2$ are mesityl. In one embodiment, at least one of $Z^1$, $Z^2$, $Z^3$, $Z^4$, $Z^5$, $Z^6$, $Z^7$, $Z^8$, $Z^9$, and $Z^{10}$ is N.

In one embodiment, the at least one luminescent compound is a compound of Formula (II);

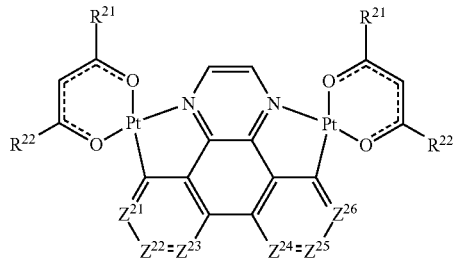

Formula (II)

wherein $Z^{21}$, $Z^{22}$, $Z^{23}$, $Z^{24}$, $Z^{25}$, and $Z^{26}$ are each independently N or $CR^{23}$; and wherein each $R^{21}$, $R^{22}$, and $R^{23}$ is each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; and wherein any two adjacent substituents are optionally joined to form a ring.

In one embodiment, $R^{21}$ and $R^{22}$ are alkyl. In one embodiment, $Z^{21}$, $Z^{22}$, $Z^{23}$, $Z^{24}$, $Z^{25}$, and $Z^{26}$ are each $CR^{23}$; and wherein each $R^{23}$ is hydrogen or deuterium.

In another aspect, the present disclosure relates to an organic light emitting device (OLED) comprising: an anode; a cathode; a light emitting layer having a first surface, a second surface, and a thickness therebetween, the light emitting layer being disposed between the anode and the cathode; and a template layer disposed between the anode and the light emitting layer, or between the cathode and the light emitting layer, the template layer comprising a polyaromatic compound; wherein the light emitting layer comprises at least one luminescent compound; and wherein a transition dipole moment of the at least one luminescent compound is substantially perpendicular to the thickness of the light emitting layer.

In one embodiment, the OLED further comprises an exciton blocking layer between the template layer and the light emitting layer. In one embodiment, the exciton blocking layer comprises 1,4,5,8-naphthalenetetracarboxylic dianhydride. In one embodiment, the template layer has a thickness of no more than 10 nm. In one embodiment, the light emitting layer comprises a light emitting compound having dihedral symmetry. In one embodiment, template layer comprises 3,4,9,10-perylenetetracarboxylic dianhydride.

The present disclosure also relates to a consumer product that includes an OLED described herein, wherein the consumer product is selected from the group consisting of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, a light therapy device, and a sign.

In another aspect, the present disclosure relates to a method of fabricating a light emitting layer, the method comprising the steps of: providing a substrate; depositing a template composition on the substrate, whereby a template layer having a thickness of less than 10 nm is formed from the template layer composition, the template composition comprising at least one polyaromatic compound; and depositing a light emitting composition on the template layer, the light emitting composition comprising at least one luminescent compound; whereby a light emitting layer is formed from the light emitting composition, said light emitting layer having a first surface, a second surface, and a thickness therebetween; and whereby a transition dipole moment of the at least one luminescent compound is substantially perpendicular to the thickness of the light emitting layer.

In one embodiment, the method further comprises the step of depositing less than 10 nm of an electron blocking composition on the template layer. In one embodiment, the light emitting composition is deposited via vacuum thermal evaporation at a rate of about 1/s. In one embodiment, the template layer thickness is less than 5 nm.

BRIEF DESCRIPTION OF THE DRAWINGS

The following detailed description of various embodiments of the disclosure will be better understood when read in conjunction with the appended drawings. For the purpose of illustrating the disclosure, there are shown in the drawings illustrative embodiments. It should be understood, however, that the disclosure is not limited to the precise arrangements and instrumentalities of the embodiments shown in the drawings.

FIG. 3 is a schematic demonstrating exemplary methods of controlling molecular orientation in light emitting layers. Amorphous growth leads to random alignment of molecules relative to the substrate. Molecular anisotropy can lead to preferable alignment of light emitting species. Growth of an ultrathin templating layer forces the subsequently deposited molecules to lie flat on the substrate.

FIG. 6, comprising FIG. 6A, FIG. 6B, and FIG. 6C, is an orientation analysis of (dbx)Pt(dpm). FIG. 6A is a plot of the angle dependent p-polarized photoluminescence of (dbx)Pt(dpm) doped at 10 vol. %. FIG. 6B is a plot of the angle dependent p-polarized photoluminescence of (dbx)Pt(acac) doped at 1 vol. %. FIG. 6C is a plot of the angle dependent p-polarized photoluminescence of (dbx)Pt(acac) doped at 10 vol. %. Insets show TDM vectors.

FIG. 7, comprising FIG. 7A, FIG. 7B, and FIG. 7C, is an orientation analysis of Pt complex dopants. FIG. 7A is a plot of the angle dependent p-polarized photoluminescence of (ppy)Pt(dpm) doped into CBP at 10 vol. %. FIG. 7B is a plot of the angle dependent p-polarized photoluminescence of (dbx)Pt(dmes) doped into CBP at 10 vol. %. FIG. 7C is a plot of the angle dependent p-polarized photoluminescence of $(dbx)(Pt(dmes))_2$ doped into CBP at 10 vol. %. Insets show the TDM orientations in the molecules.

FIG. 9A, FIG. 9B, and FIG. 9C, depicts the photophysical and structural characteristics of neat films of PtD and PtOEP doped Tint. FIG. 9A is a plot of photoluminescence spectra of films of neat PtD, and 1 vol. % PtD doped in PMMA. The arrow in the inset illustrates the dimer transition dipole moment vector formed between two PtD molecules as determined via time dependent density functional theory (TD-DFT). The z-axis is between the Pt center of the dopant molecules, whereas the PtD molecular plane lies in the x-y plane. FIG. 9B is a plot of the photoluminescence spectra of PtOEP doped Tint at 10 vol. %. The arrow in the inset illustrates the transition dipole moment vector within the PtOEP molecule. FIG. 9C is a plot of the XRD diffraction patterns of neat PtOEP, PtD and Tint films. The data are offset for clarity.

FIG. 14, comprising FIG. 14A and FIG. 14B, demonstrates control of the PtD transition dipole moment via templating. FIG. 14A is an X-ray pole figure of the (200) plane (2θ=8.4°) for a neat PtD film on sapphire. FIG. 14B is an X-ray pole figure of the (020) plane (2θ=26.6°) for a neat PtD film on a PTCDA template layer.

FIG. 21, comprising FIG. 21A and FIG. 21B, demonstrates control of the PtOEP:Tint transition dipole moment via templating. FIG. 21A shows the Tint crystal structure and diffraction planes from single crystal x-ray diffraction measurements. The diffraction peaks at 2θ=27.0° and 27.3° correspond to the (220) plane (green), (120) plane (red), respectively. FIG. 21B depicts the PtOEP crystal structure and diffraction planes from Cambridge Crystallographic Data library (CCDC-1167542). The diffraction peaks at 2θ=25.9° and 20.5° correspond to (212) (green), (111) (red) planes, respectively.

FIG. 25, comprising FIG. 25A and FIG. 25B, depicts the results from Density Functional Theory (DFT) calculations. FIG. 25A depicts the frontier molecular orbital plots for the Pt complexes computed for the S0 optimized geometries. The solid surface denotes the HOMO while the LUMO is indicated by the meshed surface in each case. FIG. 25B plots the spin density computed using the T1 optimized geometries.

DETAILED DESCRIPTION

Figure 1:
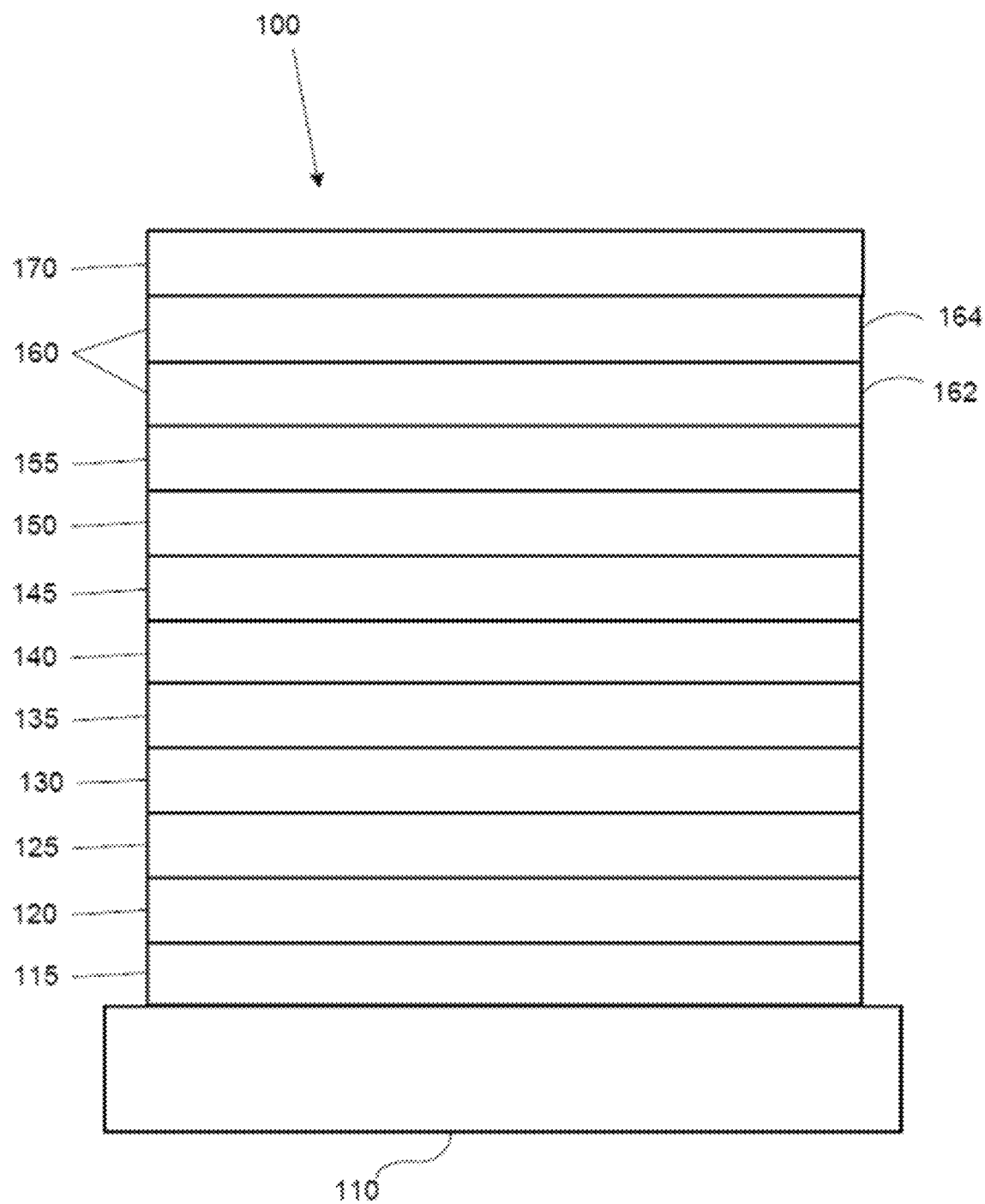
FIG. 1 shows an organic light emitting device.

It is to be understood that the figures and descriptions of the present disclosure have been simplified to illustrate elements that are relevant for a clear understanding of the present disclosure, while eliminating, for the purpose of clarity, many other elements found in related systems and methods. Those of ordinary skill in the art may recognize that other elements and/or steps are desirable and/or required in implementing the present disclosure. However, because such elements and steps are well known in the art, and because they do not facilitate a better understanding of the present disclosure, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this disclosure belongs. Although any methods and materials similar or equivalent to those described herein can be used in the practice or testing of the present disclosure, exemplary methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of 20%, ±10%, 5%, 1%, and 0.1% from the specified value, as such variations are appropriate.

Throughout this disclosure, various aspects of the disclosure can be presented in a range format. It should be understood that the description in range format is merely for convenience and brevity and should not be construed as an inflexible limitation on the scope of the disclosure. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
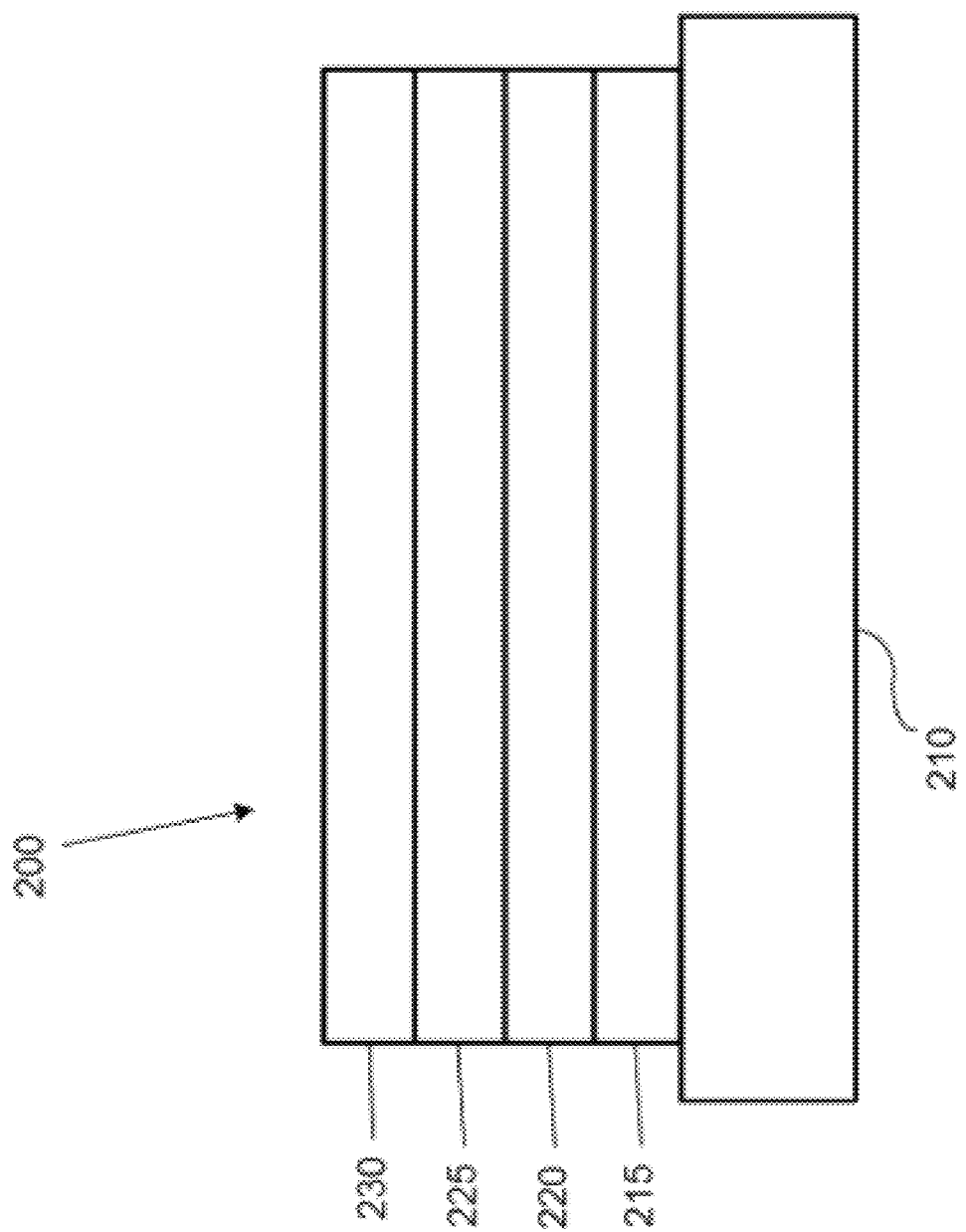
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIG. 1 and FIG. 2 is provided by way of non-limiting example, and it is understood that embodiments of the disclosure may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIG. 1 and FIG. 2.

The terms "halo," "halogen," and "halide" are used interchangeably and refer to fluorine, chlorine, bromine, and iodine.

The term "acyl" refers to a substituted carbonyl radical (C(O)—Rs).

The term "ester" refers to a substituted oxycarbonyl (—O—C(O)—Rs or —C(O)—O—Rs) radical.

The term "ether" refers to an —ORs radical.

The terms "sulfanyl" or "thio-ether" are used interchangeably and refer to a —SRs radical.

The term "sulfinyl" refers to a —S(O)—Rs radical.

The term "sulfonyl" refers to a —SO2-Rs radical.

The term "phosphino" refers to a —P(Rs)$_3$ radical, wherein each Rs can be same or different.

The term "silyl" refers to a —Si(Rs)$_3$ radical, wherein each Rs can be same or different.

In each of the above, Rs can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred Rs is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group is optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo[3.1.1]heptyl, spiro[4.5]decyl, spiro[5.5]undecyl, adamantyl, and the like. Additionally, the cycloalkyl group is optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group is optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group is optionally substituted.

The term "alkynyl" refers to and includes both straight and branched chain alkyne radicals. Preferred alkynyl groups are those containing two to fifteen carbon atoms. Additionally, the alkynyl group is optionally substituted.

The terms "aralkyl" or "arylalkyl" are used interchangeably and refer to an alkyl group that is substituted with an aryl group. Additionally, the aralkyl group is optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group is optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group is optionally substituted.

The term "polyaromatic" refers to and includes any unsaturated cyclic hydrocarbons containing two or more aryl or heteroaryl rings. Polyaromatic groups include fused aromatic groups.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some instances, the preferred general substituents are selected from the group consisting of deuterium, fluorine, alkyl, cycloalkyl, alkoxy, aryloxy, amino, silyl, aryl, heteroaryl, sulfanyl, and combinations thereof.

In yet other instances, the more preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when R1 represents mono-substitution, then one R1 must be other than H (i.e., a substitution). Similarly, when R1 represents di-substitution, then two of R1 must be other than H. Similarly, when R1 represents no substitution, R1, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective aromatic ring can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., Tetrahedron 2015, 71, 1425-30 and Atzrodt et al., Angew. Chem. Int. Ed. (Reviews) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instance, a pair of adjacent substituents can be optionally joined or fused into a ring. The preferred ring is a five, six, or seven-membered carbocyclic or heterocyclic ring, includes both instances where the portion of the ring formed by the pair of substituents is saturated and where the portion of the ring formed by the pair of substituents is unsaturated. As used herein, "adjacent" means that the two substituents involved can be on the same ring next to each other, or on two neighboring rings having the two closest available substitutable positions, such as 2, 2' positions in a biphenyl, or 1, 8 position in a naphthalene, as long as they can form a stable fused ring system.

In one aspect the present disclosure relates to an organic light emitting device (OLED) comprising an anode; a cathode; and a light emitting layer having a first surface, a second surface, and a thickness therebetween, the light emitting layer being disposed between the anode and the cathode; wherein the light emitting layer comprises at least one luminescent compound; and wherein the transition dipole moment of the at least one luminescent compound is substantially perpendicular to the thickness of the light emitting layer.

As contemplated herein, "substantially perpendicular" indicates that the fractional contribution of the net transition dipole moment (TDM) direction lying perpendicular to the thickness of the light emitting layer is greater than 0.5. In one embodiment, the fractional contribution of the net TDM perpendicular to the thickness of the layer is greater than 0.525. In one embodiment, the fractional contribution of the net TDM perpendicular to the thickness of the layer is greater than 0.550. In one embodiment, the fractional contribution of the net TDM perpendicular to the thickness of the layer is greater than 0.575. In one embodiment, the fractional contribution of the net TDM perpendicular to the thickness of the layer is greater than 0.600. In one embodiment, the fractional contribution of the net TDM perpendicular to the thickness of the layer is greater than 0.625. In one embodiment, the fractional contribution of the net TDM perpendicular to the thickness of the layer is greater than 0.650. In one embodiment, the fractional contribution of the net TDM perpendicular to the thickness of the layer is greater than 0.675. In one embodiment, the fractional contribution of the net TDM perpendicular to the thickness of the layer is greater than 0.700. In one embodiment, the fractional contribution of the net TDM perpendicular to the thickness of the layer is greater than 0.725. In one embodiment, the fractional contribution of the net TDM perpendicular to the thickness of the layer is greater than 0.750. In one embodiment, the fractional contribution of the net TDM perpendicular to the thickness of the layer is greater than 0.775. In one embodiment, the fractional contribution of the net TDM perpendicular to the thickness of the layer is greater than 0.800. In one embodiment, the fractional contribution of the net TDM perpendicular to the thickness of the layer is greater than 0.825. In one embodiment, the fractional contribution of the net TDM perpendicular to the thickness of the layer is greater than 0.850. In one embodiment, the fractional contribution of the net TDM perpendicular to the thickness of the layer is greater than 0.875. In one embodiment, the fractional contribution of the net TDM perpendicular to the thickness of the layer is greater than 0.900. In one embodiment, the fractional contribution of the net TDM perpendicular to the thickness of the layer is greater than 0.925. In one embodiment, the fractional contribution of the net TDM perpendicular to the thickness of the layer is greater than 0.950. In one embodiment, the fractional contribution of the net TDM perpendicular to the thickness of the layer is greater than 0.975. In one embodiment, the fractional contribution of the net TDM perpendicular to the thickness of the layer is approximately 1.000.

In one embodiment, the at least one luminescent compound is a compound of Formula (Ia) or Formula (Ib);

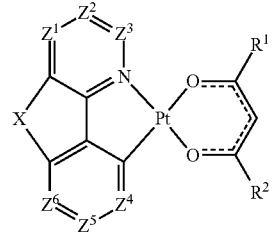

Formula (Ia)

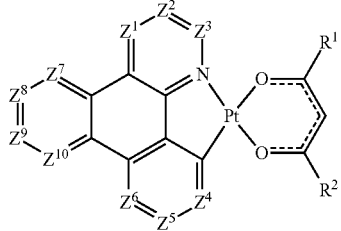

Formula (Ib)

wherein X is O, S, Se, $NR^3$, $CR^4R^5$, or $SiR^4R^5$;
wherein $Z^1$, $Z^2$, $Z^3$, $Z^4$, $Z^5$, $Z^6$, $Z^7$, $Z^8$, $Z^9$, and $Z^{10}$ are each independently N or $CR^6$; and
wherein each $R^1$, $R^2$, $R^3$, $R^4$, $R^5$, and $R^6$ is independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof, and wherein any two adjacent substituents are optionally joined to form a ring.

In one embodiment, $R^1$ is aryl or heteroaryl. In one embodiment, $R^1$ and $R^2$ are each aryl or heteroaryl. In one embodiment, $R^1$ and $R^2$ are mesityl.

In one embodiment, at least one of $Z^1$, $Z^2$, $Z^3$, $Z^4$, $Z^5$, $Z^6$, $Z^7$, $Z^8$, $Z^9$, and $Z^{10}$ is N.

In one embodiment, the at least one luminescent compound is a compound of Formula (II);

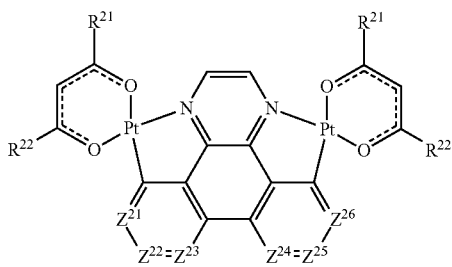

Formula (II)

wherein $Z^{21}$, $Z^{22}$, $Z^{23}$, $Z^{24}$, $Z^{25}$, and $Z^{26}$ are each independently N or $CR^{23}$; and
wherein each $R^{21}$, $R^{22}$, and $R^{23}$ is each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; and wherein any two adjacent substituents are optionally joined to form a ring. In one embodiment, $R^{21}$ and $R^{22}$ are alkyl. In one embodiment, $Z^{21}$, $Z^{22}$, $Z^{23}$, $Z^{24}$, $Z^{25}$, and $Z^{26}$ are each $CR^{23}$; and each $R^{23}$ is hydrogen or deuterium.

In one aspect, the present disclosure relates to an organic light emitting device (OLED) comprising an anode; a cathode; a light emitting layer having a first surface, a second surface, and a thickness therebetween, the light emitting layer being disposed between the anode and the cathode; and a template layer disposed between the anode and the light emitting layer, or between the cathode and the light emitting layer, the template layer comprising a polyaromatic compound; wherein the light emitting layer comprises at least one luminescent compound; and wherein the transition dipole moment of the at least one luminescent compound is substantially perpendicular to the thickness of the light emitting layer.

In one embodiment, the template layer comprises a polyaromatic organic compound. In one embodiment, the template layer comprises a planar compound. In one embodiment, the template layer comprises a polyaromatic planar compound. In one embodiment, the template layer comprises a polyaromatic hydrocarbon. In one embodiment, the template layer comprises 3,4,9,10-perylenetetracarboxylic dianhydride.

In one embodiment, the OLED further comprises an exciton blocking layer between the template layer and the light emitting layer. In one embodiment, the exciton blocking layer comprises 1,4,5,8-naphthalenetetracarboxylic dianhydride.

In one embodiment, the template layer has a thickness of no more than 10 nm, 8 nm, 6 nm, 4 nm, or 2 nm.

In one embodiment, the light emitting layer comprises a light emitting compound having dihedral symmetry. Any light emitting compound having dihedral symmetry known to those in the art is contemplated herein. In one embodiment, the light emitting compound is a transition metal complex. In one embodiment, the light emitting compound is a transition metal complex having square planar geometry. In one embodiment, the light emitting compound is a platinum complex. In one embodiment, the light emitting compound is PtOEP or PtD.

In one embodiment, the light emitting layer comprises a host. Any host compound known to those of skill in the art is contemplated. In one embodiment, the host compound comprises triindolotriazine.

In one embodiment, a device of the disclosure includes an encapsulation layer, for example an epoxy seal or other protective layer.

In one embodiment, the OLED described herein may be incorporated into a consumer product selected from the group consisting of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, a light therapy device, and a sign.

Although certain embodiments of the disclosure are discussed in relation to one particular device or type of device (for example OLEDs) it is understood that the disclosed improvements to light outcoupling properties of a substrate may be equally applied to other devices, including but not limited to PLEDs, OPVs, charge-coupled devices (CCDs), photosensors, or the like.

In one embodiment, the light emitting layer includes a stack of light emitting sublayers. In another embodiment, the light emitting layer includes light emitting sublayers that are arranged in a horizontally adjacent pattern, e.g., to from adjacent sub-pixels or an electronic display. For example, the light emitting body can includes separate red and green light emitting sublayers in a stacked or side-by-side (i.e., adjacent) arrangement.

The emitting layer can include one or more phosphorescent emitter compounds doped into a host material, wherein the phosphorescent emitter compound has a peak light emission wavelength in a range from 400 nm to 650 nm. In some instances, the light emitting layer can also include a fluorescent emitter compound or a thermal-assisted delayed fluorescent (TADF) emitter compound. For example, the emitting layer can include fluorescent or TADF compound with a peak light emission wavelength in a range from 430 nm to 500 nm.

In one embodiment, the electronic light display is a white-light organic electroluminescent device (WOLED).

Devices of the present disclosure may comprise one or more electrodes, some of which may be fully or partially transparent or translucent. In some embodiments, one or more electrodes comprise indium tin oxide (ITO) or other transparent conductive materials. In some embodiments, one or more electrodes may comprise flexible transparent and/or conductive polymers.

Methods

A method of the disclosure may then include the step of depositing various light emitting device or OLED layers over the thin polymer film to form an OLED body. Layers may include one or more electrodes, organic emissive layers, electron- or hole-blocking layers, electron- or hole-transport layers, buffer layers, or any other suitable layers known in the art. In some embodiments, one or more of the electrode layers may comprise a transparent flexible material. In some embodiments, both electrodes may comprise a flexible material and one electrode may comprise a transparent flexible material.

In one aspect, the present disclosure relates to a method of fabricating a light emitting layer, the method comprising the steps of providing a substrate, depositing a template composition on the substrate, whereby a template layer having a thickness of less than 10 nm is formed from the template layer composition, the template composition comprising at least one polyaromatic compound, and depositing a light emitting composition on the template layer, the light emitting composition comprising at least one light emitting compound, whereby a light emitting layer is formed from the light emitting composition, said light emitting layer having a first surface, a second surface, and a thickness therebetween, and whereby the transition dipole moment of the at least one luminescent compound is substantially perpendicular to the thickness of the light emitting layer.

In some embodiments, the template layer is a thin layer, having a thickness of less than 10 nm, less than 8 nm, less than 6 nm, less than 4 nm, or less than 2 nm. In various embodiments, the method further comprises the step of depositing a quantity of an exciton blocking material on the template layer to form an exciton blocking layer having a thickness of less than 10 nm, less than 8 nm, less than 6 nm, less than 4 nm, or less than 2 nm. The template composition may comprise any template compound described herein. The exciton blocking material may comprise any exciton blocking material known to those of skill in the art. In one embodiment, the exciton blocking material comprises an exciton blocking compound described herein. The light emitting composition may comprise any light emitting compound described herein. In one embodiment, the light emitting composition further comprises a host compound such as, but not limited to, the host compounds described herein. In one embodiment, the light emitting layer has a host composition of at least 50 vol. %, at least 60 vol. %, at least 70 vol. %, or at least 75 vol. %.

Any substrate known to those of skill in the art is contemplated herein. Suitable substrates include, but are not limited to, sapphire, fused silica glass, plastics, and the like. There is no particular limit to the composition or properties of the substrate.

In various embodiments, methods disclosed herein include increasing the fractional contribution of the net transition dipole moment (TDM) direction lying perpendicular to the thickness of the light emitting layer by at least 30%, at least 40%, at least 50%, at least 55%, at least 60%, or at least 65% relative to the same layer having no adjacent template layer or electron blocking layer. The increase may be a result of methods disclosed herein.

Emissive layers may be deposited via any suitable process, including but not limited to vacuum thermal evaporation, OVJP, etc. Films may be deposited at a rate of about 0.5 Å/s, 1.0 Å/s, 2.0 Å/s, 3.0 Å/s, 5.0 Å/s, or any other suitable rate.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIG. 1 and FIG. 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In general, the various layers of OLEDs and similar devices described herein may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Some OLED structures and similar devices may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the disclosure can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the disclosure can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present disclosure, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials, structures, and techniques described herein may have applications in devices other than the fabrication of OLEDs. For example, other optoelectronic devices such as organic solar cells and organic photodetectors may employ the materials and structures. More generally, organic devices, such as organic transistors, may employ the materials and structures.

An OLED fabricated using devices and techniques disclosed herein may have one or more characteristics selected from the group consisting of being flexible, being rollable, being foldable, being stretchable, and being curved, and may be transparent or semi-transparent. In some embodiments, the OLED further comprises a layer comprising carbon nanotubes.

In some embodiments, an OLED fabricated using devices and techniques disclosed herein further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments, the OLED comprises a light emitting compound. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

An OLED fabricated according to techniques and devices disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

HIL/HTL:

A hole injecting/transporting material to be used in the present disclosure is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as MoOx; a p-type semiconducting organic compound, such as 1,4,5,8,9,12-Hexaazatriphenylenehexacarbonitrile; a metal complex, and a cross-linkable compounds.

EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

Host:

The light emitting layer of the organic EL device of the present disclosure preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

As previously disclosed, OLEDs and other similar devices may be fabricated using a variety of techniques and devices. For example, in OVJP and similar techniques, one or more jets of material is directed at a substrate to form the various layers of the OLED.

EXPERIMENTAL EXAMPLES

The disclosure is further described in detail by reference to the following experimental examples. These examples are provided for purposes of illustration only, and are not intended to be limiting unless otherwise specified. Thus, the disclosure should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the system and method of the present disclosure. The following working examples therefore, specifically point out the exemplary embodiments of the present disclosure, and are not to be construed as limiting in any way the remainder of the disclosure.

Example 1: Controlling Molecular Orientation

The Pt complex orientation relative to the substrate plane during the film growth may be controlled using two different approaches. The first is to modify the molecular structure of heteroleptic bidentate Pt complexes to induce preferred horizontal alignment of the molecule via molecular anisotropy as illustrated in FIG. 3. Angle dependent p-polarized photoluminescence of a film comprising (dbx)Pt(dpm) (see FIG. 4A), doped in the organic host, CBP, revealed that the dopant TDMs are preferentially oriented perpendicular to the substrate. Studies of modified complexes of (dbx)Pt (dpm) showed that the aromatic ligands control molecular orientation. The second approach achieves the preferred orientation of the emitter by pre-depositing a thin (<2 nm) layer of a molecular template on the substrate that promotes the horizontal alignment of subsequently deposited emissive Pt complexes (FIG. 3).

The relationship between TDM orientation and film morphology are investigated via a combination of angle-dependent PL and x-ray diffraction. Correlations between film crystallinity and orientation controlled via structural templating are investigated by varying the concentration of a polycrystalline host in the emissive layer, revealing that a host concentration of >70 vol. % is required to achieve significant control over otherwise randomly distributed phosphor orientations. An increase of nearly 60% in horizontally aligned molecules is obtained using a molecular template compared with films deposited directly onto bare sapphire and fused silica substrates. Varying the details of molecular and substrate structures provides a systematic route for controlling molecular alignment during layer growth, and ultimately enhances the optical outcoupling of the emitting species, making these effective strategies for increasing OLED efficiency.

Methods

Nomenclatures—The abbreviations used for molecules are as follows. Acetylacetonate (acac), 4,4'-bis(N-carbazolyl)-1,1'-biphenyl (CBP), 9-(4-tert-butylphenyl)-3,6-bis (triphenylsilyl)-9H-carbazole (CzSi), dibenzo-(f,h)quinoxaline (dbx), 1,3-dimesitylpropane-1,3-dione (dmes), dipivaloylmethane (dpm), 1,4,5,8-naphthalenetetracarboxylic dianhydride (NTCDA), poly-methylmethacrylate (PMMA), 2-phenylpyridinate (ppy), 3,4,9,10-perylenetetracarboxylic dianhydride (PTCDA), (3-(trifluoromethyl))(5-(pyridyl)-pyrazolate 5-pyridyl-tetrazolate) Pt(II) (PtD), (2,3, 7,8,12,13,17,18-octaethyl)-21H,23H-porphyrinplatinum(II) (PtOEP), triindolotriazine (Tint).

Sample preparation—Thin films were deposited at 1.0 Å/s on 0.2 mm thick fused silica glass by vacuum thermal evaporation in a chamber with a base pressure of $1 \times 10^{-7}$ torr. The deposition rate and film thicknesses were controlled using a quartz crystal thickness monitor. Following deposition, devices were encapsulated using an epoxy seal around the edge of a cover glass in a $N_2$ environment. The samples for angle-dependent optical characterization consist of 1.5 nm PTCDA/1.5 nm NTCDA/30 nm emissive layer. PTCDA, NTCDA, PtOEP, and CBP were purchased from Luminscence Technology, Corp.

Optical measurements—Samples were excited with a He—Cd laser at a wavelength of 325 nm. Alignment of the transition dipole moment (TDM) was inferred from the angle-resolved photoluminescence of the phosphor-doped films. The emission from horizontally aligned TDMs is decomposed into transverse electric ($TE_{hor}$) and magnetic ($TM_{hor}$) modes, whereas the vertically aligned TDM emits into the $TM_{ver}$ mode. The ratio of horizontal-to-vertical transition dipole moments ($\theta_{hor}$) is:

$$\theta_{hor} = \frac{TE_{hor} + TM_{hor}}{TE_{hor} + TM_{hor} + TM_{ver}}$$

leading to $\theta_{hor}=0.67$ for random alignment (TEhor=TMhor=TMver), and $\theta_{hor}=1.0$ for TDMs oriented parallel to the substrate.

The $\theta_{hor}$ was obtained from the intensity ratio of $TM_{hor}$ to $TM_{ver}$ modes by removing $TE_{hor}$ using a polarization filter. This is compared to the simulated values calculated based on the dyadic Green's function in a birefringent medium. A least-squares algorithm was used to fit the measured photoluminescence data to the simulation. The 0.2 mm thick fused silica substrate was placed perpendicular to the plane of detection and the emission was outcoupled from the substrate using a 2 cm radius, half-cylindrical lens. A motorized stage was used to position the detector. The refractive indices and extinction coefficients of materials were measured using variable-angle spectroscopic ellipsometry.

X-ray diffraction measurements—X-ray measurements for thin film samples were performed in the Bragg-Brentano geometry using the Cu-Kα radiation source operated at 40 kV and 44 mA in a Rigaku Ultima IV X-Ray Diffractometer.

Single crystal structure determination—The plates of PtD, Tint and (dbx)Pt(dpm) were grown by 3-zone thermal gradient vacuum sublimation. The zone temperatures for PtD and Tint were 240/210/180° C. and 200/165/135° C., respectively. For PtD and Tint crystals of dimensions of 0.04× 0.01×0.01 mm and 0.01×0.01×0.01 mm were mounted on a Rigaku AFC10K Saturn 944+ CCD-based X-ray diffractometer equipped with a low temperature device and Micromax-007 HF Cu-target micro-focus rotating anode (λ=1.54187 Å) operated at 1.2 kW (40 kV, 30 mA). The X-ray intensities were measured at 85 K with the detector placed at a distance 42.00 mm from the crystal. Rigaku d*trek images were exported to CrysAlisPro for processing and corrected for absorption. A transparent, prism-like 0.11 mm×0.18 mm×0.35 mm crystal of (dbx)Pt(dpm) was used for the X-ray crystallographic analysis. The X-ray intensity data are obtained using a Bruker APEX DUO system equipped with a fine-focus tube (MoKα, λ=0.71073 Å) and a TRIUMPH curved-crystal monochromator. The frames were integrated with the SAINT V8.37A (Bruker AXS, 2013) algorithm. Data were corrected for absorption using the multi-scan method (SADABS). The structures for the three compounds were solved and refined with the Bruker SHELXTL (version 2016/6) software package.

DFT calculations of TDM and molecular orbitals. The ground (S0) and triplet state ($T_1$) geometries of PtD and PtOEP were optimized at the B3LYP/LACV3P level using the Jaguar (v. 9.4 release 15) program within the Material Science suite developed by Schrödinger, LLC. Time-dependent density functional theory (TD-DFT) with the zero-order regular approximation (ZORA) approach as implemented in Jaguar was used to compute the TDMs for phosphorescent ($T_1$-$S_0$) emission. The ZORA Hamiltonian incorporates spin-orbit coupling (SOC) effects that are associated with triplet ($T_1$-$S_0$) emission. The SOC-TD-DFT calculations were performed on the $T_1$ optimized structures using the B3LYP functional and a mixed basis set in which the DYALL-2ZCVP-ZORA-J-Pt-Gen set was used for the Pt, while the 6-31G set was used for the remainder of the atoms.

To simulate the $T_1$ state relaxation of the PtD excimers/dimers (3.41-dimer and 3.35-dimer) within the crystalline matrix, geometry optimization was performed on each dimer constrained by a molecular shell consisting of all its immediate neighbors (based on the crystal structure packing data) modeled as a rigid classical force field. This was done using a 2-layer hybrid QM/MM with a n-layered integrated molecular orbital and molecular mechanics (NIOM) scheme in which the central dimer was treated at the B3LYP/LanL2Dz level while the UFF molecular mechanics force field was used to model the surrounding molecular shell which was kept frozen during the optimization. All NIOM calculations were performed using the Gaussian 09 program. Subsequently, SOC-TDDFT calculations were performed on the $T_1$ (NIOM:B3LYP/LanL2Dz:UFF) optimized structure of both dimers to obtain the TDVs associated with dimeric/excimeric emission. The surrounding molecular shell was ignored for the SOC-TDDFT calculations.

Synthesis of Pt complexes—The synthesis and photophysical characterization of (dbx)Pt(dpm) and (ppy)Pt(dpm) have been reported previously. The (dbx)Pt(ppy) has similar photophysical property as their dpm analogue (dbx)Pt(dpm). The synthesis of complex (dbx)Pt(dmes) was done in a similar fashion as all the other cyclometalated Pt complexes and the (dbx)Pt system is illustrated as the archetypal in FIG. 4B. The top scheme presents a conventional Nonoyama synthesis, while the bottom synthesis is the modified synthesis employed herein.

The synthesis of dbx ligand was done according to the literature reported procedure. (see S. Culham, et al., Inorg. Chem. 2013, 52, 10992, incorporated herein by reference). The ancillary ligand 1,3-dimesityl-propane-1,3-dione (dmes) was synthesized via a stable intermediate (its aluminum complex) from malonyl dichloride and mesitylene by Friedel-Craft reaction using anhydrous aluminum chloride as the catalyst. The resultant aluminum intermediate complex was isolated, which then decomposed upon reflux in concentrate hydrochloric acid to give the dmes ligand as reported. The cyclometalating ligand (ppy) for (dpm)Pt(ppy) is commercially available.

Figure 5:
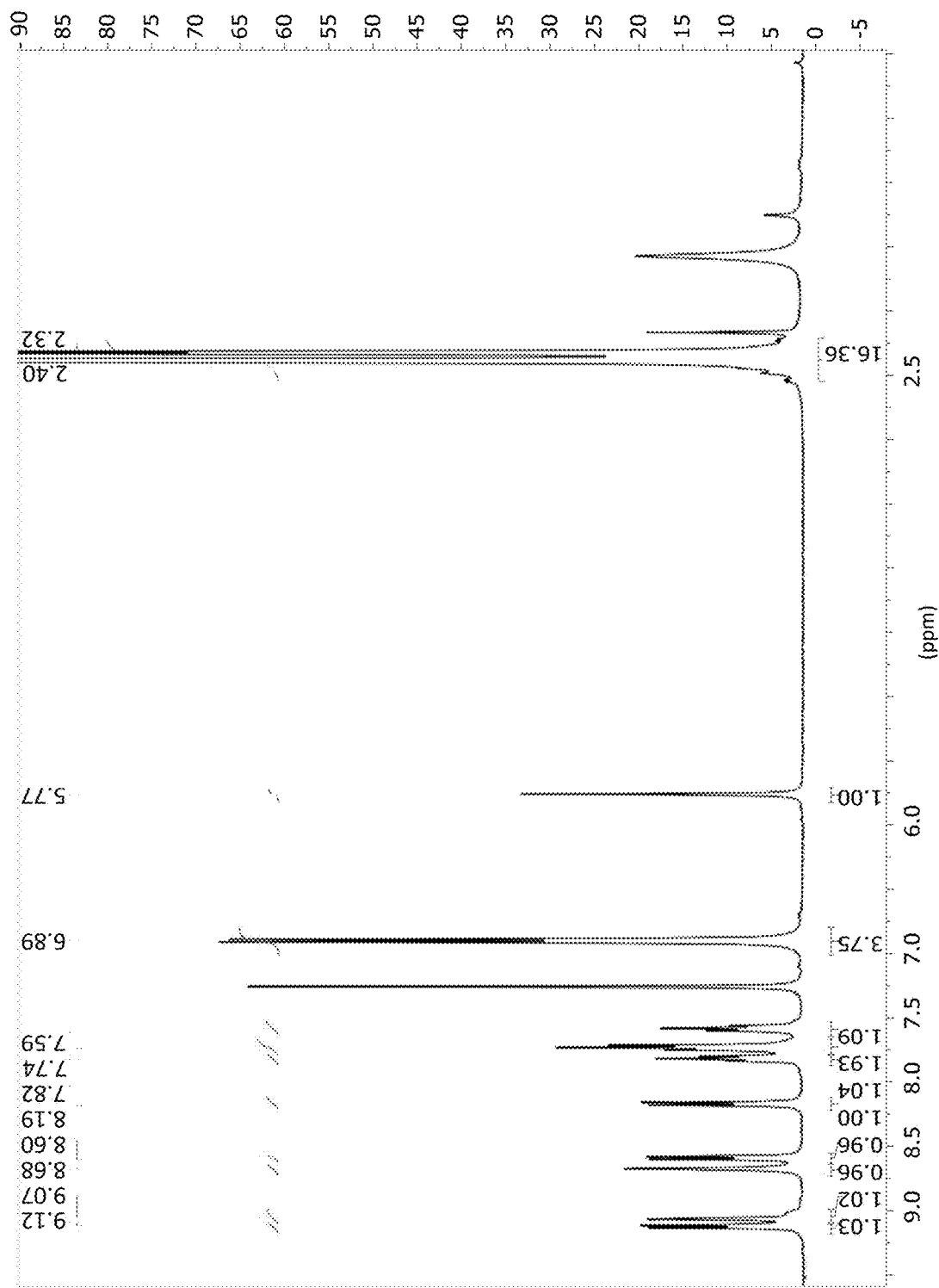
FIG. 5 is an 1H NMR spectrum of (dbx)Pt(dmes) in $CDCl_3$.

(dbx)Pt(dmes)—A 3-neck flask was charged with dbx (0.18 mL, 1.3 mmol), potassium tetrachloroplatinate(II) (230 mg, 0.55 mmol) and 60 mL of 3:1 mixture of 2-ethoxyethanol:water. The mixture was degassed and heated to 70° C. for 16 hrs. The reaction was cooled to ambient temperature and the brown solid was precipitated into water and isolated by vacuum filtration. This solid was then placed in a new 3-neck flask charged with potassium carbonate (180 mg, 1.3 mmol), ancillary ligand 1,3-dimesityl-propane-1,3-dione and charged with 30 mL of degassed 1,2-dichloroethane. The condenser was attached and the mixture was heated to 75° C. for 16 hrs. The reaction was then cooled to ambient temperature and the solvent was removed under vacuum. The resultant solid was subjected to column chromatography on silica gel 1:1 $CH_2Cl_2$:hexanes gradient to give an orange solid 145 mg (51%) $^1$H NMR (500 MHz, CDCl$_3$, δ) 9.12 (d, J=7.87 Hz, 1H), 9.07 (d, J=2.63 Hz, 1H), 8.68 (d, J=2.63 Hz, 1H), 8.60 (d, J=8.06 Hz 1H), 8.19 (d, J=7.97 Hz, 1H), 7.82 (t, J=7.31 Hz, 1H), 7.74 (t, J=6.80 Hz, 2H), 7.59 (t, J=7.57 Hz, 1H), 6.89 (d, J=8.14 Hz, 4H), 5.77 (s, 1H), 2.40 (d, J=6.55 Hz, 12H), 2.32 (d, J=6.08 Hz, 6H). The $^1$H NMR spectrum is provided in FIG. 5.

PtD—Synthesis of [3-(trifluoromethyl))(5-(pyridyl)-pyrazolato][5-pyridyl-tetrazolato]platinum(II) (PtD) entailed the addition of 2-(5-(trifluoromethyl)-1H-pyrazol-3-yl)pyridine (ppf$_3$H, 1.2 mmol, 0.26 g) and K$_2$[PtCl$_4$] (1.2 mmol, 0.50 g) to a 30-mL solution of 3.0 M HCl in water followed by heating the resulting reaction mixture to 80° C. for 12 h. The yellow precipitate, identified as Pt(ppf$_3$H)Cl$_2$, was extracted by gravity filtration, and subsequently washed with water and acetone followed by drying under vacuum. Pt(ppf$_3$H)Cl$_2$ (1.2 mmol, 0.57 g) and 2-(1H-tetrazol-5-yl)pyridine (ttzpH, 1.22 mmol, 0.18 g) were added to a solution containing 15 mL of pyridine and 5 mL of deionized water then the resulting mixture was heated at 80° C. for 48 h. The solid yellow precipitate was then collected, washed with water, acetone, diethyl ether, and dried under vacuum at 100° C. The product was purified under vacuum sublimation at (300° C., 300 mTorr), yielding PtD as a solid yellow powder; reaction yield: 55%. Anal. Calcd for PtD:C, 32.56; H, 1.64; F, 10.30; N, 20.25. Found: C, 32.16; H, 1.38; F, 9.70; N, 19.54.

Figure 4A:
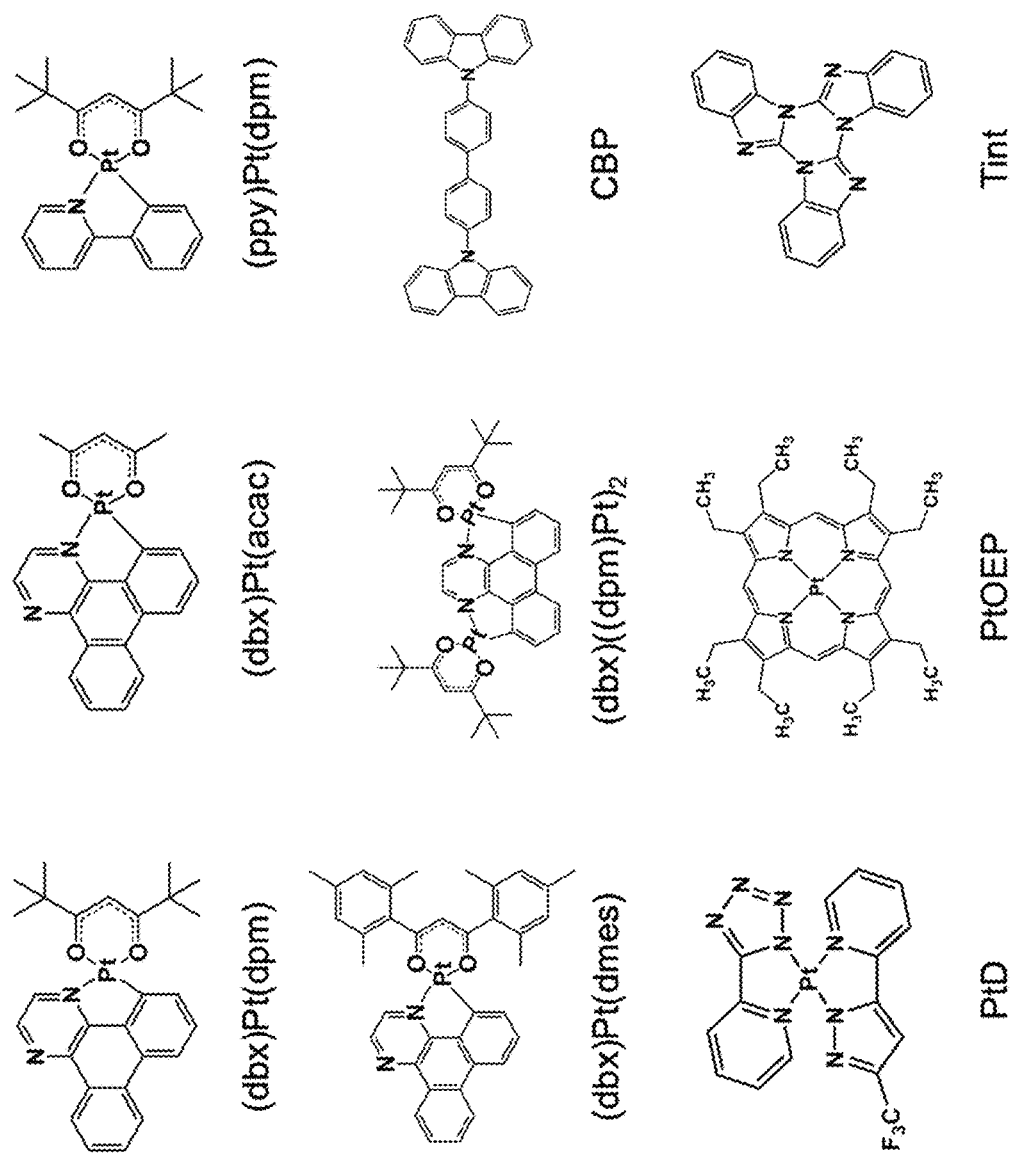
FIG. 4A shows the molecular structural formulae of exemplary Pt complexes and small molecules.
Figure 4B:
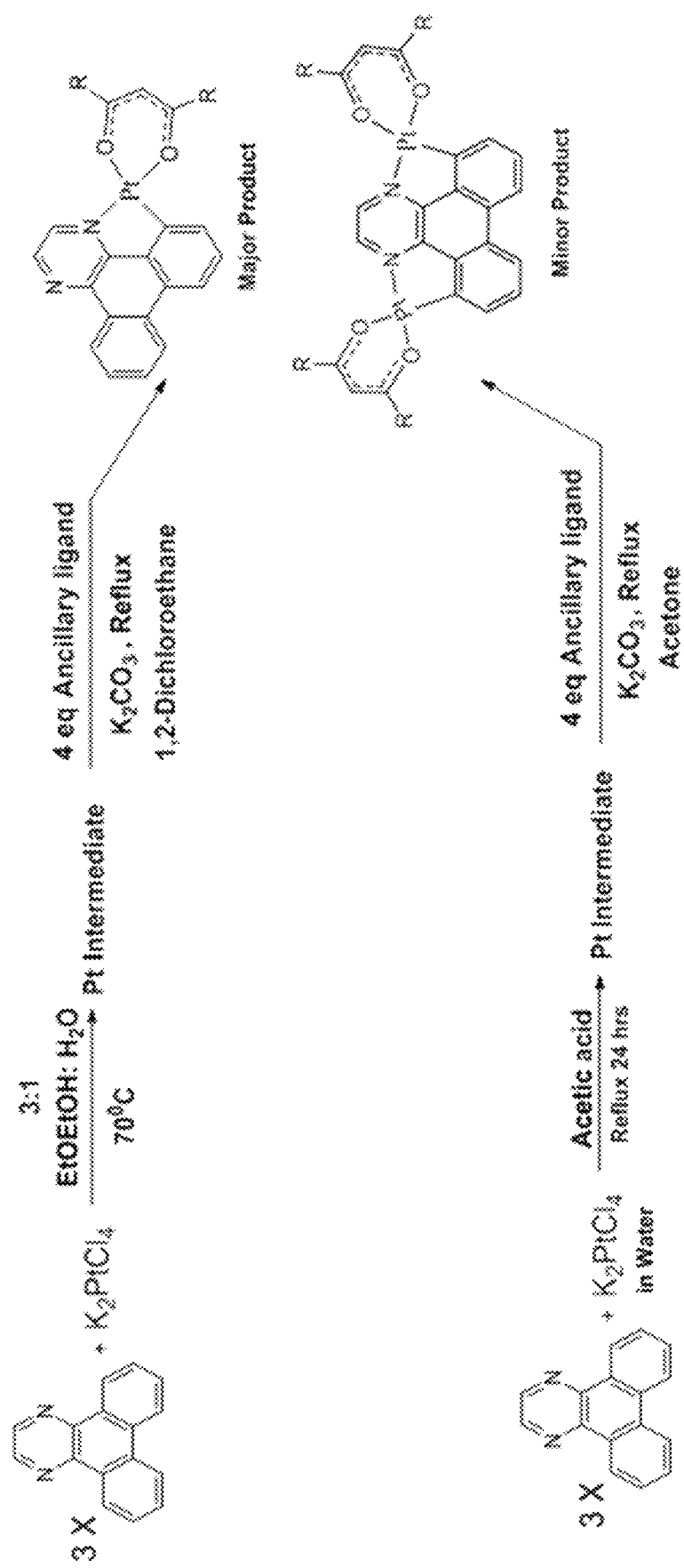
FIG. 4B shows synthesis processes for exemplary Pt complexes.

A series of bidentate Pt (II) complexes with chromophoric (C^N) and ancillary (L^X) ligands is shown in FIG. 4A. Density functional theory (DFT) is used to determine the TDM orientation relative to the molecular frame in these complexes. The TDM of the complex lies in the (C^N)Pt plane with an angle δ between the TDM and the Pt—N bond, which ranges between 20° and 45° for the (C^N)Pt(L^X) complexes. The reference dopant molecule, (dbx)Pt(dpm), comprises a chromophoric dibenzo-(f,h)-quinoxoline (dbx) aromatic ligand and an ancillary dipivolylmethane (dpm) aliphatic ligand. The complexes are doped into CBP at 10 vol. %, and angle-dependent PL measurements of the films are analyzed to obtain the TDM orientation relative to the substrate of $\theta_{hor}$=0.54±0.01, FIG. 6A. Here, $\theta_{hor}$ corresponds to fractional contribution of the net TDM direction lying in the horizontal plane parallel to the substrate, thus the faction in the vertical direction is 0.46. An isotropic thin film gives $\theta_{hor}$=0.67. The TDM vector in the inset is the result of a DFT calculation, and shows that δ=36°. Shifting to a smaller ancillary ligand in (dbx)Pt(acac) shows similar alignment ($\theta_{hor}$=0.53±0.01) to (dbx)Pt(dpm) when doped at 1 vol. % and 10 vol. % in CBP, see FIG. 6B and FIG. 6C.

FIG. 7 shows the angle-dependent PL of several different (C^N)Pt(L^X) complexes doped at 10% in CBP. The film comprising (ppy)Pt(dpm) in FIG. 7A demonstrates an increased net horizontal alignment of the TDM compared to (dbx)Pt(dpm) ($\theta_{hor}$=0.62±0.01 vs. 0.54±0.01). Introduction of an aromatic ancillary ligand comprising two mesityl groups attached to the acac ligand producing (dmes)Pt(dbx), increases the horizontal component even further to $\theta_{hor}$=0.73±0.01. Attaching an additional Pt-dpm on the opposite side of the dbx ligand in (dbx)(Pt(dpm))2 shown in FIG. 7C, results in a horizontal component of $\theta_{hor}$=0.76±0.01.

Figure 8:
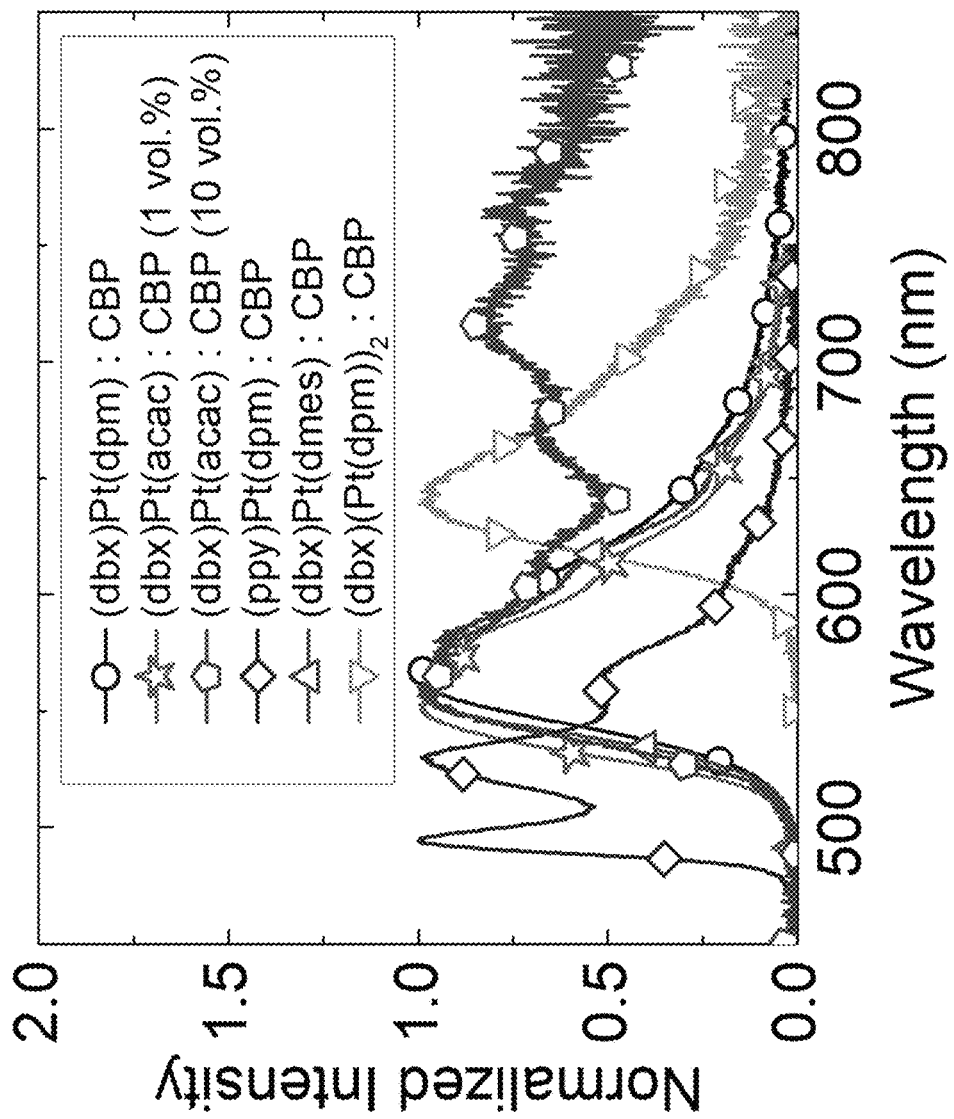
FIG. 8 is a plot of the photoluminescence spectra of films of Pt complexes doped into CBP. Measured photoluminescence of films of (dbx)Pt(dpm), (dbx)Pt(acac), (ppy)Pt(dpm), (dbx)Pt(dmes) and (dbx)(Pt(dpm))2 doped into CBP at 10 vol. %. The (dbx)Pt(acac) was also doped into CBP at 1 vol. %.

The emission spectra of Pt-complex doped CBP films are shown in FIG. 8. Contrary to changes in the ancillary (L^X) ligand, changes in the chromophoric (C^N) ligand lead to marked shifts in the emission spectra. In contrary, promoting molecular alignment via substrate structural templating provides a potential route to control the orientation of the square planar Pt-complexes within a blended film without changing the molecular structure and hence its emission spectrum. Two phosphorescent Pt complexes molecules were used explore the templating approach; one comprising a neat PtD film, and the other consisting of PtOEP doped at 10 vol. % into Tint (see FIG. 4A).

Figure 9:
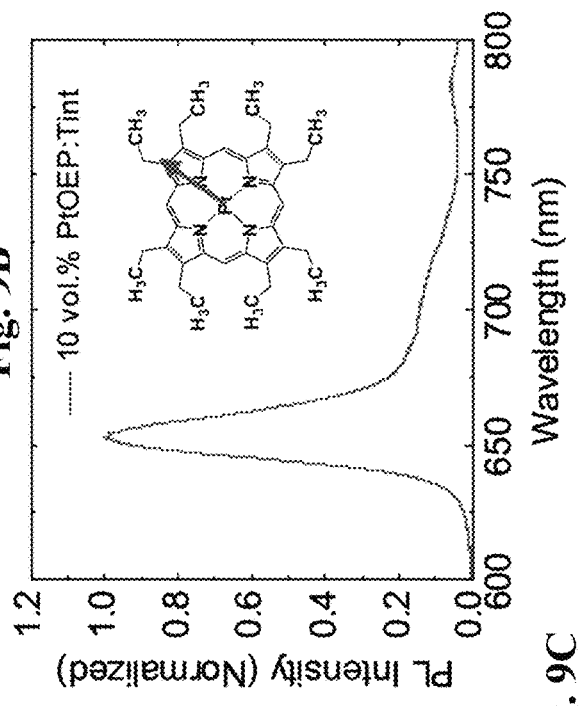
FIG. 9, comprising
Figure 10:
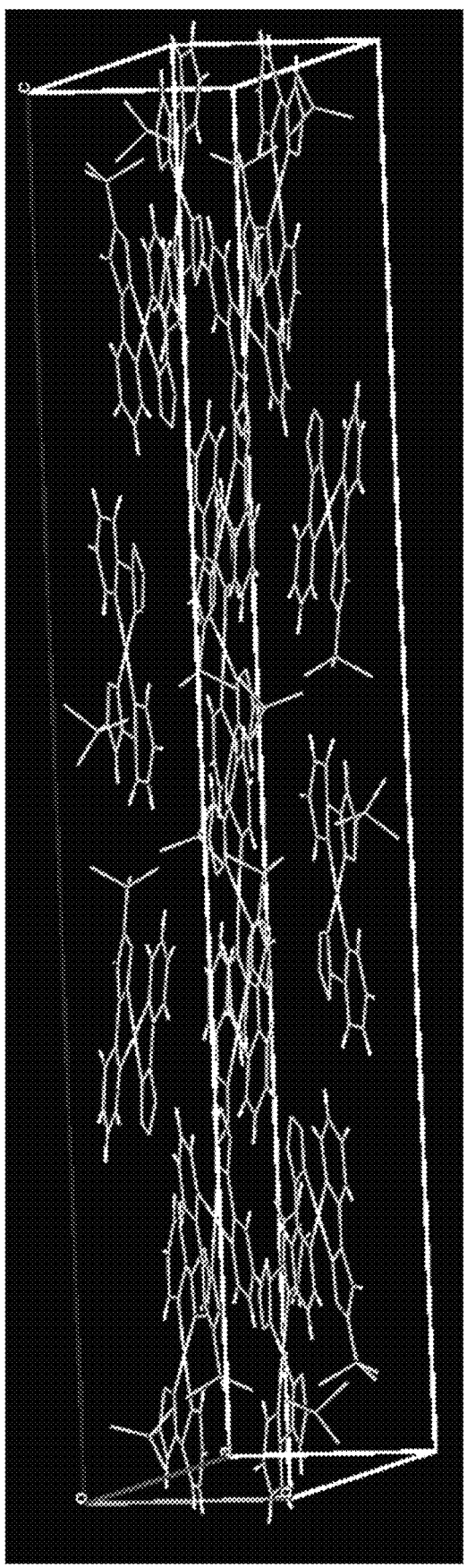
FIG. 10 provides the measured single crystal structure and cell parameters of PtD based on single crystal XRD.
Figure 11:
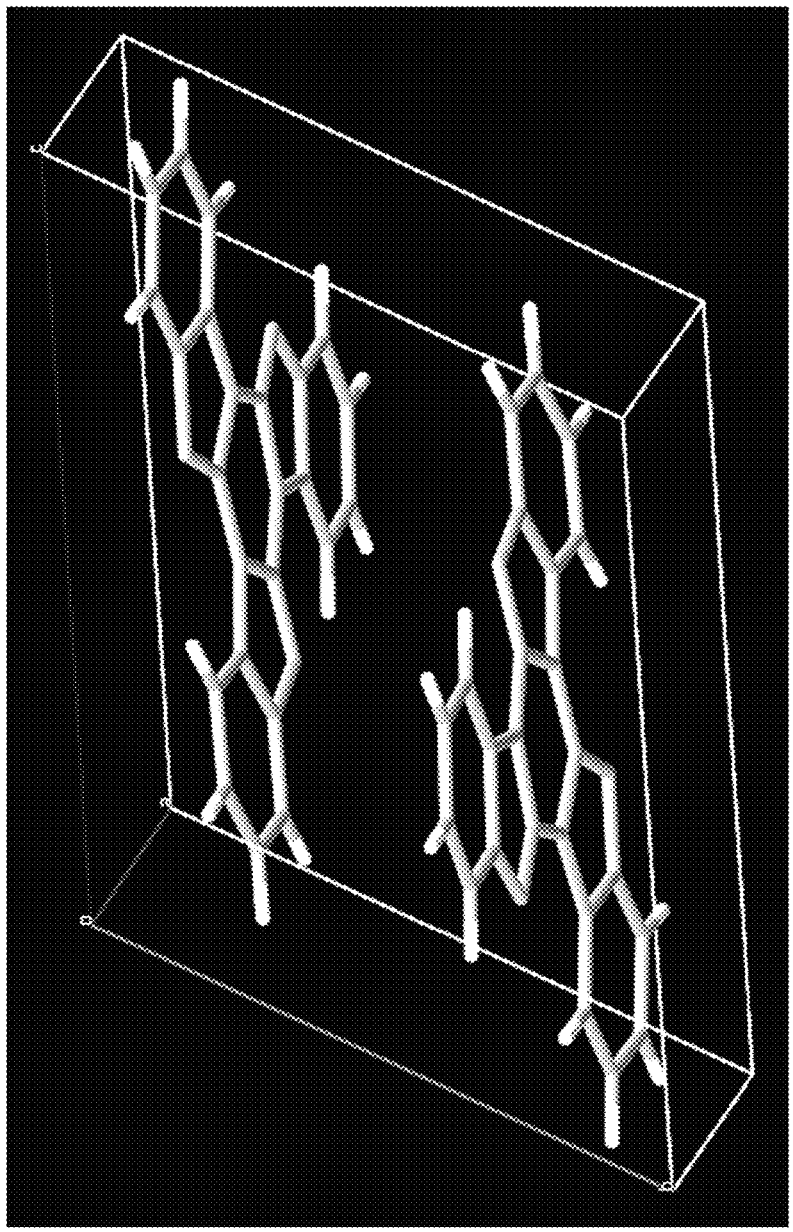
FIG. 11 provides the measured single crystal structure and cell parameters of Tint based on single crystal XRD.

FIG. 9 shows the photophysical and structural characteristics of the neat PtD, Tint, PtOEP, and PtOEP-doped Tint films on sapphire substrates. The broad PL peak at a wavelength of $\lambda_{di}$=572 nm of neat PtD in FIG. 9A is due to dimer emission. This feature is less pronounced in PtD diluted to 1 vol. % in a PMMA host due to monomer triplet emission at $\lambda_m$=450-480 nm. The PtOEP-doped Tint shows dominant monomer emission at $\lambda_m$=653 nm in FIG. 9B, with the triplet, $T_1$, TDM lying within the PtOEP molecular plane (see inset), and weak dimer emission at λdi=783 nm. Monomer emission is dominant since PtOEP molecules are diluted in the host matrix. Furthermore, steric hindrance between the PtOEP ethyl groups reduces coupling between the dopants. X-ray diffraction patterns of PtD and Tint films deposited onto a sapphire substrate in FIG. 9C exhibit intense (200), (001) and (220) diffraction peaks of PtD, PtOEP and Tint, respectively (see FIG. 10 and FIG. 11 for crystal structures and diffraction patterns of PtD and Tint).

Film morphology was also controlled via structural templating using a self-organized, 1.5 nm (~5 monolayer) thick PTCDA layer. The PTCDA grows in the flat-lying α-phase (102) (i.e. molecular planes of PTCDA lie parallel to the substrate), thus increasing the possibility of π-stacking with the subsequently deposited molecules. For the angle-dependent PL measurement in FIG. 12 a neat layer of NTCDA of the same thickness (1.5 nm) was deposited on the PTCDA prior to deposition of the emissive layer. The NTCDA/PTCDA bilayer transfers its structure to the subsequently deposited molecules (FIG. 13) while also blocking excitons formed in the emissive layer from quenching at PTCDA with its relatively low singlet exciton energy (1.95 eV).

Figure 12:
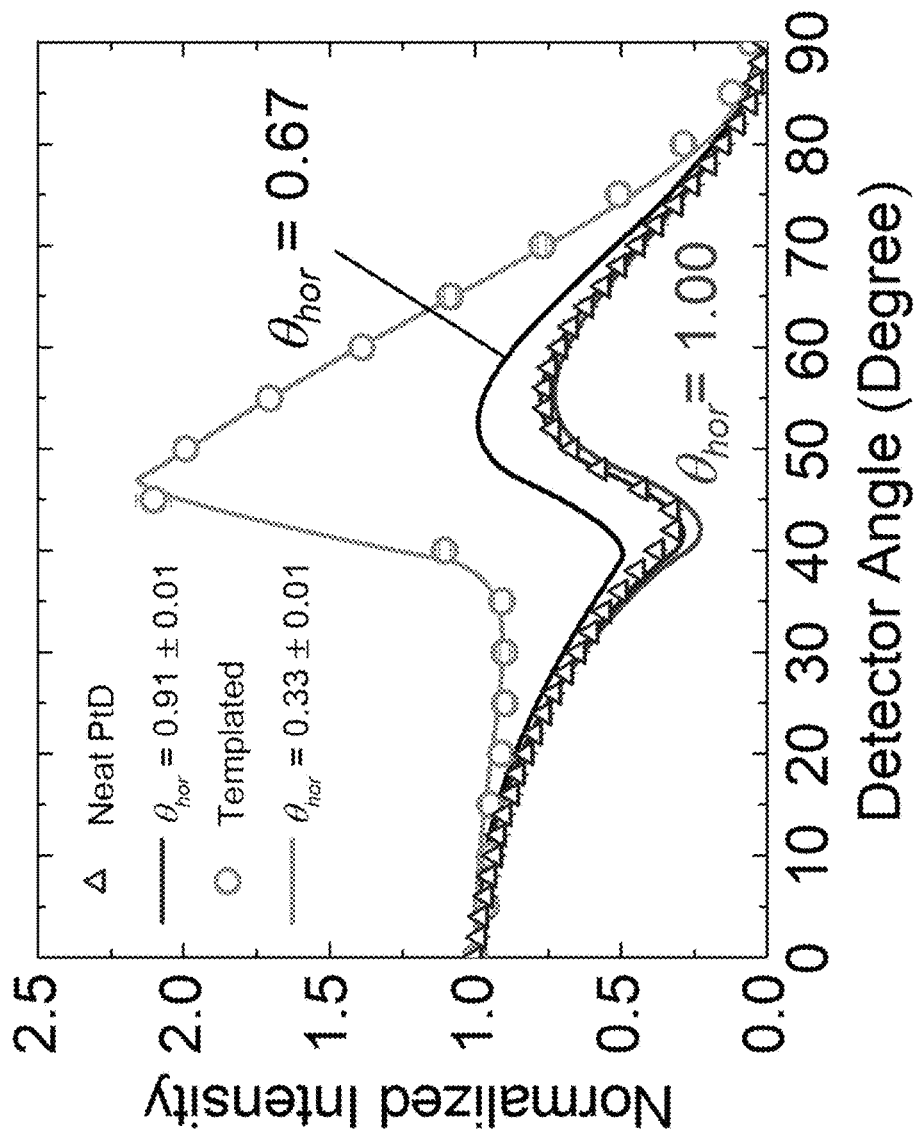
FIG. 12 is a plot of the angle-dependent p-polarized photoluminescence of a neat PtD film grown on sapphire substrate and on a pre-deposited template layer.
Figure 13:
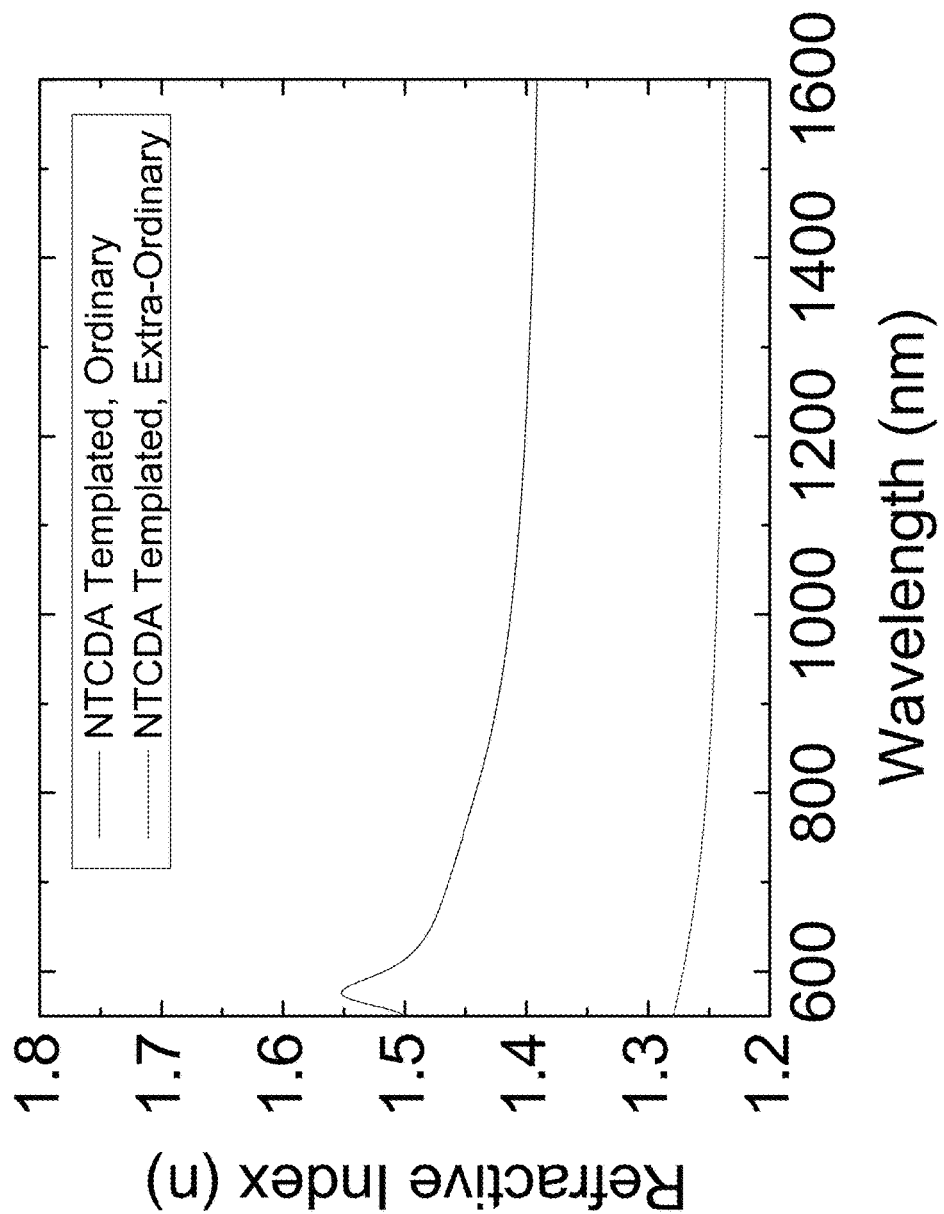
FIG. 13 is a plot of the Variable Angle Spectroscopic Ellipsometry measurement of templated NTCDA film. The ordinary refractive index is larger than the extraordinary refractive index from the NTCDA film, showing the horizontal alignment of NTCDA molecules deposited on the PTCDA template. This enables the monolayer thick NTCDA layer (1.5 nm) to transfer the templated structure to the subsequently deposited molecules.
Figure 15:
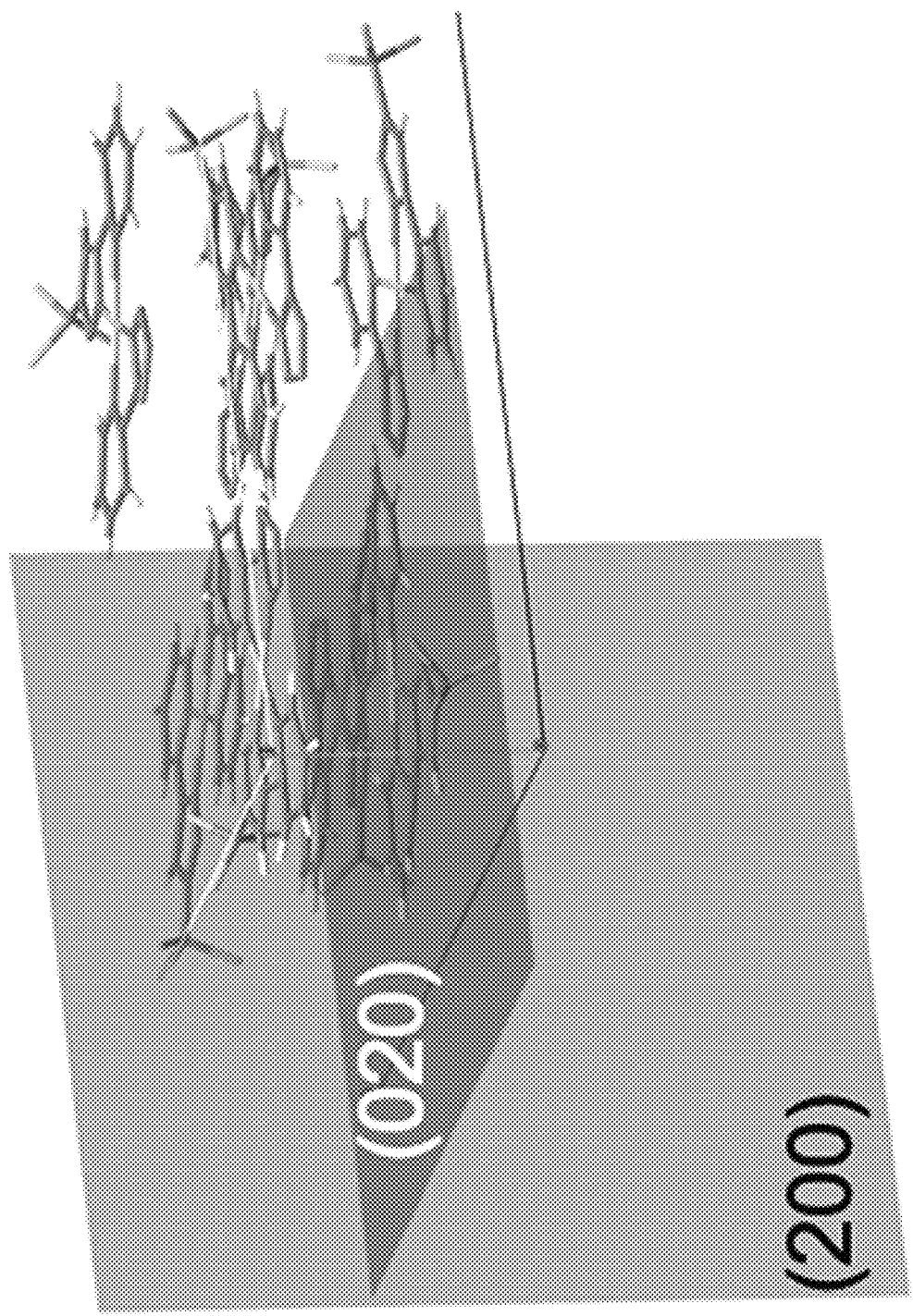
FIG. 15 depicts the PtD crystal structure showing the (200) (green) and (020) (red) planes.
Figure 16:
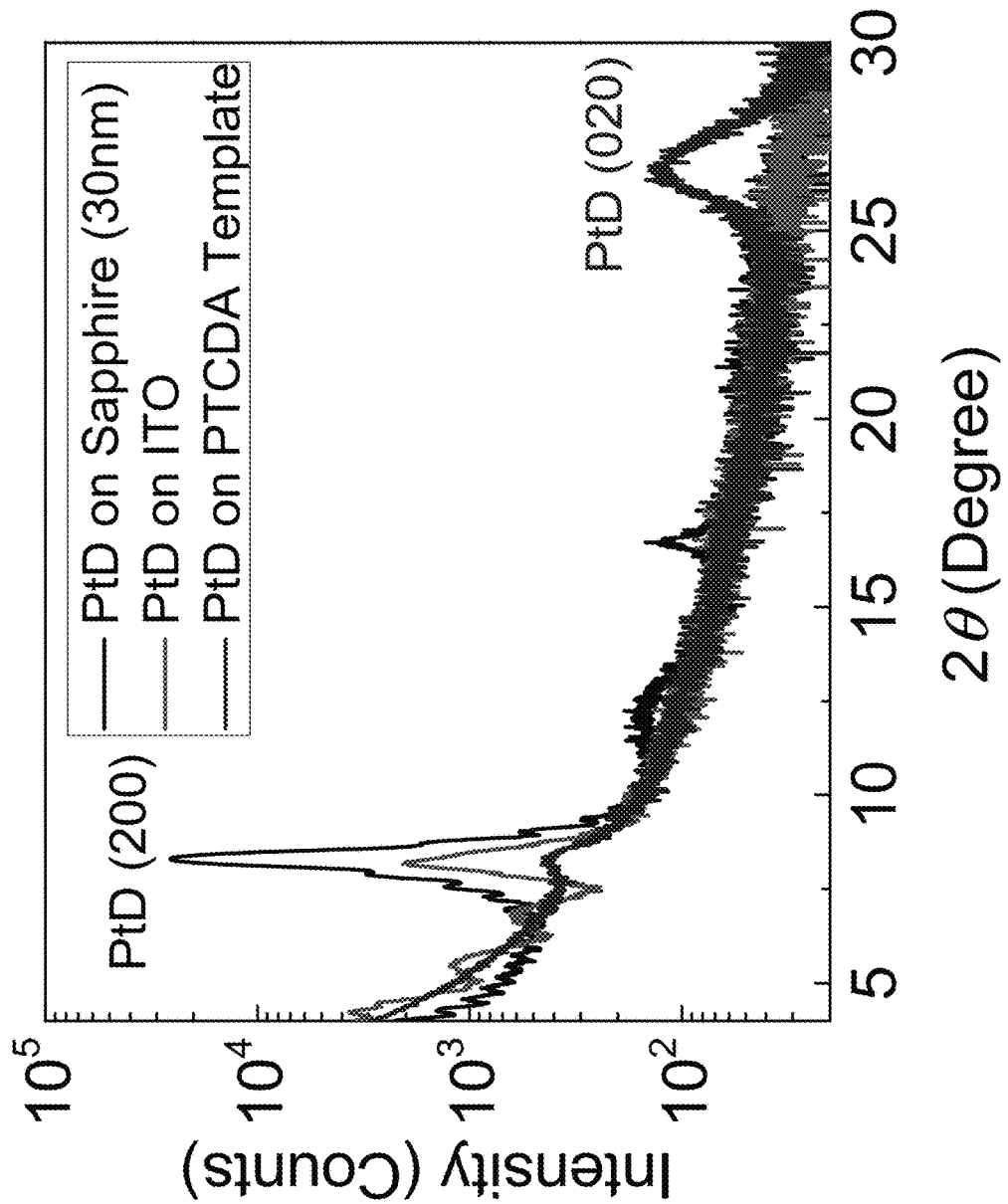
FIG. 16 is a plot of the Bragg-Brentano x-ray diffraction pattern of the PtD film on different substrates. The 30 nm thick film of PtD deposited on sapphire substrate exhibits intense (200) diffraction, which is also observed in a film deposited on a 15 nm thick ITO surface. However, the film deposited on a 1.5 nm thick PTCDA template layer shows significantly reduced (200) peak, whereas (020) peak appears at 2θ=26.6° due to the varied morphology of PtD molecules.

The PtD film deposited on the NTCDA/PTCDA template shows a decreased horizontal orientation ($\theta_{hor}$=0.33±0.01) of the PtD dimer TDM compared to deposition on a bare fused silica substrate with $\theta_{hor}$=0.91±0.01 (see FIG. 12). To determine the relationship between TDM orientation and film morphology, x-ray pole figures of the (200) and (020) planes are provided in FIG. 14A and FIG. 14B. The configuration of each plane within the PtD crystal is shown in FIG. 15. The film deposited directly on the sapphire substrate in FIG. 14A shows the (200) diffraction peak (2θ=8.2-8.5°) at a radial angle of ψ=0°, suggesting that (200) plane lies parallel to the substrate. The (200) plane lies perpendicular to the PtD molecular plane, hence the (200) diffraction peak at ψ=0° indicates the molecular plane is vertically aligned to the substrate. The (020) plane (2θ=26.6°) parallel to the molecular plane shows a diffraction peak at ψ=0° for the film on the template layer, indicating that the PtD molecules lie with their molecular planes parallel to the templating molecules. The x-ray diffraction patterns of the 30 nm thick film of PtD deposited on sapphire, ITO and PTCDA are shown in FIG. 16.

Figure 17:
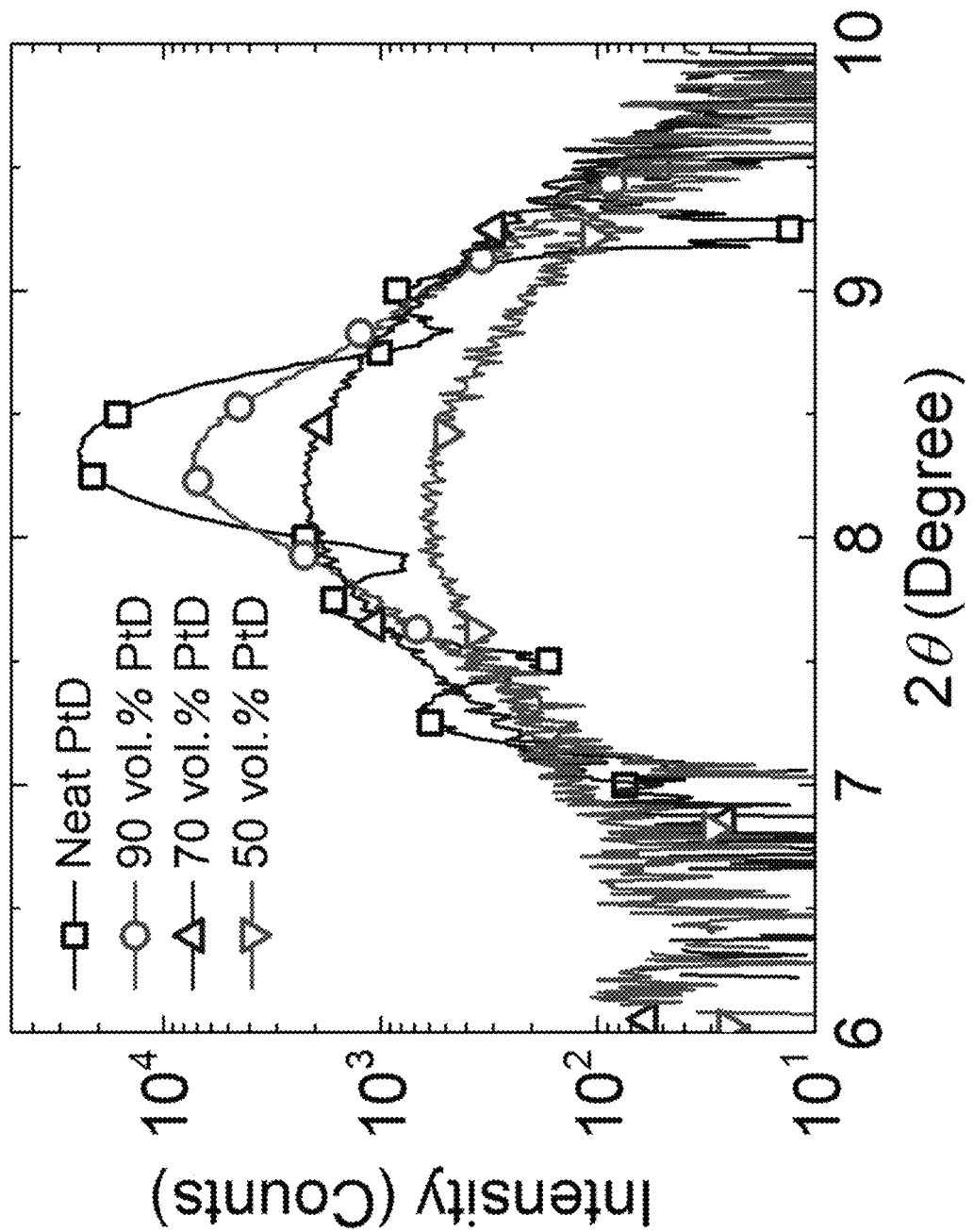
FIG. 17 is a plot of the XRD patterns of PtD doped CzSi films as a function of PtD concentration. Background counts of the 50 vol. % PtD:CzSi film removed for clarity.
Figure 18:
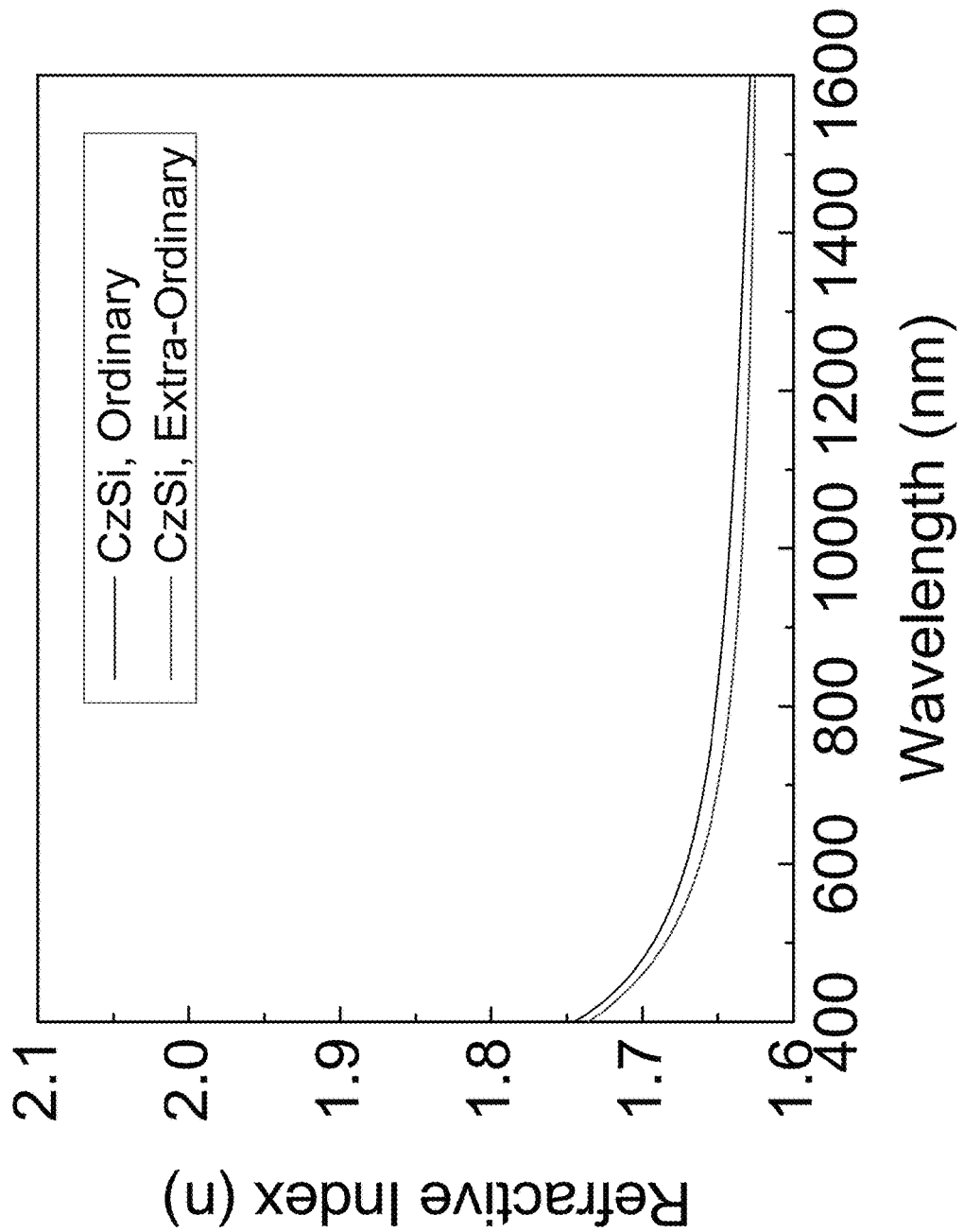
FIG. 18 is a plot of the Variable Angle Spectroscopic Ellipsometry measurement of neat CzSi film. The CzSi ordinary and extraordinary refractive indices are nearly identical at all wavelengths, indicating the isotropic alignment of the transition dipole moment. The random orientation of this molecule stems from its bulky molecular structure.
Figure 19:
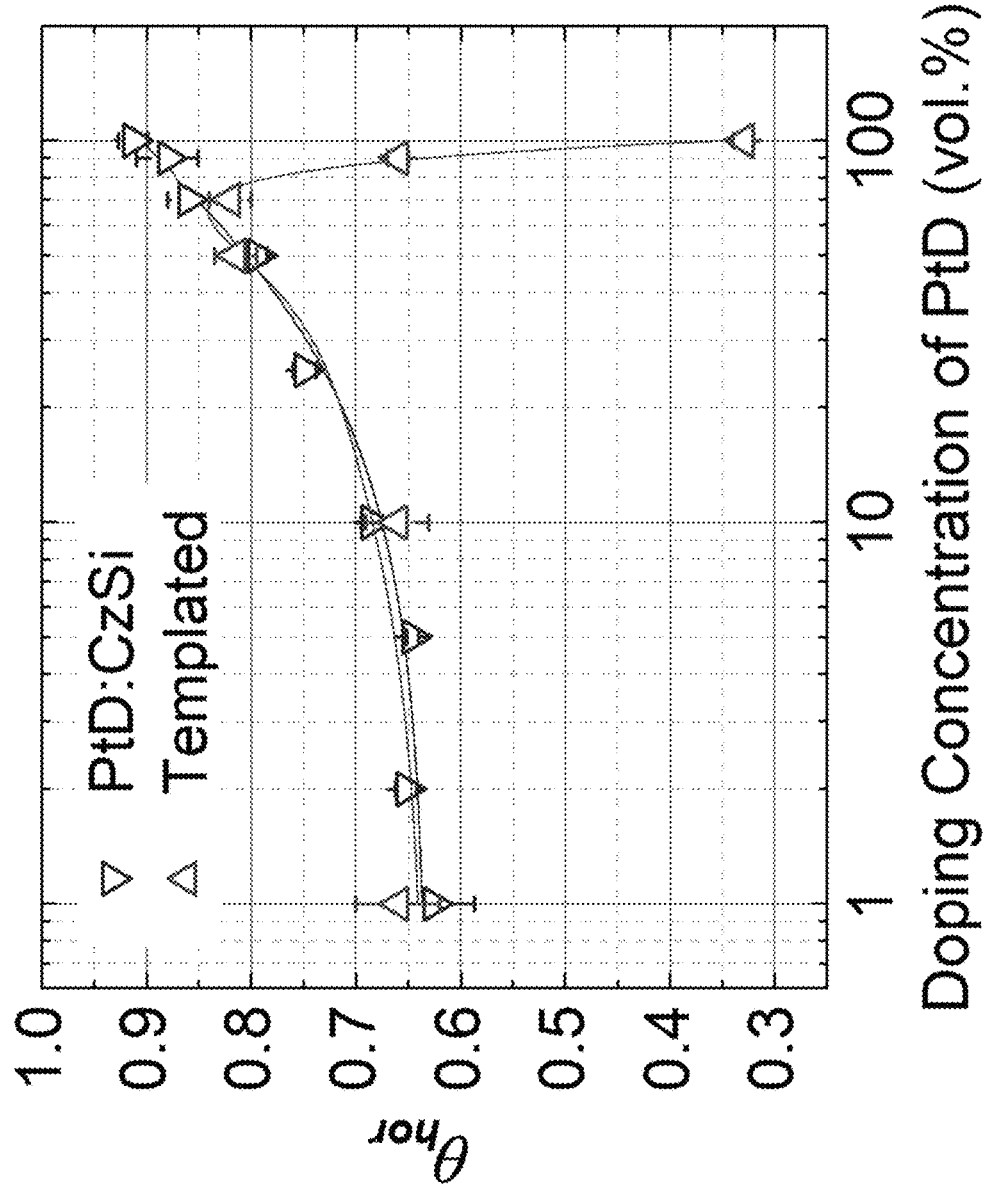
FIG. 19 is a plot of the measured $\theta_{hor}$ for the dimer emission transition dipole moment of PtD versus concentration in CzSi. The blue and red curves show hor of films deposited on a bare substrate and on a pre-deposited PTCDA template, respectively.

The volume fraction of crystal domains within a CzSi film blended with PtD was measured as a function of doping concentration, with results shown in FIG. 17. Vacuum deposited films of neat CzSi result in isotropic orientation (FIG. 18). A decreasing intensity and increasing full-width at half-maximum of the XRD peak with decreasing PtD concentration indicates decreased film crystallinity and PtD domain size, as shown in Table 1. The TDM alignment measured by angle-dependent PL for each PtD:CzSi blend is shown in FIG. 19. The alignment is random ($\theta_{hor}$~66%) at concentrations <10 vol. %, while for the neat PtD film, an ordered morphology with $\theta_{hor}$>90% is achieved. The TDM orientation was also measured for PtD:CzSi blends with a range of concentrations deposited on the NTCDA/PTCDA template, showing the controlled morphology of the film at PtD concentration of >70 vol. %.

TABLE 1

Thin film morphology of CzSi films doped with PtD

| Doping Concentration [vol. %] | Peak 2θ [°][a] | FWHM [°][b] | d-spacing[c] [Å] | Crystallite Size[d] [nm] | $\theta_{hor}$ Non-Templated | $\theta_{hor}$ Templated |
|---|---|---|---|---|---|---|
| 100 | 8.35 | 0.40 ± 0.01 | 10.6 | 20.8 ± 0.5 | 0.91 ± 0.01 | 0.33 ± 0.01 |
| 90 | 8.30 | 0.55 ± 0.01 | 10.6 | 15.1 ± 0.3 | 0.88 ± 0.03 | 0.66 ± 0.01 |
| 70 | 8.23 | 1.04 ± 0.02 | 10.7 | 8.0 ± 0.2 | 0.86 ± 0.02 | 0.82 ± 0.02 |
| 50 | 8.12 | 1.28 ± 0.01 | 10.9 | 6.5 ± 0.1 | 0.79 ± 0.01 | 0.82 ± 0.02 |

[a]Random error = ±0.03°
[b]Calculation based on Gaussian Fitting model
[c]Random error = ±0.1 Å
[d]Calculated utilizing Debye-Scherrer equation, t = Kλ/βcosθ, where K is a crystallite shape dependent constant (0.94), λ = 1.54 Å is the wavelength of Cu-kα x-ray source, β is the full width at half maximum of the peak, and θ is the Bragg angle.

Figure 20:
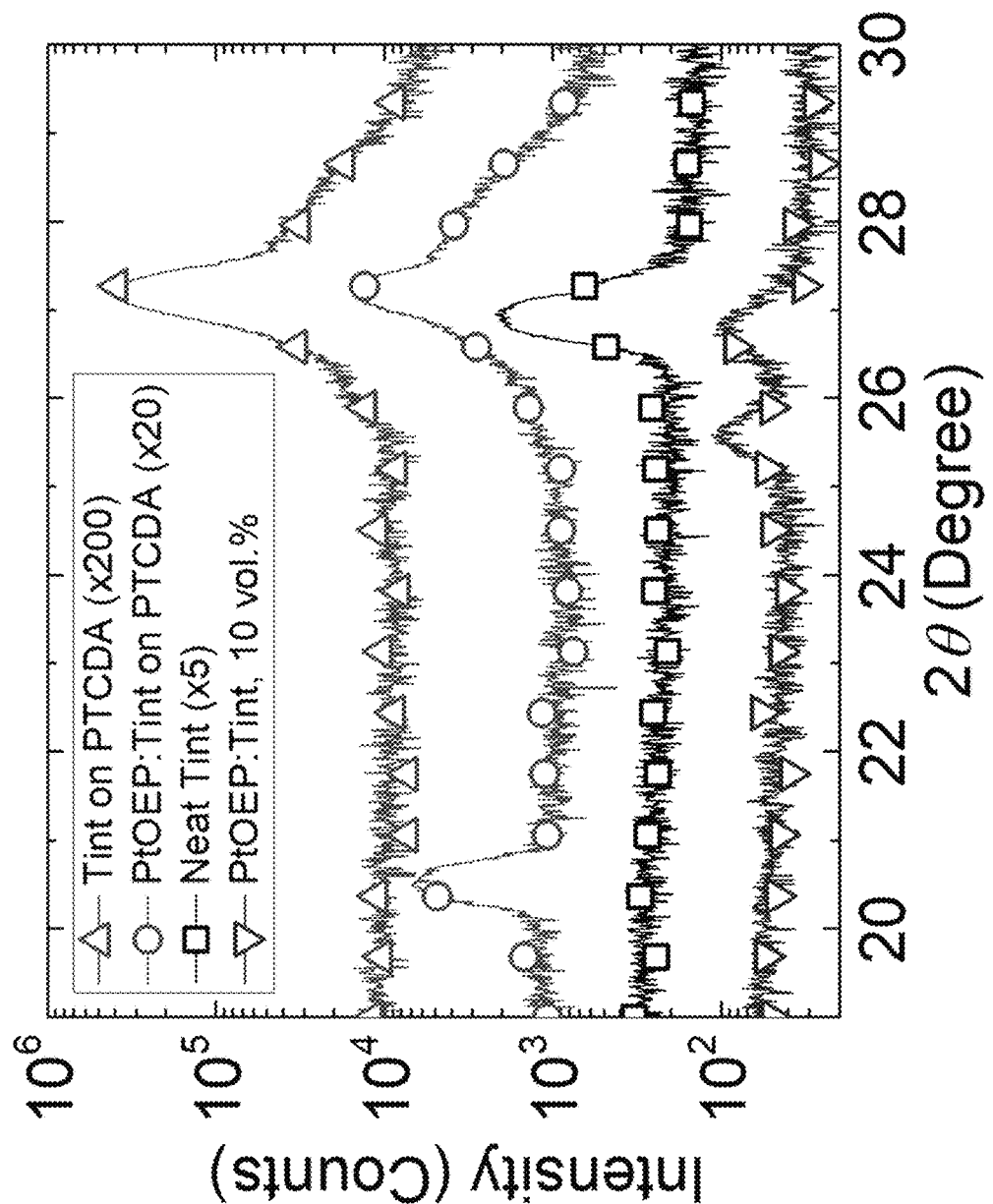
FIG. 20 is a plot of the XRD patterns of the films with neat and blended Tint with PtOEP deposited on the template layer and on a bare sapphire substrate. Data are offset for clarity.
Figure 22:
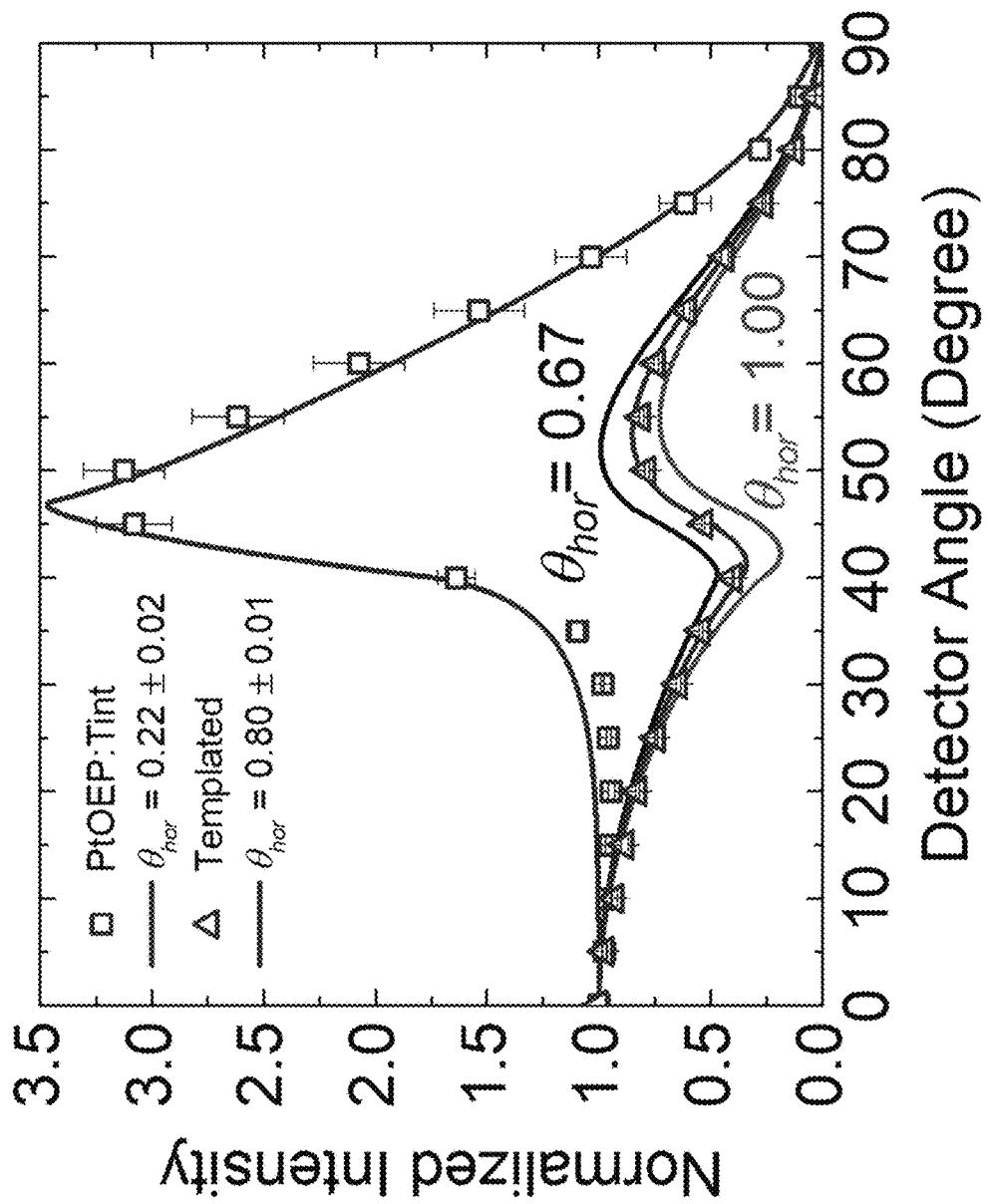
FIG. 22 is a plot of the angle dependent p-polarized photoluminescence of PtOEP:Tint films.

The orientation of the blended film comprising PtOEP doped in Tint at 10 vol. % deposited on the template and on a bare sapphire substrate are compared by x-ray diffraction in FIG. 20. A monolayer of PTCDA is used as a template layer for x-ray diffraction. The neat Tint film deposited on the template compared to the bare substrate shows a peak shift from 2θ=27.0° to 2θ=27.5°, corresponding to a morphological change from ($\bar{2}$20) to (120) diffraction plane. This peak shift of Tint molecules is also observed in the PtOEP:Tint blends. In the blended films, PtOEP peaks also shift when deposited on the template, from 2θ=25.7° to 2θ=20.5°, corresponding to a change from (212) to (1$\bar{1}\bar{1}$)

plane. The crystal structures and diffraction planes of PtOEP and Tint are shown in FIG. 21A and FIG. 21B. The TDM orientation of the blended film deposited on the NTCDA/PTCDA template showed an increased $\theta_{hor}$ compared to a bare substrate, from 0.22±0.02 to 0.80±0.01, as shown in FIG. 22.

The orientation of heteroleptic bidentate Pt complexes demonstrates the relative interactions of the two ligands with the organic surface. Specifically, if the interaction of both ligands with the surface is relatively weak, the molecular orientation is random. If the interaction of both ligands is similarly strong, a horizontal orientation relative to the substrate is promoted. However, if one ligand has a stronger interaction with the organic surface than the other, the molecule aligns vertically. Another possible way for the dopant molecule to self-organize is by aggregation with adjacent molecules forming polycrystalline islands within the film.

Figure 23:
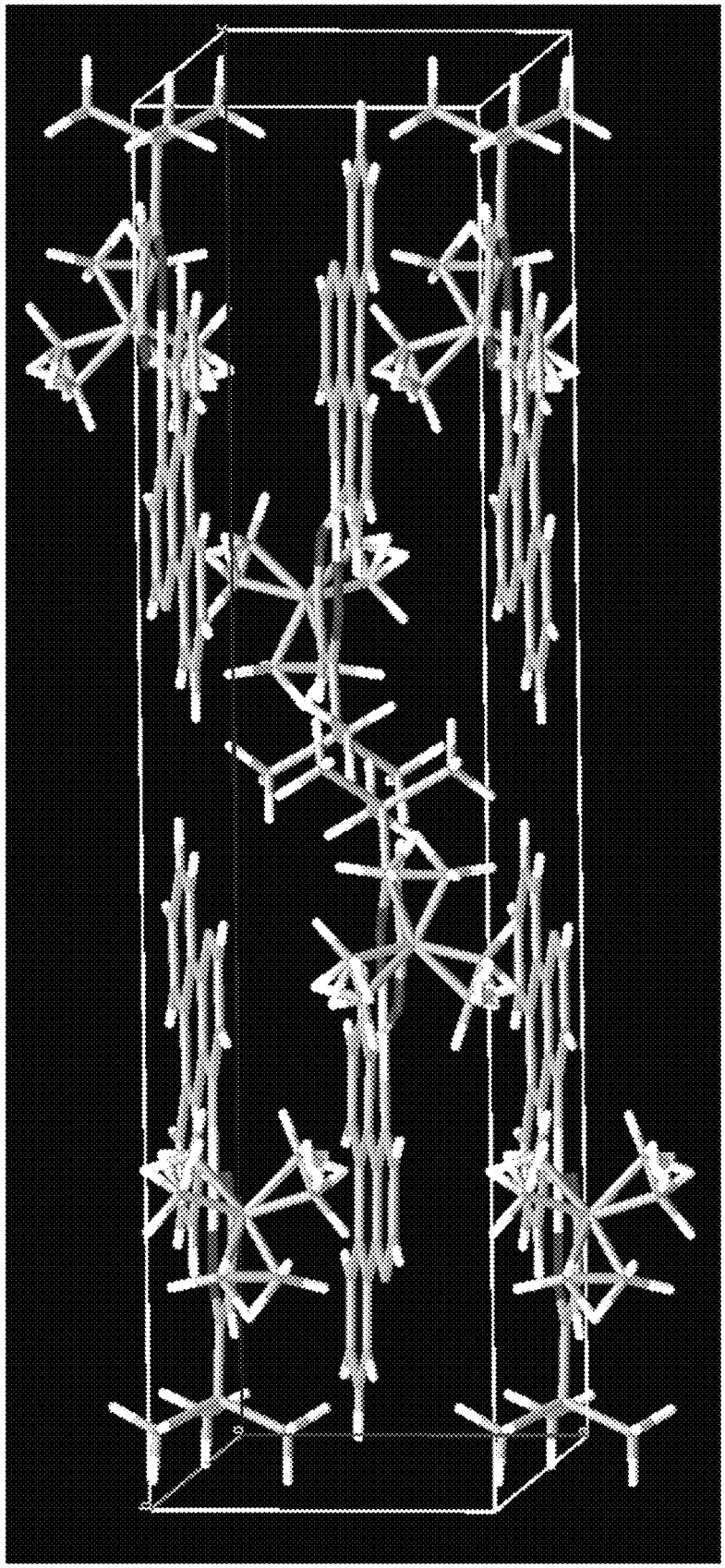
FIG. 23 provides the measured single crystal structure and cell parameters of (dbx)Pt(dpm) based on single crystal XRD. The unit cell contains four formula units and molecules are packed favoring d-π interaction between Pt d orbitals and π-orbitals of the dbx ligand along the z-axis of the square-planar Pt molecule.

In FIG. 6B, the TDM of (dbx)Pt(dpm) shows a disproportionate vertical orientation. Since δ=36.1° is close to the $c_2$ axis, the vertically aligned TDM shows that one ligand of the (dbx)Pt(dpm) has a markedly stronger interaction via edge-to-surface π-π interactions with the organic surface. A single crystal structure of (dbx)Pt(dpm) is provided in FIG. 23. To confirm that the vertical alignment is not due to aggregation, (dbx)Pt(acac) was doped at 10 and 1 vol. % into the host matrix in FIG. 6B and FIG. 6C. The ancillary dpm ligand was replaced by an acac ligand to promote aggregation, which is evident from the red-shifted spectrum of the 10 vol. % film in FIG. 8. As a result, (dbx)Pt(acac) doped at 1 vol. % showed similar alignment ($\theta_{hor}$=0.53±0.01) to the 10 vol. % doped (dbx)Pt(acac) and (dbx)Pt(dpm) with no spectral red-shift. The similar orientation of (dbx)Pt(acac) with (dbx)Pt(dpm), regardless of the doping concentration, shows that the vertical orientation of the Pt complexes is not due to the dopant aggregation.

It is known that the intermolecular interaction strength is directly proportional to the size of the aromatic system. Therefore, the smaller aromatic surface of ppy compared to dbx leads to a weaker interaction of (ppy)Pt(dpm) with the organic surface than the dbx based materials, and hence a reduced vertical molecular orientation relative to (dbx)Pt(dpm). To investigate whether the fraction of aromatic surface area in the ligand is tied to the molecular alignment, (dbx)Pt(dmes) with C^N and L^X ligands having substantial aromatic character were examined. The horizontal component increased to $\theta_{hor}$=0.73±0.01, leading to a net preferred horizontal alignment. The emission spectrum was unchanged since the chromophoric ligand also remained unchanged (FIG. 8). Adding a second Pt(dpm) to the dbx ligand producing (dbx)(Pt(dpm))$_2$ results in a further increase in $\theta_{hor}$ to 0.76±0.01, FIG. 7C, relative to (dbx)Pt(dpm). This is contrary to the hypothesis that the lower aromatic fraction of (dbx)(Pt(dpm))$_2$ promotes perpendicular alignment. Unlike the (C^N)Pt(L^X) complexes, the TDM of (dbx)(Pt(dpm))$_2$ lies at δ=−11° relative to the Pt—N and Pt—C bonds (see inset, FIG. 7C). If (dbx)(Pt(dpm))$_2$ is aligned perpendicular to the substrate, $\theta_{hor}$ is close to unity. The spectrum of (dbx)(Pt(dpm))$_2$ red shifts due to the extended π-conjugation of the larger ligand.

Figure 24:
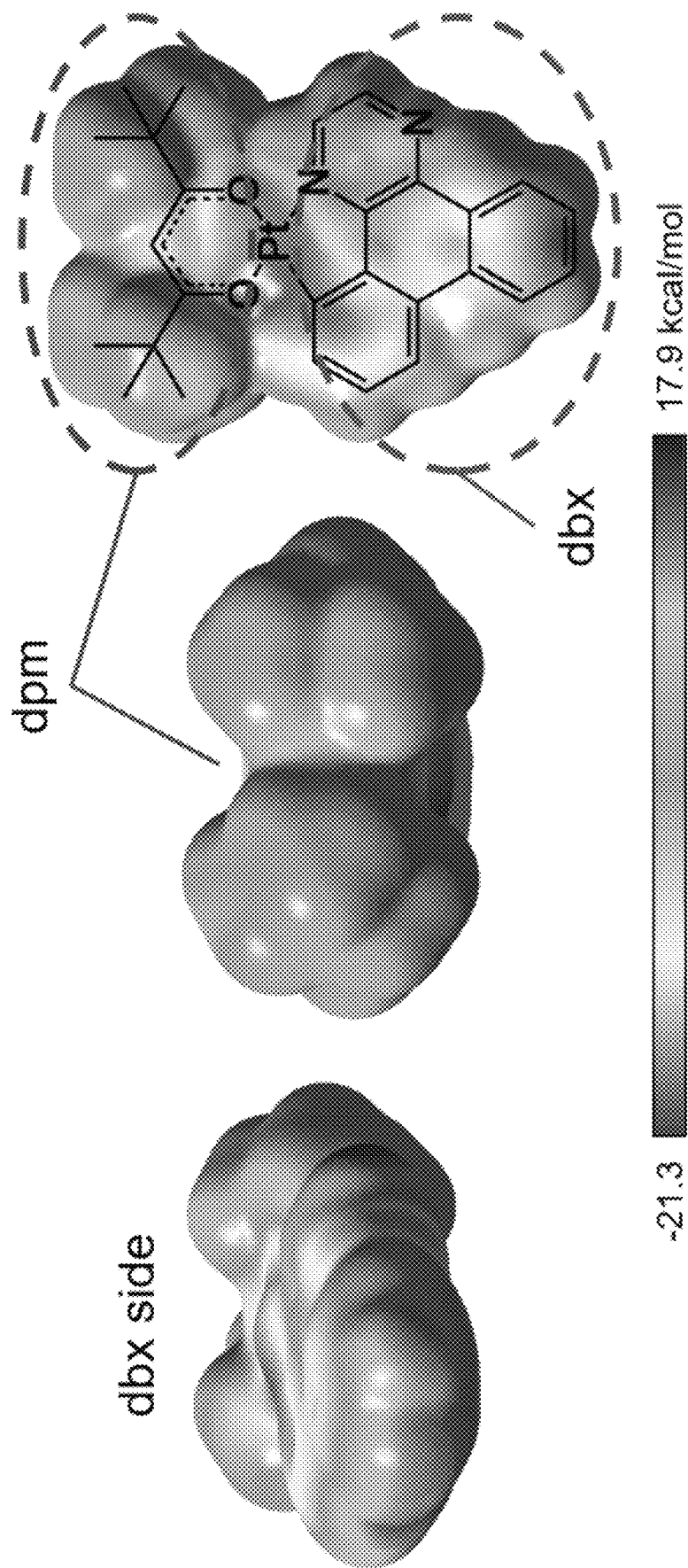
FIG. 24 depicts the calculated electrostatic potential surface of a (dpm)Pt(dbx) molecule via DFT geometry optimization. The dpm shows almost neutral potential (3 kcal/mol) whereas the dbx ligand shows highly positive charge of 12.3 kcal/mol with the peak value of 17.9 kcal/mol near the nitrogen atoms.
Figure 26:
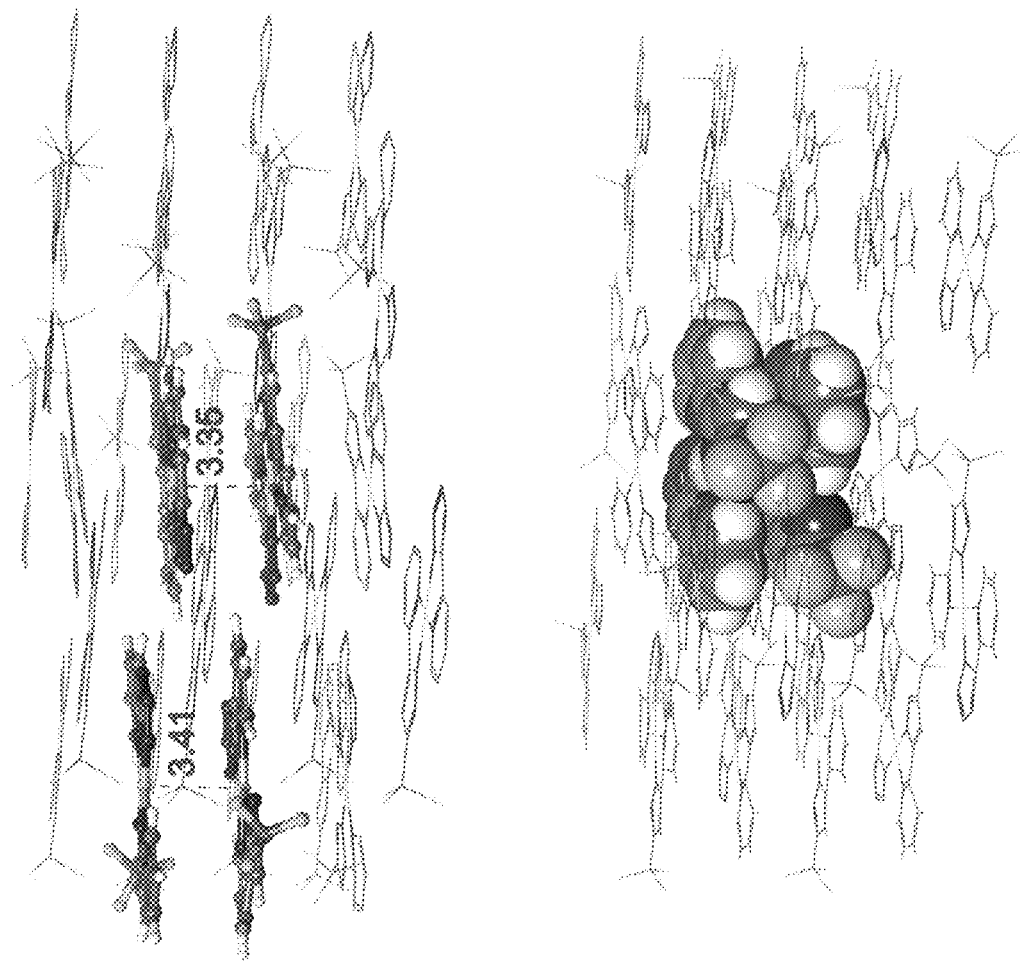
FIG. 26 depicts the two different dimer configurations of PtD complexes derived from the single crystal packing data (left) and an illustration of the molecular clusters used for the ONIOM calculations (right) with the central dimer (QM region) shown as a space-filling structure while the surrounding molecular shell (MM region) is indicated by a wire-frame structure.

It may be possible that the (dbx)Pt(dpm) molecule achieves vertical orientation via a balance between π-σ attraction (the attraction of the negatively charged π-electrons and a positively charged σ-framework), and π-electron repulsion. The edge-on geometry requires a strong π-σ attraction, whereas π-π repulsion and quadrupole attraction dominates in a cofacial, π-stacked geometry. The dbx ligand shows a high net positive σ-framework due to the electron deficient π-system caused by two electron-withdrawing N atoms, leading to its edge-on geometry. The electrostatic potential surface of (dbx)Pt(dpm), shown in FIG. 24, was calculated to compare the relative π-σ attraction of the two ligands. The average potential of the dbx ligand σ-framework shows 12.3 kcal/mol, with a peak potential of 17.9 kcal/mol near the N atoms. On the other hand, the dpm ligand shows an average 3.5 kcal/mol.

Density functional theory was used to investigate the relationship between the TDM of the PtD dimer and the molecular orientation in a neat crystalline PtD film (see FIG. 12, FIG. 14, and FIG. 15). Calculations indicate that the TDM of the dimer lies perpendicular to the PtD monomer planes. The crystal structure of PtD features two unique emissive dimer configurations: one with a Pt—Pt separation of 3.35 Å and the other with 3.41 Å, henceforth referred to as 3.35-dimer and 3.41-dimer, respectively. The energy of the 3.35-dimer triplet ($T_1$) is 2.25 eV, compared with 2.27 eV for the 3.41-dimer (details found in FIG. 25A and FIG. 25B). Also, the oscillator strength computed for $T_1$ of the former is almost twice that of the latter, indicating that emission in neat crystalline PtD films is likely to originate predominantly from the 3.35-dimer. The red arrow in FIG. 9A, inset, indicates that the 3.35-dimer TDM subtends a polar angle of 10° with the z-axis which lies along the Pt—Pt axis, and at an azimuthal angle of 99 with the x-axis that passes through the Pt—N(pyrazole-ring) bond of one of the monomers. The results from the DFT calculation and XRD data show that the TDM orientation is indeed controlled via templating.

Figure 27:
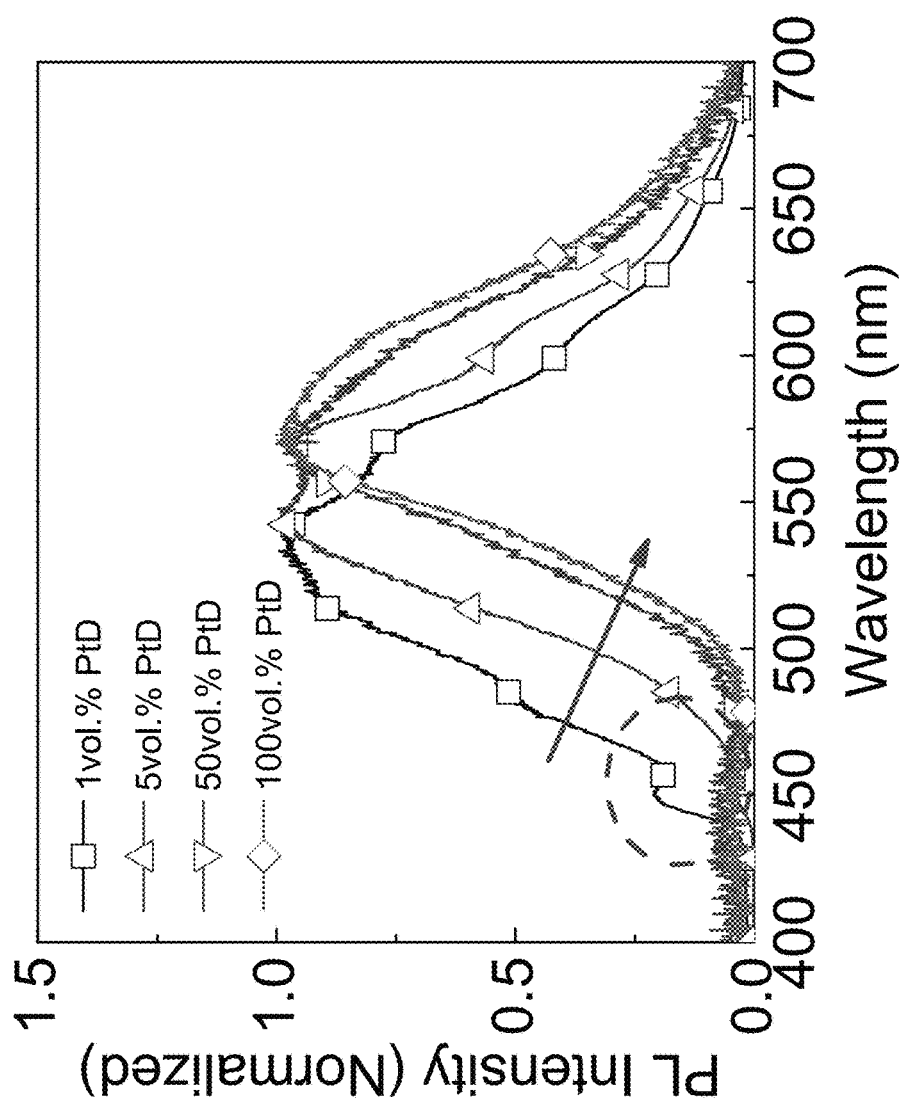
FIG. 27 is a plot of spectrum vs. doping concentration of PtD in CzSi. Bathochromic shifts follow the concentration of PtD due to the lattice strain relaxation. This results in a varied d-spacing between molecules as shown in Table 1. The DFT calculations of CzSi and PtD show similar permanent dipole moments (μ=2.6 vs. 2.2 Debye). Thus, the Bathochromic shift as a function of PtD doping concentration is mainly due to the strain relaxation of the PtD crystal domains. The monomer peak (circled) appears at 450 nm wavelength by diluting PtD.

In FIG. 17, the PtD (200) diffraction peak shifts toward an increased lattice constant with the reduced PtD domain size. The increased density of grain boundaries for smaller grains results in an increased lattice constant compared to bulk single crystals as a result of lattice strain relaxation. The relaxed lattice also results in the hypsochromic shift of the dimer emission (FIG. 27), with results summarized in Table 1.

Figure 28:
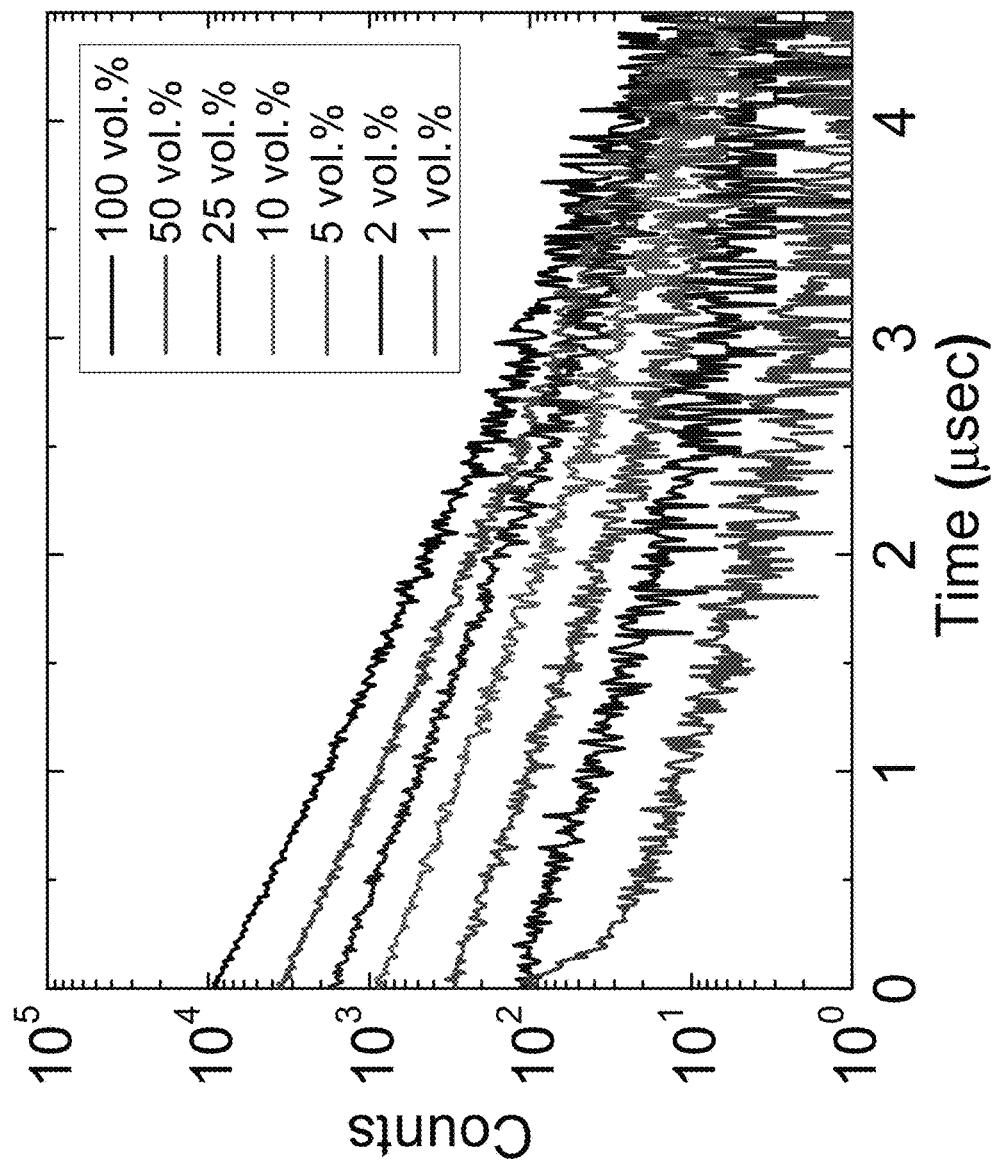
FIG. 28 is a plot of time resolved photoluminescence of CzSi:PtD by varied doping concentration. The non-radiative rate of the excitons within the film was assumed to be negligible

Time-resolved photoluminescence of the films of PtD doped into CzSi at various doping concentrations was measured with results in FIG. 28. The data show a broad photoluminescence peak at λ=572 nm that originates from the dimeric species. At 1 vol. % PtD, a monomer peak appears at λ=450 nm (FIG. 27), showing biexponential decay with distinct exciton decay lifetimes ($\tau_{dimer}$=0.88±0.12 vs. $\tau_{monomer}$=0.10±0.01), as shown in FIG. 28. This feature shows that monomer and dimer excitons coexist in 1 vol. % film, which corresponds to the spectrum in FIG. 27. However, single exponential decay is observed at higher doping concentrations with exciton lifetimes similar to the dimer exciton at 1 vol. %. Since only a broad photoluminescence peak at λ=550 nm is observed at these higher concentrations, it can be concluded that the broad photoluminescence originates from dimer emission.

The TDM orientation was measured for PtD:CzSi blends with a range of concentrations deposited on the NTCDA/PTCDA template in FIG. 19. The XRD results in FIG. 17 show that PtD molecules form highly crystalline films due to their discotic molecular structure that enables efficient π-stacking. In the PtD:CzSi blend, however, the CzSi molecules interrupt the π-stacking of the PtD molecules at CzSi concentrations >30 vol. %, and hence the orientation of the template is not transferred to the PtD molecules. In contrast, for CzSi concentrations <30 vol. %, the disruption of the stacks is limited, enabling the efficient transfer of the template orientation to PtD. Therefore, a concentration of polycrystalline discotic host molecule of >70 vol. % is required to control the morphology of the blended film.

FIG. 20 shows the controlled morphology of PtOEP doped in Tint deposited with the PTCDA template by x-ray diffraction. The x-ray diffraction peaks of Tint (220) and PtOEP (212) planes in the film are shifted compared to the bulk (Tint (220), 2θ=27.2°; PtOEP (212), 2θ=26.0°) due to the lattice relaxation at grain boundaries. The blended film deposited on the bare substrate shows the edge-on diffraction for both Tint and PtOEP molecules (FIG. 21A and FIG. 21B, green). This geometry is caused by aggregation with adjacent molecules forming polycrystalline islands in the film. A neat Tint film on a PTCDA template shows its largest diffraction feature for the (120) plane, which is due to Tint crystallites (FIG. 21A, red) lying parallel to the substrate. The reorientation is due to matching to the α-phase PTCDA template (2θ=27.5°) with a strain of $(a_{film}-a_{temp})/a_{temp}=0.7\%$, where $a_{film}$ and $a_{temp}$ are lattice constants of the Tint and PTCDA layers, respectively. Note that a peak appears at 2θ=27.5°, which corresponds to the α-phase PTCDA. Similarly, the PtOEP diffraction peak shifts to 2θ=20.5°, consistent with the (1$\bar{1}\bar{1}$) plane being parallel to the substrate (FIG. 21B, red). This morphological control of the PTCDA template was also demonstrated via doped film deposited on the NTCDA/PTCDA template and bare substrate, showing an increased $\theta_{hor}$ from 0.22±0.02 to 0.80±0.01 (FIG. 22), consistent with the x-ray diffraction data.

While not wishing to be bound by any particular theory, the results presented herein suggest that the interaction between the aromatic regions of the ligands and the organic surface drives the orientation of dihedral phosphor Pt complexes during the vacuum deposition. Accordingly, the molecular structure of the vertically aligning reference Pt complex, (dbx)Pt(dpm), was modified to increase the fraction of horizontally aligned TDM in the blended film. In one example, two mesityl groups were introduced to the ancillary ligand to increase the attraction of the molecule to the organic surface. In a second approach, the TDM of a binuclear Pt complex, (dbx)(Pt(dpm))$_2$, was shown to align parallel to the substrate due the attraction of its aromatic region. Both methods showed an approximately 20% increased fraction of horizontally aligned TDMs compared to the reference Pt complex.

Seeding the growth habit of the molecules in the blended emissive layer via an ordered NTCDA/PTCDA template results in a preferred horizontal alignment of the Pt phosphor emitter molecules. Polycrystalline emissive layers comprising single molecule or mixed host-dopant molecules were both shown to conform to the template orientation. The net horizontal fraction of the dopant transition dipole moment in the mixed host-dopant layer deposited on the template increased by approximately 60% compared to the film deposited directly onto bare sapphire and fused silica substrates. These findings demonstrate an efficient molecular design strategy and a method to control the optical outcoupling efficiencies of the organic light emitting devices comprising Pt complex phosphors.

Example 2: PtOEP Orientation

Since PtOEP shows 4-fold symmetry, the TDM of the molecule exhibits symmetry in the molecular plane. The symmetry causes the measured $\theta_{hor}$ of PtOEP to include a residual horizontal TDM regardless of the orientation of the molecule, denoted as r in FIG. 29. Thus the measured $\theta_{hor}$ becomes, ½+½·sin$^2$ θ, reducing the range of $\theta_{hor}$ from 50% to 100%. The value of $\theta_{h-conv}$, excluding the contribution from the residual dipoles, allows for a better understanding of the PtOEP orientations.

Figure 30:
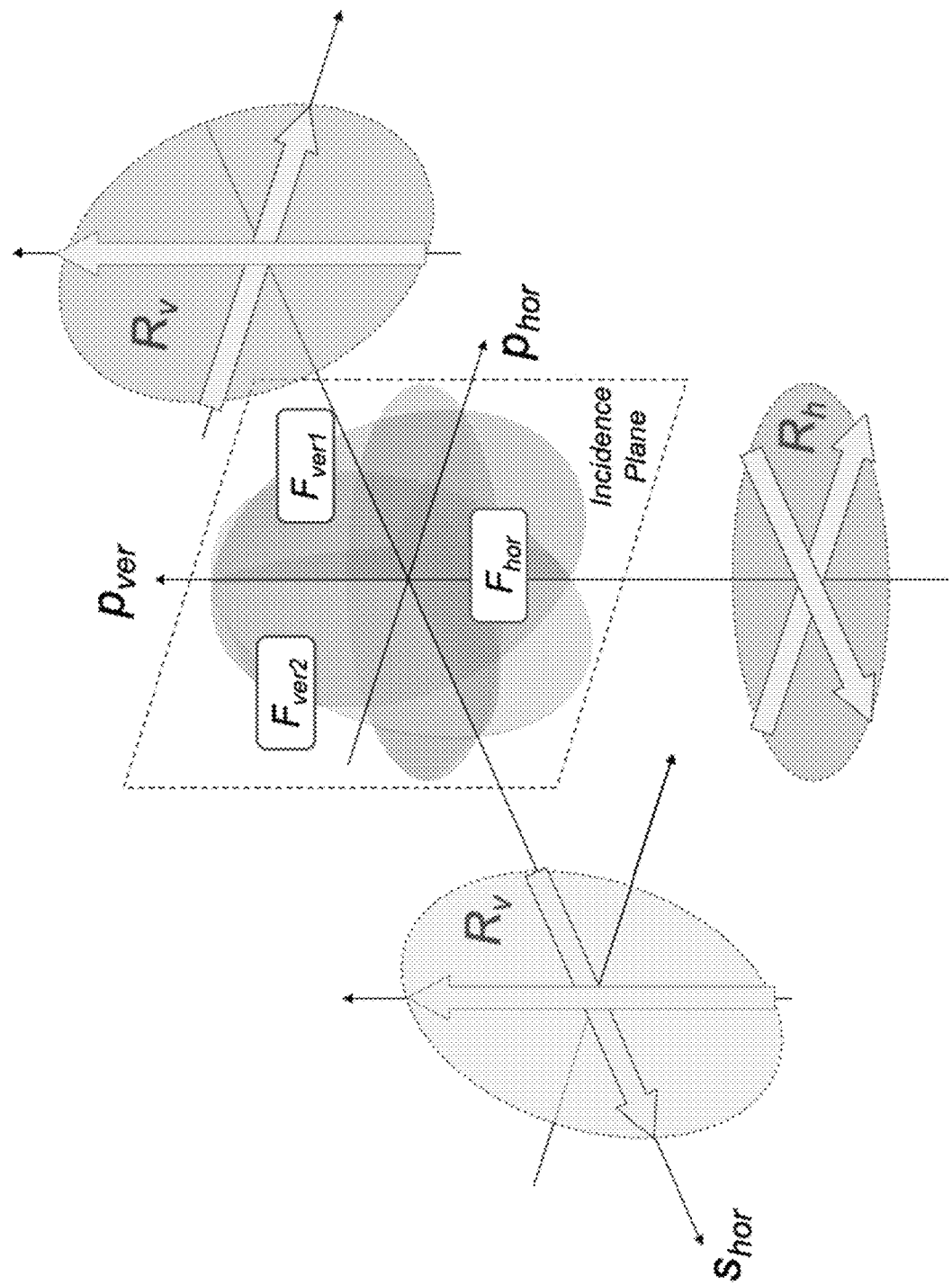
FIG. 30 is a diagram of the unit orthogonal planes of PtOEP.

Since PtOEP is a planar emitter, the emission from PtOEP can be decomposed into three orthogonal planes denoted as $F_{hor}$, $F_{ver1}$ and $F_{ver2}$ in FIG. 30. The ratio is $R_h$ and $R_v$ for each horizontally and vertically aligned plane, respectively. Then the sum becomes, $2R_v+R_h=1$. Then each plane can be decomposed into two orthogonal dipoles as shown 30, and describe $\theta_{hor, PtOEP}$ as follows:

$$\theta_{hor,PtOEP} = \frac{2(R_v+R_h)}{2(R_v+R_h)+2R_v} = R_v+R_h = 1-R_v = \frac{1}{2}+\frac{1}{2}R_h$$

$R_v$ and $R_h$ can thus be obtained from the measured $\theta_{hor, PtOEP}$ from the experiment, $$\begin{cases} R_v = 1-\theta_{hor,PtOEP} \\ R_h = 2\theta_{hor,PtOEP}-1 \end{cases}$$

Figure 29:
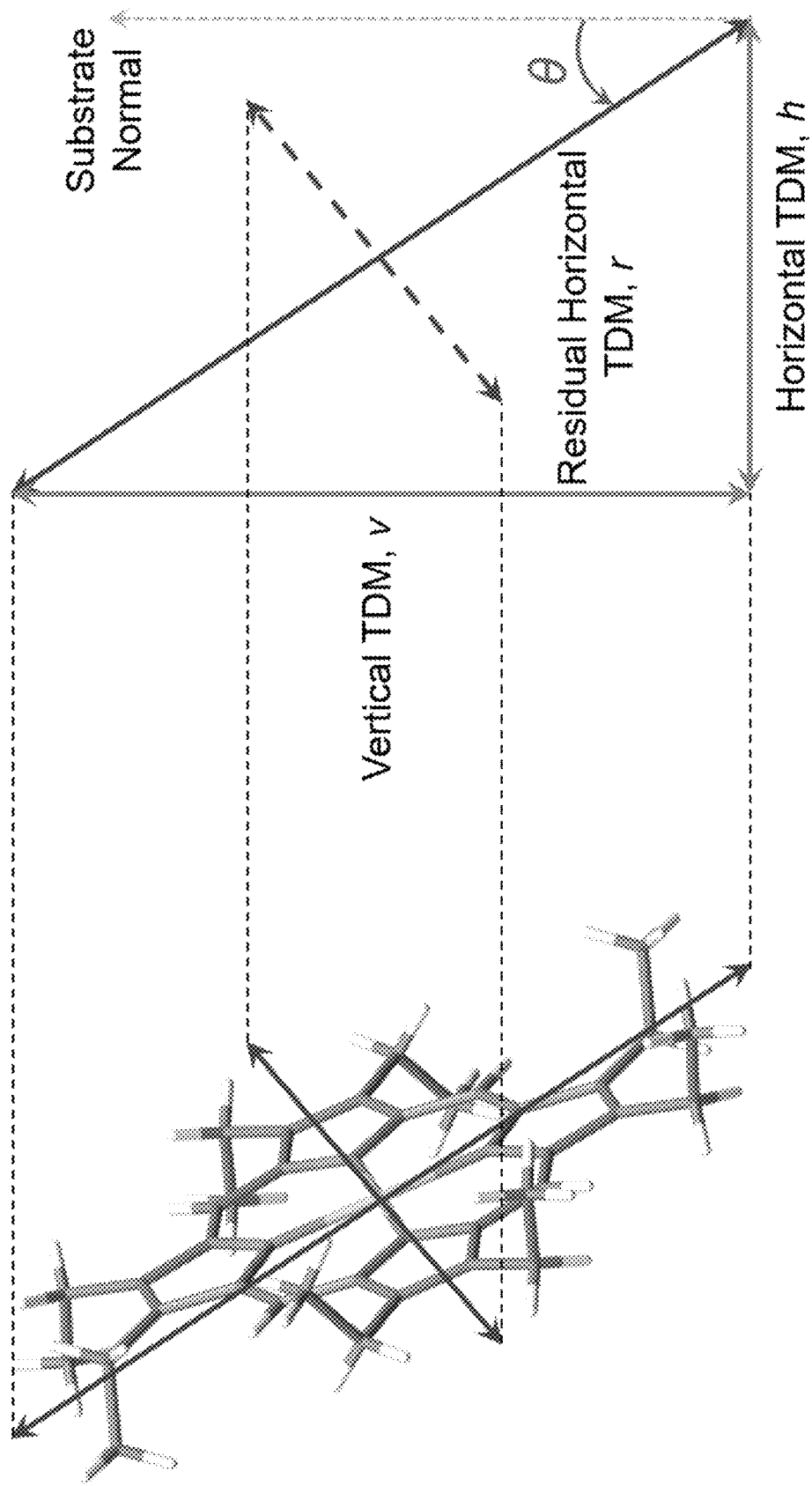
FIG. 29 is a diagram of the transition dipole moment vector within a PtOEP molecule.

The residual horizontal TDMs in FIG. 29 are the two TDMs described in the $R_v$ and one TDM in $R_h$. After excluding the residual TDMs, each PtOEP molecule includes one TDM. Then the $\theta_{h-conv}$ is the fraction of two orthogonal horizontal TDMs ($s_{hor}, p_{hor}$) to the total can be represented as, $$\theta_{h-conv} = \frac{p_{hor}+s_{hor}}{p_{hor}+p_{ver}+s_{hor}} = \frac{2R_h}{2R_h+R_v} = \frac{2(2\theta_{hor,PtOEP}-1)}{3\theta_{hor,PtOEP}-1}$$

Figure 31:
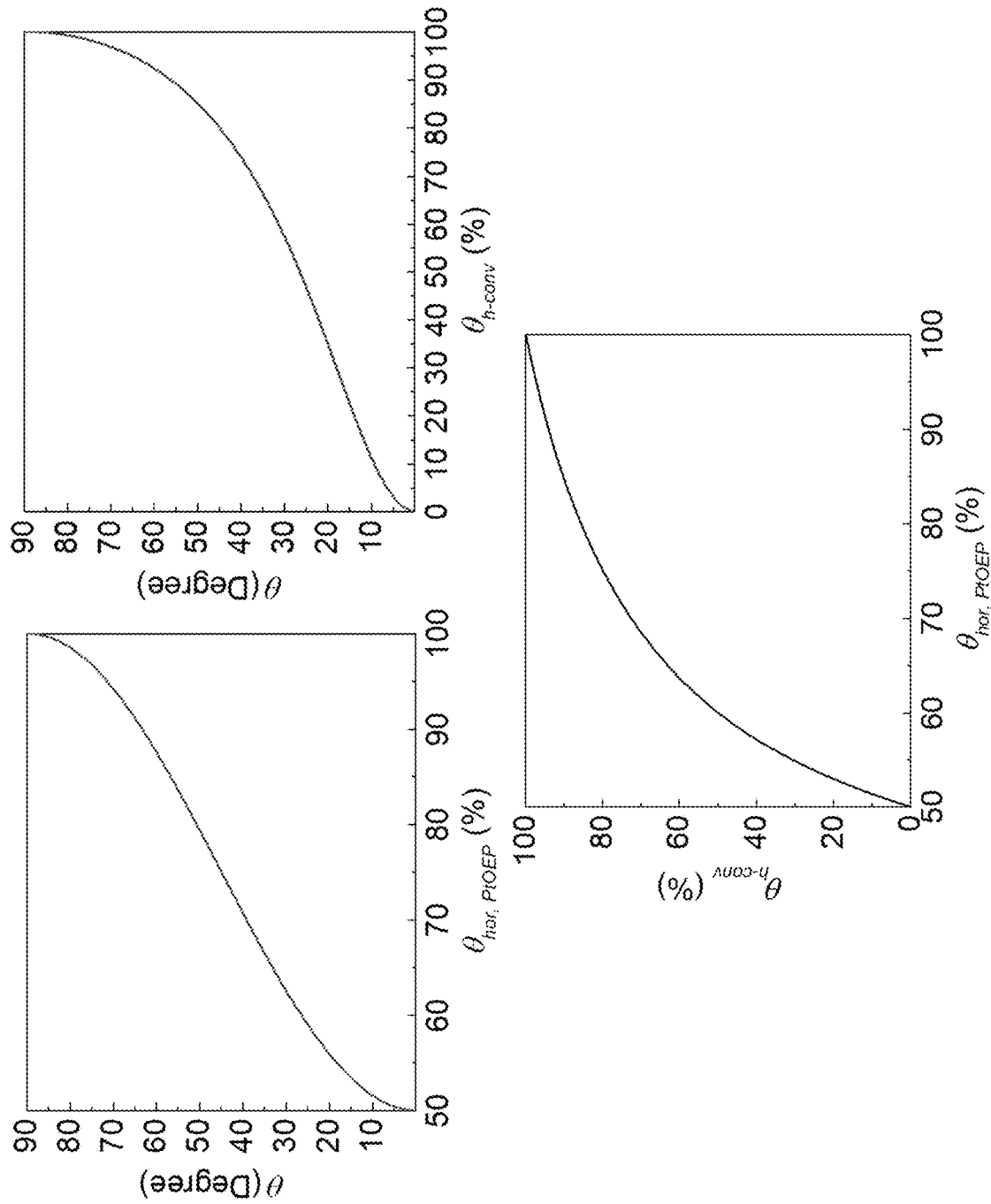
FIG. 31 is a series of graphs showing the correlation between $\theta_{hor}$ of PtOEP vs. molecular tilt angle θ, $\theta_{h\text{-}conv}$ vs. molecular tilt angle θ, and measured $\theta_{hor}$ vs. $\theta_{h\text{-}conv}$.

Plots of each of $\theta_{hor}$ of PtOEP and $\theta_{h-conv}$ as a function of molecular tilt angle θ, and a plot of measured $\theta_{hor}$ vs. $\theta_{h-conv}$, are presented in FIG. 31.

Example 3: Further Structural Templating of PtPC

Figure 32:
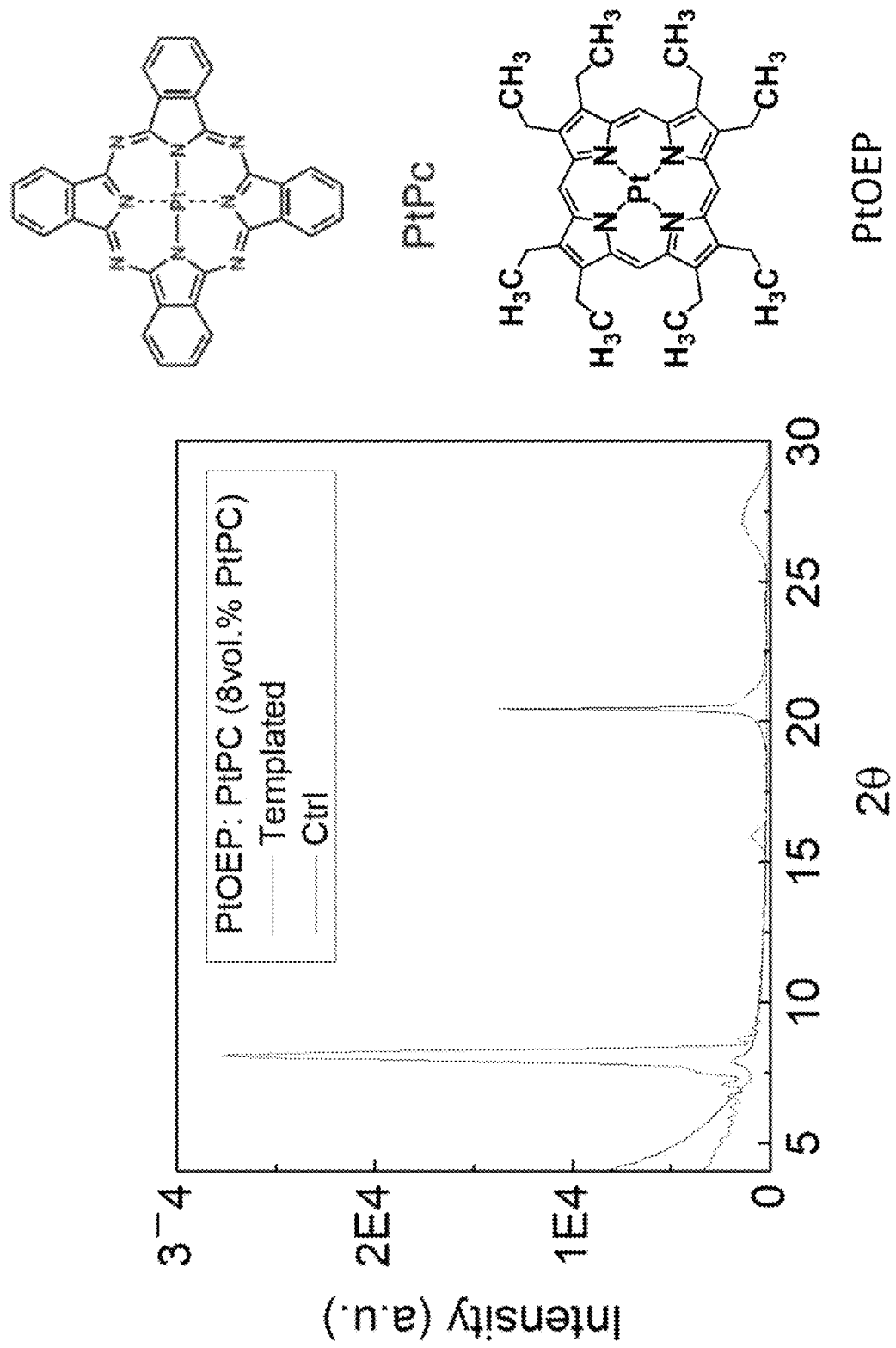
FIG. 32 is a plot of the Bragg-Brentano geometry XRD of PtOEP:PtPC (8 vol. %) film with and without the structural template layer and the molecular formulae of PtPC and PtPOEP.

A PTCDA template layer was used to control the orientation of the infra-red (IR) dopant, PtPC, doped in a PtOEP host layer (8 vol. %). As shown in FIG. 32, PtOEP molecules lay flat on the PTCDA template layer, with a noticeable (212) peak 2-20.5°.

Figure 33:
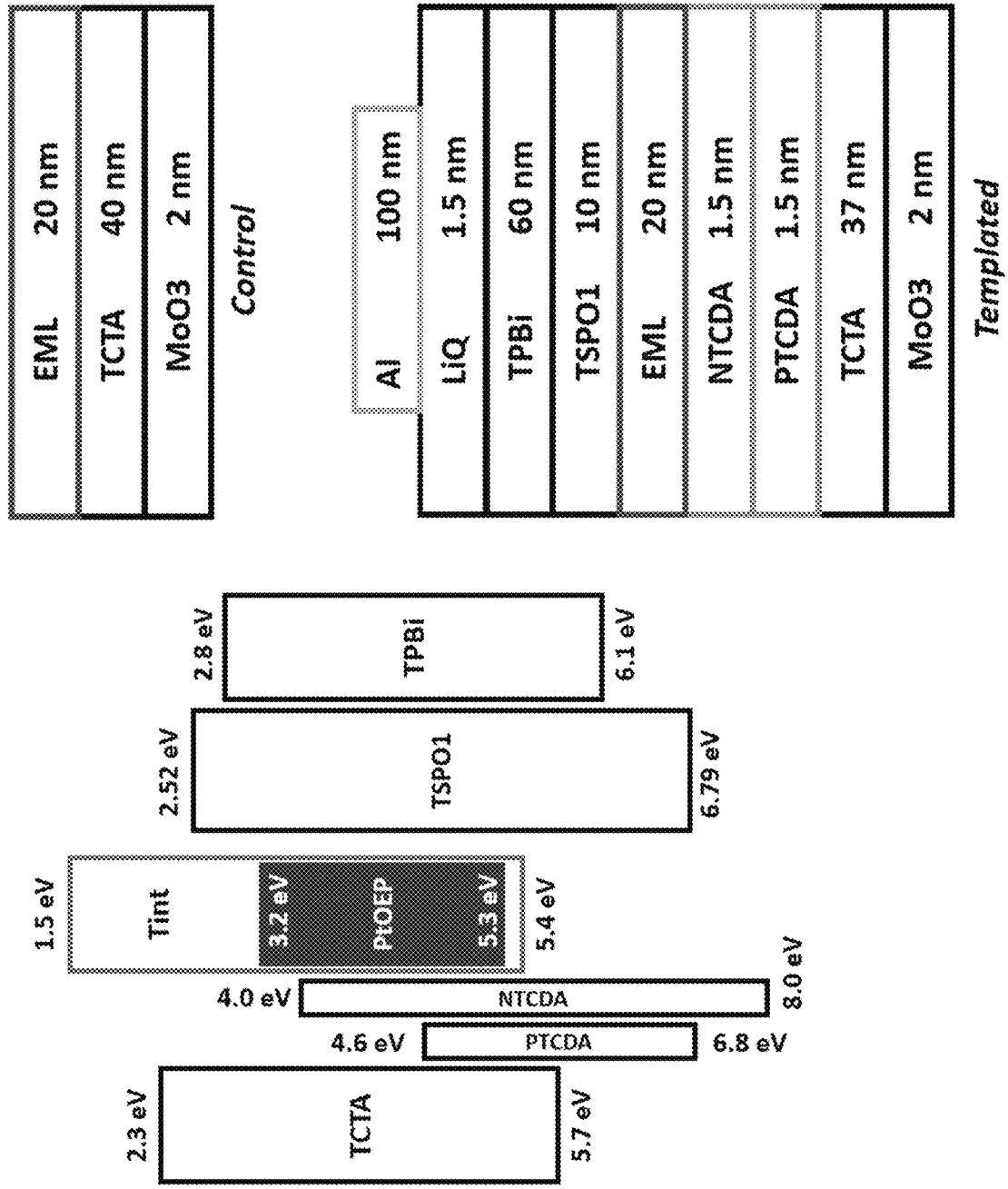
FIG. 33 is an exemplary device structure using structural template layers.
Figure 34:
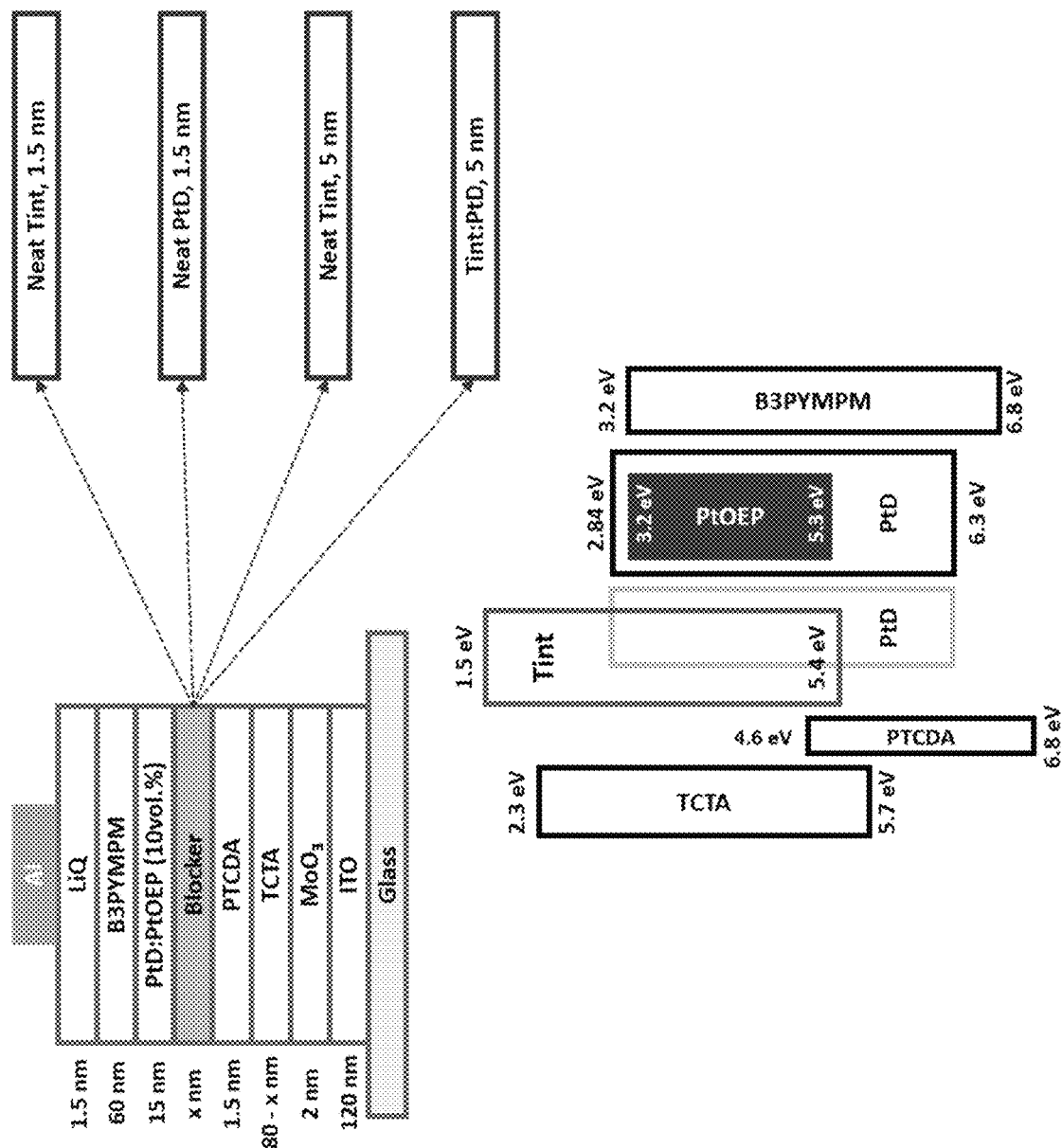
FIG. 34 depicts the use of a Pt complex host for an emissive layer (EML).

Since the PTCDA/NTCDA layer prevents an efficient hole transfer into the EML, exemplary thin layers (1.5 nm each) may be useful to prevent blocking the holes injection into the emissive layer (FIG. 33). Since Pt complex molecules are flat, much of them form crystalline films. Therefore, many Pt complexes are optimal to be utilized as the host and dopants in the templated emissive layer (FIG. 34).

The disclosures of each and every patent, patent application, and publication cited herein are hereby incorporated herein by reference in their entirety. While devices and methods have been disclosed with reference to specific embodiments, it is apparent that other embodiments and variations of this disclosure may be devised by others skilled in the art without departing from the true spirit and scope of the disclosure. The appended claims are intended to be construed to include all such embodiments and equivalent variations.

We claim:

1. An organic light emitting device (OLED) comprising:
an anode;
a cathode; and
a light emitting layer having a first surface, a second surface, and a thickness therebetween, the light emitting layer being disposed between the anode and the cathode;
wherein the light emitting layer comprises at least one phosphorescent compound; and
wherein a transition dipole moment of the at least one phosphorescent compound is substantially perpendicular to the thickness of the light emitting layer;
wherein the at least one phosphorescent compound is a compound of Formula (Ia), Formula (Ib), or Formula (II):

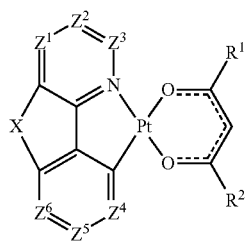

Formula (Ia)

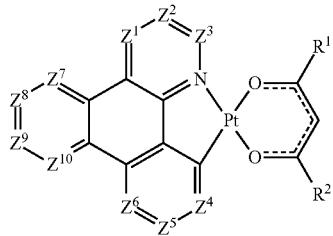

Formula (Ib)

wherein X is O, S, Se, $NR^3$, $CR^4R^5$, or $SiR^4R^5$;
wherein $Z^1, Z^2, Z^3, Z^4, Z^5, Z^6, Z^7, Z^8, Z^9$, and $Z^{10}$ are each independently N or $CR^6$; and
wherein $R^1$ and $R^2$ are mesityl;
wherein each $R^3$, $R^4$, $R^5$, and $R^6$ is independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; and wherein any two adjacent substituents are optionally joined to form a ring;

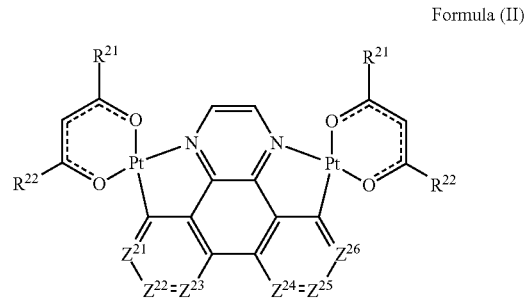

Formula (II)

wherein $Z^{21}, Z^{22}, Z^{23}, Z^{24}, Z^{25}$, and $Z^{26}$ are each independently N or $CR^{23}$; and
wherein $R^{21}$ and $R^{22}$ are each mesityl;
wherein each $R^{23}$ is each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; and wherein any two adjacent substituents are optionally joined to form a ring.

2. The OLED of claim 1, wherein the at least one phosphorescent compound is a compound of Formula (Ia) or Formula (Ib); and at least one of $Z^1, Z^2, Z^3, Z^4, Z^5, Z^6, Z^7, Z^8, Z^9$, and $Z^{10}$ is N.

3. The OLED of claim 1, wherein the at least one phosphorescent compound is a compound of Formula (II).

4. The OLED of claim 1, wherein the at least one phosphorescent compound is a compound of Formula (II); $Z^{21}, Z^{22}, Z^{23}, Z^{24}, Z^{25}$, and $Z^{26}$ are each $CR^{23}$; and wherein each $R^{23}$ is hydrogen or deuterium.

* * * * *